(12) United States Patent
Tanitsu et al.

(10) Patent No.: US 9,684,246 B2
(45) Date of Patent: *Jun. 20, 2017

(54) POLARIZATION-MODULATING ELEMENT, ILLUMINATION OPTICAL APPARATUS, EXPOSURE APPARATUS, AND EXPOSURE METHOD

(71) Applicant: NIKON CORPORATION, Tokyo (JP)

(72) Inventors: Osamu Tanitsu, Kumagaya (JP); Koji Shigematsu, Kawasaki (JP); Hiroyuki Hirota, Fukaya (JP); Tomoyuki Matsuyama, Kita-Katsushika-gun (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/889,860

(22) Filed: May 8, 2013

(65) Prior Publication Data

US 2013/0242527 A1 Sep. 19, 2013

Related U.S. Application Data

(63) Continuation of application No. 13/067,958, filed on Jul. 11, 2011, which is a continuation of application
(Continued)

(30) Foreign Application Priority Data

Feb. 6, 2004 (JP) .................. 2004-030555
Dec. 10, 2004 (JP) .................. 2004-358218

(51) Int. Cl.
G03F 7/20 (2006.01)
G02B 27/28 (2006.01)
(Continued)

(52) U.S. Cl.
CPC ............ *G03F 7/70566* (2013.01); *F21V 9/14* (2013.01); *F21V 13/02* (2013.01); *G02B 27/286* (2013.01);
(Continued)

(58) Field of Classification Search
CPC .. G02B 27/286; G02B 5/3025; G02B 5/3083; G03F 7/701; G03F 7/70058;
(Continued)

(56) References Cited

U.S. PATENT DOCUMENTS 3,146,294 A 8/1964 Koester et al.
3,180,216 A 4/1965 Osterberg
(Continued)

FOREIGN PATENT DOCUMENTS

CN 1453645 A 11/2003
CN 1501175 A 6/2004
(Continued)

OTHER PUBLICATIONS

Apr. 13, 2010 Office Action issued in Chinese Patent Application No. 2007101109529 (with translation).
(Continued)

*Primary Examiner* — Michael P Lapage
(74) *Attorney, Agent, or Firm* — Oliff PLC

(57) ABSTRACT

There is disclosed a polarization-modulating element for modulating a polarization state of incident light into a predetermined polarization state, the polarization-modulating element being made of an optical material with optical activity and having a circumferentially varying thickness profile.

35 Claims, 32 Drawing Sheets

Related U.S. Application Data

No. 12/461,801, filed on Aug. 25, 2009, now abandoned, which is a continuation of application No. 11/347,421, filed on Feb. 6, 2006, now abandoned, which is a continuation-in-part of application No. PCT/JP2005/000407, filed on Jan. 14, 2005.

(51) Int. Cl.
  *F21V 9/14* (2006.01)
  *F21V 13/02* (2006.01)

(52) U.S. Cl.
  CPC .......... *G03F 7/701* (2013.01); *G03F 7/70191* (2013.01); *G03F 7/70308* (2013.01)

(58) Field of Classification Search
  CPC .............. G03F 7/70566; G03F 7/7015; G03F 7/70308; G03F 7/70191; F21V 9/14; F21V 13/02; G01F 1/0136; G02F 2001/0142; G02F 2001/0144
  USPC .................................................. 356/364–370
  See application file for complete search history.

(56) References Cited

U.S. PATENT DOCUMENTS

| | | |
|---|---|---|
| 3,758,201 A | 9/1973 | MacNeille |
| 3,892,469 A | 7/1975 | Lotspeich |
| 3,892,470 A | 7/1975 | Lotspeich |
| 4,103,260 A | 7/1978 | Buchman |
| 4,175,830 A | 11/1979 | Marié |
| 4,198,123 A | 4/1980 | Kremen |
| 4,211,471 A | 7/1980 | Marie |
| 4,286,843 A * | 9/1981 | Reytblatt ................. 359/486.03 |
| 4,346,164 A | 8/1982 | Tabarelli et al. |
| 4,370,026 A | 1/1983 | Dubroeucq et al. |
| 4,744,615 A | 5/1988 | Fan et al. |
| 4,755,027 A * | 7/1988 | Schafer .................... 359/485.02 |
| 4,952,815 A | 8/1990 | Nishi |
| 4,981,342 A | 1/1991 | Fiala |
| 5,072,126 A | 12/1991 | Progler |
| 5,216,541 A | 6/1993 | Takesue et al. |
| 5,251,222 A | 10/1993 | Hester et al. |
| 5,253,110 A | 10/1993 | Ichihara et al. |
| 5,272,501 A | 12/1993 | Nishi et al. |
| 5,312,513 A | 5/1994 | Florence et al. |
| 5,345,292 A | 9/1994 | Shiozawa et al. |
| 5,365,371 A | 11/1994 | Kamon |
| 5,382,999 A | 1/1995 | Kamon |
| 5,436,761 A | 7/1995 | Kamon |
| 5,448,336 A | 9/1995 | Shiraishi |
| 5,459,000 A | 10/1995 | Unno |
| 5,467,166 A | 11/1995 | Shiraishi |
| 5,473,465 A | 12/1995 | Ye |
| 5,541,026 A | 7/1996 | Matsumoto |
| 5,559,583 A | 9/1996 | Tanabe |
| 5,610,683 A | 3/1997 | Takahashi |
| 5,610,684 A | 3/1997 | Shiraishi |
| 5,621,498 A | 4/1997 | Inoue et al. |
| 5,627,626 A | 5/1997 | Inoue et al. |
| 5,631,721 A | 5/1997 | Stanton et al. |
| 5,663,785 A | 9/1997 | Kirk et al. |
| 5,673,103 A | 9/1997 | Inoue et al. |
| 5,675,401 A | 10/1997 | Wangler et al. |
| 5,677,755 A | 10/1997 | Oshida et al. |
| 5,677,757 A | 10/1997 | Taniguchi et al. |
| 5,684,567 A | 11/1997 | Shiozawa |
| 5,691,803 A | 11/1997 | Song et al. |
| 5,707,501 A | 1/1998 | Inoue et al. |
| 5,739,898 A | 4/1998 | Ozawa et al. |
| 5,838,408 A | 11/1998 | Inoue et al. |
| 5,841,500 A | 11/1998 | Patel |
| 5,933,219 A | 8/1999 | Unno |
| 5,969,441 A | 10/1999 | Loopstra et al. |
| 6,031,658 A | 2/2000 | Riza |
| 6,191,829 B1 | 2/2001 | Hashimoto |
| 6,191,880 B1 * | 2/2001 | Schuster ...................... 359/238 |
| 6,208,407 B1 | 3/2001 | Loopstra |
| 6,211,944 B1 | 4/2001 | Shiraishi |
| 6,229,647 B1 | 5/2001 | Takahashi et al. |
| 6,233,041 B1 | 5/2001 | Shiraishi |
| 6,238,063 B1 | 5/2001 | Tanitsu et al. |
| 6,252,647 B1 | 6/2001 | Shiraishi |
| 6,252,712 B1 | 6/2001 | Fürter et al. |
| 6,259,512 B1 | 7/2001 | Mizouchi |
| 6,304,317 B1 | 10/2001 | Taniguchi et al. |
| 6,333,776 B1 | 12/2001 | Taniguchi |
| 6,341,007 B1 | 1/2002 | Nishi et al. |
| 6,361,909 B1 | 3/2002 | Gau et al. |
| 6,366,404 B1 | 4/2002 | Hiraiwa et al. |
| 6,373,614 B1 | 4/2002 | Miller |
| 6,392,800 B2 | 5/2002 | Schuster |
| 6,400,441 B1 | 6/2002 | Nishi et al. |
| 6,404,482 B1 | 6/2002 | Shiraishi |
| 6,406,148 B1 | 6/2002 | Marshall et al. |
| 6,452,662 B2 | 9/2002 | Mulkens et al. |
| 6,466,303 B1 | 10/2002 | Omura et al. |
| 6,483,573 B1 | 11/2002 | Schuster |
| 6,498,869 B1 | 12/2002 | Yao |
| 6,522,483 B2 | 2/2003 | Kreuzer |
| 6,535,273 B1 | 3/2003 | Maul |
| 6,538,247 B2 | 3/2003 | Iizuka |
| 6,549,269 B1 | 4/2003 | Nishi et al. |
| 6,577,379 B1 | 6/2003 | Boettiger et al. |
| 6,583,931 B2 | 6/2003 | Hiraiwa et al. |
| 6,590,634 B1 | 7/2003 | Nishi et al. |
| 6,597,430 B1 | 7/2003 | Nishi et al. |
| 6,606,144 B1 | 8/2003 | Omura |
| 6,636,295 B2 * | 10/2003 | Shiozawa ....................... 355/67 |
| 6,646,690 B1 | 11/2003 | Takezawa |
| 6,661,499 B2 | 12/2003 | Omura et al. |
| 6,665,119 B1 | 12/2003 | Kurtz et al. |
| 6,674,513 B2 | 1/2004 | Omura |
| 6,674,514 B2 | 1/2004 | Shinoda |
| 6,680,798 B2 | 1/2004 | Kreuzer |
| 6,698,891 B2 | 3/2004 | Kato |
| 6,710,855 B2 | 3/2004 | Shiraishi |
| 6,762,824 B2 | 7/2004 | Mori |
| 6,769,273 B1 | 8/2004 | Nakagawa et al. |
| 6,771,350 B2 | 8/2004 | Nishinaga |
| 6,774,984 B2 | 8/2004 | Gerhard |
| 6,831,731 B2 | 12/2004 | Omura et al. |
| 6,836,365 B2 | 12/2004 | Goto |
| 6,836,380 B2 | 12/2004 | Kreuzer |
| 6,842,223 B2 | 1/2005 | Tyminski |
| 6,844,982 B2 | 1/2005 | Omura |
| 6,856,379 B2 | 2/2005 | Schuster |
| 6,864,961 B2 | 3/2005 | Omura |
| 6,870,668 B2 | 3/2005 | Ozawa |
| 6,876,437 B2 | 4/2005 | Kawahara |
| 6,885,493 B2 | 4/2005 | Ljungblad et al. |
| 6,891,655 B2 | 5/2005 | Grebinski et al. |
| 6,900,915 B2 | 5/2005 | Nanjyo et al. |
| 6,913,373 B2 | 7/2005 | Tanaka et al. |
| 6,930,758 B2 * | 8/2005 | Schuster et al. ................ 355/67 |
| 6,934,009 B2 | 8/2005 | Terashi |
| 6,958,806 B2 | 10/2005 | Mulder et al. |
| 6,965,484 B2 | 11/2005 | Shaver |
| 6,970,233 B2 | 11/2005 | Blatchford |
| 6,977,718 B1 | 12/2005 | LaFontaine |
| 6,999,157 B2 | 2/2006 | Kohno |
| 7,009,686 B2 | 3/2006 | Kawashima et al. |
| 7,031,077 B2 | 4/2006 | Kreuzer |
| 7,038,763 B2 | 5/2006 | Mulder et al. |
| 7,061,583 B2 | 6/2006 | Mulkens et al. |
| 7,095,546 B2 | 8/2006 | Mala et al. |
| 7,098,992 B2 | 8/2006 | Ohtsuki et al. |
| 7,130,025 B2 | 10/2006 | Tsuji |
| 7,145,720 B2 | 12/2006 | Krähmer et al. |
| 7,217,503 B2 | 5/2007 | Saitoh et al. |
| 7,239,446 B2 | 7/2007 | Kreuzer |
| 7,245,353 B2 | 7/2007 | Mulkens et al. |
| 7,245,355 B2 | 7/2007 | Mulkens et al. |
| 7,295,286 B2 | 11/2007 | Matsuura |

(56) References Cited

U.S. PATENT DOCUMENTS

| | | | |
|---|---|---|---|
| 7,345,740 B2 | 3/2008 | Wagner et al. |
| 7,408,616 B2 | 8/2008 | Gruner et al. |
| 7,423,731 B2 | 9/2008 | Tanitsu et al. |
| 7,433,046 B2 | 10/2008 | Everett et al. |
| 7,446,858 B2 | 11/2008 | Kudo et al. |
| 7,508,493 B2 | 3/2009 | Takeuchi et al. |
| 7,847,921 B2 | 12/2010 | Gruner et al. |
| 8,259,393 B2 | 9/2012 | Fiolka et al. |
| 8,270,077 B2 | 9/2012 | Fiolka et al. |
| 8,279,524 B2 | 10/2012 | Fiolka et al. |
| 8,289,623 B2 | 10/2012 | Fiolka et al. |
| 8,320,043 B2 | 11/2012 | Fiolka et al. |
| 2001/0012154 A1 | 8/2001 | Schuster |
| 2001/0019404 A1 | 9/2001 | Schuster et al. |
| 2001/0035942 A1 | 11/2001 | Hara et al. |
| 2001/0046038 A1 | 11/2001 | Mulkens et al. |
| 2001/0052968 A1 | 12/2001 | Shiozawa |
| 2002/0001134 A1 | 1/2002 | Shinoda |
| 2002/0008863 A1 | 1/2002 | Taniguchi et al. |
| 2002/0024008 A1 | 2/2002 | Iizuka |
| 2002/0027719 A1 | 3/2002 | Kreuzer |
| 2002/0080338 A1 | 6/2002 | Taniguchi |
| 2002/0085176 A1 | 7/2002 | Hiraiwa et al. |
| 2002/0085276 A1 | 7/2002 | Tanitsu et al. |
| 2002/0101572 A1 | 8/2002 | Shiraishi |
| 2002/0126380 A1 | 9/2002 | Schuster |
| 2002/0152452 A1 | 10/2002 | Socha |
| 2002/0167653 A1 | 11/2002 | Mulkens et al. |
| 2002/0176166 A1 | 11/2002 | Schuster |
| 2002/0177048 A1 | 11/2002 | Saitoh et al. |
| 2002/0177054 A1 | 11/2002 | Saitoh et al. |
| 2002/0186462 A1 | 12/2002 | Gerhard |
| 2002/0191288 A1 | 12/2002 | Gruner et al. |
| 2002/0196416 A1 | 12/2002 | Shiraishi |
| 2003/0007158 A1 | 1/2003 | Hill |
| 2003/0011756 A1 | 1/2003 | Omura et al. |
| 2003/0025890 A1 | 2/2003 | Nishinaga et al. |
| 2003/0038225 A1 | 2/2003 | Mulder et al. |
| 2003/0038931 A1 | 2/2003 | Toyoda et al. |
| 2003/0043356 A1 | 3/2003 | Shiraishi |
| 2003/0053036 A1 | 3/2003 | Fujishima et al. |
| 2003/0086071 A1 | 5/2003 | McGuire, Jr. |
| 2003/0098959 A1 | 5/2003 | Hagiwara et al. |
| 2003/0103196 A1* | 6/2003 | Hirukawa ................ 355/55 |
| 2003/0128349 A1 | 7/2003 | Unno |
| 2003/0160949 A1 | 8/2003 | Komatsuda et al. |
| 2003/0174400 A1 | 9/2003 | Patel et al. |
| 2003/0206289 A1 | 11/2003 | Matsuyama |
| 2003/0214571 A1 | 11/2003 | Ishikawa et al. |
| 2003/0227607 A1 | 12/2003 | Kato et al. |
| 2004/0004771 A1 | 1/2004 | Omura |
| 2004/0012764 A1 | 1/2004 | Mulder et al. |
| 2004/0053148 A1 | 3/2004 | Morohoshi |
| 2004/0057034 A1 | 3/2004 | Zinn et al. |
| 2004/0057036 A1 | 3/2004 | Kawashima et al. |
| 2004/0100629 A1 | 5/2004 | Stokowski et al. |
| 2004/0104654 A1 | 6/2004 | Lee et al. |
| 2004/0119954 A1 | 6/2004 | Kawashima et al. |
| 2004/0120044 A1 | 6/2004 | Kreuzer |
| 2004/0150806 A1 | 8/2004 | Brunotte et al. |
| 2004/0160582 A1 | 8/2004 | Lof et al. |
| 2004/0169924 A1 | 9/2004 | Flagello et al. |
| 2004/0174512 A1 | 9/2004 | Toyoda et al. |
| 2004/0184019 A1 | 9/2004 | Totzeck et al. |
| 2004/0207386 A1 | 10/2004 | Durr |
| 2004/0227923 A1 | 11/2004 | Flagello et al. |
| 2004/0240073 A1 | 12/2004 | Gerhard |
| 2005/0024612 A1 | 2/2005 | Hirukawa et al. |
| 2005/0041232 A1* | 2/2005 | Yamada et al. ................ 355/71 |
| 2005/0094268 A1 | 5/2005 | Fiolka et al. |
| 2005/0095749 A1 | 5/2005 | Krellmann et al. |
| 2005/0122499 A1 | 6/2005 | Omura et al. |
| 2005/0128458 A1 | 6/2005 | Blatchford |
| 2005/0134825 A1 | 6/2005 | Schuster |
| 2005/0146704 A1 | 7/2005 | Gruner et al. |
| 2005/0168790 A1 | 8/2005 | Latypov et al. |
| 2005/0237509 A1 | 10/2005 | Blatchford |
| 2005/0237527 A1 | 10/2005 | Mori |
| 2005/0264885 A1 | 12/2005 | Albert |
| 2005/0270608 A1 | 12/2005 | Shiozawa et al. |
| 2006/0012769 A1 | 1/2006 | Suzuki |
| 2006/0050261 A1 | 3/2006 | Brotsack |
| 2006/0055834 A1 | 3/2006 | Tanitsu et al. |
| 2006/0072095 A1 | 4/2006 | Kudo et al. |
| 2006/0077370 A1 | 4/2006 | Mulkens et al. |
| 2006/0092398 A1 | 5/2006 | McCarthy |
| 2006/0132748 A1 | 6/2006 | Fukuhara |
| 2006/0139611 A1 | 6/2006 | Wagner et al. |
| 2006/0146384 A1 | 7/2006 | Schultz et al. |
| 2006/0158624 A1 | 7/2006 | Toyoda |
| 2006/0164711 A1 | 7/2006 | Govil et al. |
| 2006/0170901 A1 | 8/2006 | Tanitsu et al. |
| 2006/0171138 A1 | 8/2006 | Muramatsu et al. |
| 2006/0203214 A1 | 9/2006 | Shiraishi |
| 2006/0203341 A1 | 9/2006 | Schuster |
| 2006/0232841 A1 | 10/2006 | Toishi et al. |
| 2006/0291057 A1 | 12/2006 | Fiolka et al. |
| 2007/0008511 A1 | 1/2007 | De Boeij et al. |
| 2007/0019179 A1 | 1/2007 | Fiolka et al. |
| 2007/0058151 A1 | 3/2007 | Eurlings et al. |
| 2007/0081114 A1* | 4/2007 | Fiolka et al. ............ 349/96 |
| 2007/0146676 A1 | 6/2007 | Tanitsu et al. |
| 2007/0183017 A1 | 8/2007 | Hembd |
| 2007/0201338 A1 | 8/2007 | Yaoita et al. |
| 2007/0263199 A1 | 11/2007 | Fiolka et al. |
| 2007/0296936 A1 | 12/2007 | Kato et al. |
| 2007/0296941 A1 | 12/2007 | Omura |
| 2008/0021948 A1 | 1/2008 | Wilson et al. |
| 2008/0024747 A1 | 1/2008 | Kudo et al. |
| 2008/0030706 A1 | 2/2008 | Yamamoto |
| 2008/0030707 A1 | 2/2008 | Tanaka et al. |
| 2008/0068572 A1 | 3/2008 | Kudo et al. |
| 2008/0316459 A1 | 12/2008 | Fiolka et al. |
| 2008/0316598 A1 | 12/2008 | Fiolka et al. |
| 2009/0002675 A1 | 1/2009 | Fiolka et al. |
| 2009/0073411 A1 | 3/2009 | Tanitsu |
| 2009/0073414 A1 | 3/2009 | Tanitsu et al. |
| 2009/0073441 A1 | 3/2009 | Tanitsu et al. |
| 2009/0091730 A1 | 4/2009 | Tanaka |
| 2009/0097007 A1 | 4/2009 | Tanaka |
| 2009/0109417 A1 | 4/2009 | Tanitsu |
| 2009/0116093 A1 | 5/2009 | Tanitsu |
| 2009/0122292 A1 | 5/2009 | Shiraishi |
| 2009/0128886 A1 | 5/2009 | Hirota |
| 2009/0147233 A1 | 6/2009 | Toyoda |
| 2009/0147234 A1 | 6/2009 | Toyoda |
| 2009/0147235 A1 | 6/2009 | Toyoda |
| 2009/0185154 A1 | 7/2009 | Tanitsu |
| 2009/0185156 A1 | 7/2009 | Kudo et al. |
| 2009/0284729 A1 | 11/2009 | Shiraishi |
| 2009/0316132 A1 | 12/2009 | Tanitsu |
| 2009/0323041 A1 | 12/2009 | Toyoda |
| 2010/0141921 A1 | 6/2010 | Omura |
| 2010/0141926 A1 | 6/2010 | Omura |
| 2010/0142051 A1 | 6/2010 | Omura |
| 2011/0037962 A1 | 2/2011 | Tanitsu |
| 2011/0069296 A1 | 3/2011 | Gruner et al. |
| 2011/0188019 A1 | 8/2011 | Fiolka et al. |
| 2011/0205519 A1 | 8/2011 | Kanayamaya et al. |
| 2011/0273692 A1 | 11/2011 | Toyoda |
| 2011/0273693 A1 | 11/2011 | Toyoda |
| 2011/0273697 A1 | 11/2011 | Tanitsu et al. |
| 2011/0273698 A1 | 11/2011 | Toyoda |
| 2011/0299055 A1 | 12/2011 | Toyoda |

FOREIGN PATENT DOCUMENTS

| | | |
|---|---|---|
| CN | 1573571 A | 2/2005 |
| DE | 206 607 | 2/1984 |
| DE | 221 563 A1 | 4/1985 |
| DE | 224 448 A1 | 7/1985 |
| DE | 242 880 A1 | 2/1987 |
| DE | 100 29 938 A1 | 7/2001 |
| DE | 101 23 725 A1 | 11/2002 |

(56) References Cited

FOREIGN PATENT DOCUMENTS

| | | |
|---|---|---|
| DE | 102 06 061 A1 | 9/2003 |
| DE | 103 43 333 A1 | 4/2005 |
| EP | 0 023 231 A1 | 2/1981 |
| EP | 0 208 552 A2 | 1/1987 |
| EP | 0 230 931 A2 | 8/1987 |
| EP | 0 564 264 A1 | 10/1993 |
| EP | 0 656 555 A1 | 6/1995 |
| EP | 0 764 858 | 8/1996 |
| EP | 0 744 664 A2 | 11/1996 |
| EP | 0 779 530 A1 | 6/1997 |
| EP | 0 937 999 A1 | 8/1999 |
| EP | 1 014 196 A2 | 6/2000 |
| EP | 1 071 292 A2 | 1/2001 |
| EP | 1 139 521 A1 | 10/2001 |
| EP | 1 211 561 A2 | 6/2002 |
| EP | 1 260 849 A1 | 11/2002 |
| EP | 1 280 007 A2 | 1/2003 |
| EP | 1 489 462 A2 | 12/2004 |
| EP | 1 577 709 A2 | 9/2005 |
| EP | 1 662 553 A1 | 5/2006 |
| EP | 1 674 935 A2 | 6/2006 |
| EP | 1 681 710 A1 | 7/2006 |
| EP | 1 693 885 A1 | 8/2006 |
| EP | 1 798 758 A1 | 6/2007 |
| EP | 1 840 945 A1 | 10/2007 |
| EP | 1 953 805 A1 | 8/2008 |
| FR | 2 474 708 | 7/1981 |
| GB | 856621 | 12/1960 |
| JP | A-44-4993 | 2/1969 |
| JP | A-56-6666 | 1/1981 |
| JP | A-57-117238 | 7/1982 |
| JP | A-57-152129 | 9/1982 |
| JP | A-57-153433 | 9/1982 |
| JP | A-58-49932 | 3/1983 |
| JP | U-58-45502 | 3/1983 |
| JP | A-58-115945 | 7/1983 |
| JP | A-58-202448 | 11/1983 |
| JP | A-59-19912 | 2/1984 |
| JP | A-59-155843 | 9/1984 |
| JP | A-59-226317 | 12/1984 |
| JP | A-61-44429 | 3/1986 |
| JP | A-61-45923 | 3/1986 |
| JP | A-61-91662 | 5/1986 |
| JP | U-61-94342 | 6/1986 |
| JP | A-61-156736 | 7/1986 |
| JP | A-61-196532 | 8/1986 |
| JP | A-61-217434 | 9/1986 |
| JP | A-61-251025 | 11/1986 |
| JP | A-61-270049 | 11/1986 |
| JP | A-62-2539 | 1/1987 |
| JP | A-62-2540 | 1/1987 |
| JP | A-62-17705 | 1/1987 |
| JP | A-62-65326 | 3/1987 |
| JP | A-62-100161 | 5/1987 |
| JP | A-62-120026 | 6/1987 |
| JP | A-62-121417 | 6/1987 |
| JP | A-62-122215 | 6/1987 |
| JP | A-62-153710 | 7/1987 |
| JP | A-62-183522 | 8/1987 |
| JP | A-62-188316 | 8/1987 |
| JP | A-62-203526 | 9/1987 |
| JP | A-62-265722 | 11/1987 |
| JP | A-63-12134 | 1/1988 |
| JP | A-63-36526 | 2/1988 |
| JP | A-63-73628 | 4/1988 |
| JP | A-63-128713 | 6/1988 |
| JP | A-63-131008 | 6/1988 |
| JP | A-63-141313 | 6/1988 |
| JP | A-63-157419 | 6/1988 |
| JP | A-63-160192 | 7/1988 |
| JP | A-63-231217 | 9/1988 |
| JP | A-63-275912 | 11/1988 |
| JP | A-63-292005 | 11/1988 |
| JP | A-64-18002 | 1/1989 |
| JP | A-64-26704 | 2/1989 |
| JP | A-64-68926 | 3/1989 |
| JP | A-1-91419 | 4/1989 |
| JP | A-1-115033 | 5/1989 |
| JP | A-1-147516 | 6/1989 |
| JP | A-1-202833 | 8/1989 |
| JP | A-1-214042 | 8/1989 |
| JP | U-1-127379 | 8/1989 |
| JP | A-1-255404 | 10/1989 |
| JP | A-1-258550 | 10/1989 |
| JP | A-1-276043 | 11/1989 |
| JP | A-1-278240 | 11/1989 |
| JP | A-1-286478 | 11/1989 |
| JP | A-1-292343 | 11/1989 |
| JP | A-1-314247 | 12/1989 |
| JP | A-1-319964 | 12/1989 |
| JP | A-2-42382 | 2/1990 |
| JP | A-2-65149 | 3/1990 |
| JP | A-2-65222 | 3/1990 |
| JP | A-2-97239 | 4/1990 |
| JP | A-2-106917 | 4/1990 |
| JP | A-2-116115 | 4/1990 |
| JP | A-2-139146 | 5/1990 |
| JP | A-2-166717 | 6/1990 |
| JP | A-2-261073 | 10/1990 |
| JP | A-2-264901 | 10/1990 |
| JP | A-2-285320 | 11/1990 |
| JP | A-2-287308 | 11/1990 |
| JP | A-2-298431 | 12/1990 |
| JP | A-2-311237 | 12/1990 |
| JP | A-3-41399 | 2/1991 |
| JP | A-3-64811 | 3/1991 |
| JP | A-3-72298 | 3/1991 |
| JP | A-3-94445 | 4/1991 |
| JP | A-3-132663 | 6/1991 |
| JP | A-3-134341 | 6/1991 |
| JP | A-3-167419 | 7/1991 |
| JP | A-3-168640 | 7/1991 |
| JP | A-3-211812 | 9/1991 |
| JP | A-3-263810 | 11/1991 |
| JP | A-4-11613 | 1/1992 |
| JP | A-4-32154 | 2/1992 |
| JP | A-4-065603 | 3/1992 |
| JP | A-4-96315 | 3/1992 |
| JP | A-04-101148 | 4/1992 |
| JP | A-4-130710 | 5/1992 |
| JP | A-4-132909 | 5/1992 |
| JP | A-4-133414 | 5/1992 |
| JP | A-4-152512 | 5/1992 |
| JP | A-4-179115 | 6/1992 |
| JP | A-4-186244 | 7/1992 |
| JP | U-4-80052 | 7/1992 |
| JP | A-4-211110 | 8/1992 |
| JP | A-04-225357 | 8/1992 |
| JP | A-4-235558 | 8/1992 |
| JP | A-4-265805 | 9/1992 |
| JP | A-4-273245 | 9/1992 |
| JP | A-4-273427 | 9/1992 |
| JP | A-4-280619 | 10/1992 |
| JP | A-4-282539 | 10/1992 |
| JP | A-4-296092 | 10/1992 |
| JP | A-4-297030 | 10/1992 |
| JP | A-4-305915 | 10/1992 |
| JP | A-4-305917 | 10/1992 |
| JP | U-4-117212 | 10/1992 |
| JP | A-4-330961 | 11/1992 |
| JP | A-4-343307 | 11/1992 |
| JP | A-4-350925 | 12/1992 |
| JP | A-5-21314 | 1/1993 |
| JP | A-5-45886 | 2/1993 |
| JP | A-5-62877 | 3/1993 |
| JP | A-05-090128 | 4/1993 |
| JP | A-05-109601 | 4/1993 |
| JP | A-5-127086 | 5/1993 |
| JP | A-5-129184 | 5/1993 |
| JP | A-5-134230 | 5/1993 |
| JP | A-05-160002 | 6/1993 |
| JP | A-5-175098 | 7/1993 |
| JP | A-5-199680 | 8/1993 |
| JP | A-5-217837 | 8/1993 |

(56) References Cited

FOREIGN PATENT DOCUMENTS

| | | |
|---|---|---|
| JP | A-05-217840 | 8/1993 |
| JP | A-5-226225 | 9/1993 |
| JP | A-5-241324 | 9/1993 |
| JP | A-5-243364 | 9/1993 |
| JP | A-5-259069 | 10/1993 |
| JP | A-05-283317 | 10/1993 |
| JP | A-5-304072 | 11/1993 |
| JP | A-5-319774 | 12/1993 |
| JP | A-5-323583 | 12/1993 |
| JP | A-05-326370 | 12/1993 |
| JP | A-6-29204 | 2/1994 |
| JP | A-6-42918 | 2/1994 |
| JP | A-6-53120 | 2/1994 |
| JP | A-6-97269 | 4/1994 |
| JP | A-6-104167 | 4/1994 |
| JP | A-6-118623 | 4/1994 |
| JP | A-6-120110 | 4/1994 |
| JP | B2-6-29102 | 4/1994 |
| JP | A-6-36054 | 5/1994 |
| JP | A-6-124126 | 5/1994 |
| JP | A-06-124872 | 5/1994 |
| JP | A-6-124873 | 5/1994 |
| JP | A-6-140306 | 5/1994 |
| JP | A-6-148399 | 5/1994 |
| JP | A-06-163350 | 6/1994 |
| JP | A-6-168866 | 6/1994 |
| JP | A-6-177007 | 6/1994 |
| JP | A-6-181157 | 6/1994 |
| JP | A-6-186025 | 7/1994 |
| JP | A-6-188169 | 7/1994 |
| JP | A-6-196388 | 7/1994 |
| JP | A-6-204113 | 7/1994 |
| JP | A-06-204121 | 7/1994 |
| JP | A-6-229741 | 8/1994 |
| JP | A-6-241720 | 9/1994 |
| JP | A-06-244082 | 9/1994 |
| JP | A-06-267825 | 9/1994 |
| JP | A-06-281869 | 10/1994 |
| JP | A-6-283403 | 10/1994 |
| JP | A-06-291023 | 10/1994 |
| JP | A-6-310399 | 11/1994 |
| JP | A-6-325894 | 11/1994 |
| JP | A-6-326174 | 11/1994 |
| JP | A-6-349701 | 12/1994 |
| JP | A-7-057992 | 3/1995 |
| JP | A-7-57993 | 3/1995 |
| JP | A-7-69621 | 3/1995 |
| JP | A-7-92424 | 4/1995 |
| JP | A-07-122469 | 5/1995 |
| JP | A-7-132262 | 5/1995 |
| JP | A-7-134955 | 5/1995 |
| JP | A-7-135158 | 5/1995 |
| JP | A-7-135165 | 5/1995 |
| JP | A-07-147223 | 6/1995 |
| JP | A-7-161622 | 6/1995 |
| JP | A-7-167998 | 7/1995 |
| JP | A-7-168286 | 7/1995 |
| JP | A-7-174974 | 7/1995 |
| JP | A-7-176468 | 7/1995 |
| JP | A-07-183201 | 7/1995 |
| JP | A-7-183214 | 7/1995 |
| JP | A-7-190741 | 7/1995 |
| JP | A-07-201723 | 8/1995 |
| JP | A-7-220989 | 8/1995 |
| JP | A-7-220990 | 8/1995 |
| JP | A-07-220995 | 8/1995 |
| JP | A-7-221010 | 8/1995 |
| JP | A-7-230945 | 8/1995 |
| JP | A-7-239212 | 9/1995 |
| JP | A-7-243814 | 9/1995 |
| JP | A-7-245258 | 9/1995 |
| JP | A-07-263315 | 10/1995 |
| JP | A-7-283119 | 10/1995 |
| JP | A-7-297272 | 11/1995 |
| JP | A-07-307268 | 11/1995 |
| JP | A-7-318847 | 12/1995 |
| JP | A-7-335748 | 12/1995 |
| JP | A-8-10971 | 1/1996 |
| JP | A-8-17709 | 1/1996 |
| JP | A-8-22948 | 1/1996 |
| JP | A-8-37149 | 2/1996 |
| JP | A-8-37227 | 2/1996 |
| JP | A-8-46751 | 2/1996 |
| JP | A-8-63231 | 3/1996 |
| JP | A-8-115868 | 5/1996 |
| JP | A-8-136475 | 5/1996 |
| JP | A-8-151220 | 6/1996 |
| JP | A-8-162397 | 6/1996 |
| JP | A-8-166475 | 6/1996 |
| JP | A-8-171054 | 7/1996 |
| JP | A-8-195375 | 7/1996 |
| JP | A-8-203803 | 8/1996 |
| JP | A-8-279549 | 10/1996 |
| JP | A-8-288213 | 11/1996 |
| JP | A-8-297699 | 11/1996 |
| JP | A-8-316125 | 11/1996 |
| JP | A-8-316133 | 11/1996 |
| JP | A-8-330224 | 12/1996 |
| JP | A-8-334695 | 12/1996 |
| JP | A-08-335552 | 12/1996 |
| JP | A-9-7933 | 1/1997 |
| JP | A-9-15834 | 1/1997 |
| JP | A-9-22121 | 1/1997 |
| JP | A-9-61686 | 3/1997 |
| JP | A-9-82626 | 3/1997 |
| JP | A-9-83877 | 3/1997 |
| JP | A-9-92593 | 4/1997 |
| JP | A-9-108551 | 4/1997 |
| JP | A-9-115794 | 5/1997 |
| JP | A-9-134870 | 5/1997 |
| JP | A-9-148406 | 6/1997 |
| JP | A-9-151658 | 6/1997 |
| JP | A-9-160004 | 6/1997 |
| JP | A-09-160219 | 6/1997 |
| JP | A-9-160219 | 6/1997 |
| JP | A-9-162106 | 6/1997 |
| JP | A-9-178415 | 7/1997 |
| JP | A-9-184787 | 7/1997 |
| JP | A-09-184918 | 7/1997 |
| JP | A-9-186082 | 7/1997 |
| JP | A-9-190969 | 7/1997 |
| JP | A-9-213129 | 8/1997 |
| JP | A-09-219358 | 8/1997 |
| JP | A-9-227294 | 9/1997 |
| JP | A-9-232213 | 9/1997 |
| JP | A-9-243892 | 9/1997 |
| JP | A-9-246672 | 9/1997 |
| JP | A-9-251208 | 9/1997 |
| JP | A-9-281077 | 10/1997 |
| JP | A-9-325255 | 12/1997 |
| JP | A-9-326338 | 12/1997 |
| JP | A-10-002865 | 1/1998 |
| JP | A-10-3039 | 1/1998 |
| JP | A-10-20195 | 1/1998 |
| JP | A-10-32160 | 2/1998 |
| JP | A-10-38517 | 2/1998 |
| JP | A-10-38812 | 2/1998 |
| JP | A-10-55713 | 2/1998 |
| JP | A-10-62305 | 3/1998 |
| JP | A-10-64790 | 3/1998 |
| JP | A-10-79337 | 3/1998 |
| JP | A-10-82611 | 3/1998 |
| JP | A-10-503300 | 3/1998 |
| JP | A-10-92735 | 4/1998 |
| JP | A-10-97969 | 4/1998 |
| JP | A-10-104427 | 4/1998 |
| JP | A-10-116760 | 5/1998 |
| JP | A-10-116778 | 5/1998 |
| JP | A-10-135099 | 5/1998 |
| JP | A-H10-116779 | 5/1998 |
| JP | A-H10-125572 | 5/1998 |
| JP | A-H10-134028 | 5/1998 |
| JP | A-10-163099 | 6/1998 |
| JP | A-10-163302 | 6/1998 |

(56) References Cited

FOREIGN PATENT DOCUMENTS

| | | |
|---|---|---|
| JP | A-10-169249 | 6/1998 |
| JP | A-10-189427 | 7/1998 |
| JP | A-10-189700 | 7/1998 |
| JP | A-10-206714 | 8/1998 |
| JP | A-10-208993 | 8/1998 |
| JP | A-10-209018 | 8/1998 |
| JP | A-10-214783 | 8/1998 |
| JP | A-10-228661 | 8/1998 |
| JP | A-10-255319 | 9/1998 |
| JP | A-10-294268 | 11/1998 |
| JP | A-10-303114 | 11/1998 |
| JP | A-10-340846 | 12/1998 |
| JP | A-11-3849 | 1/1999 |
| JP | A-11-3856 | 1/1999 |
| JP | A-11-8194 | 1/1999 |
| JP | A-11-14876 | 1/1999 |
| JP | A-11-16816 | 1/1999 |
| JP | A-11-40657 | 2/1999 |
| JP | A-11-54426 | 2/1999 |
| JP | A-11-74185 | 3/1999 |
| JP | A-11-87237 | 3/1999 |
| JP | A-11-111601 | 4/1999 |
| JP | A-11-111818 | 4/1999 |
| JP | A-11-111819 | 4/1999 |
| JP | A-11-121328 | 4/1999 |
| JP | A-11-135400 | 5/1999 |
| JP | A-11-142556 | 5/1999 |
| JP | A-11-150062 | 6/1999 |
| JP | A-11-159571 | 6/1999 |
| JP | A-11-162831 | 6/1999 |
| JP | A-11-163103 | 6/1999 |
| JP | A-11-164543 | 6/1999 |
| JP | A-11-166990 | 6/1999 |
| JP | A-11-98 | 7/1999 |
| JP | A-11-176727 | 7/1999 |
| JP | A-11-176744 | 7/1999 |
| JP | A-11-195602 | 7/1999 |
| JP | A-11-204390 | 7/1999 |
| JP | A-11-204432 | 7/1999 |
| JP | A-11-218466 | 8/1999 |
| JP | A-11-219882 | 8/1999 |
| JP | A-11-233434 | 8/1999 |
| JP | A-11-238680 | 8/1999 |
| JP | A-11-239758 | 9/1999 |
| JP | A-11-260686 | 9/1999 |
| JP | A-11-260791 | 9/1999 |
| JP | A-11-264756 | 9/1999 |
| JP | A-11-283903 | 10/1999 |
| JP | A-11-288879 | 10/1999 |
| JP | A-11-307610 | 11/1999 |
| JP | A-11-312631 | 11/1999 |
| JP | A-11-354624 | 12/1999 |
| JP | A-2000-3874 | 1/2000 |
| JP | A-2000-12453 | 1/2000 |
| JP | A-2000-21742 | 1/2000 |
| JP | A-2000-21748 | 1/2000 |
| JP | A-2000-29202 | 1/2000 |
| JP | A-2000-32403 | 1/2000 |
| JP | A-2000-36449 | 2/2000 |
| JP | A-2000-58436 | 2/2000 |
| JP | A-2000-58441 | 2/2000 |
| JP | A-2000-81320 | 3/2000 |
| JP | A-2000-92815 | 3/2000 |
| JP | A-2000-97616 | 4/2000 |
| JP | A-2000-106340 | 4/2000 |
| JP | A-2000-114157 | 4/2000 |
| JP | A-2000-121491 | 4/2000 |
| JP | A-2000-147346 | 5/2000 |
| JP | A-2000-154251 | 6/2000 |
| JP | A-2000-180371 | 6/2000 |
| JP | A-2000-206279 | 7/2000 |
| JP | A-2000-208407 | 7/2000 |
| JP | A-2000-240717 | 9/2000 |
| JP | A-2000-243684 | 9/2000 |
| JP | A-2000-252201 | 9/2000 |
| JP | A-2000-283889 | 10/2000 |
| JP | A-2000-286176 | 10/2000 |
| JP | A-2000-311853 | 11/2000 |
| JP | A-2000-323403 | 11/2000 |
| JP | A-2001-7015 | 1/2001 |
| JP | A-2001-20951 | 1/2001 |
| JP | A-2001-23996 | 1/2001 |
| JP | A-2001-37201 | 2/2001 |
| JP | A-2001-44097 | 2/2001 |
| JP | A-2001-74240 | 3/2001 |
| JP | A-2001-83472 | 3/2001 |
| JP | A-2001-85307 | 3/2001 |
| JP | A-2001-97734 | 4/2001 |
| JP | A-2001-100311 | 4/2001 |
| JP | A-2001-110707 | 4/2001 |
| JP | A-2001-118773 | 4/2001 |
| JP | A-2001-135560 | 5/2001 |
| JP | A-2001-144004 | 5/2001 |
| JP | A-2001-167996 | 6/2001 |
| JP | A-2001-176766 | 6/2001 |
| JP | A-2001-203140 | 7/2001 |
| JP | A-2001-218497 | 8/2001 |
| JP | A-2001-228401 | 8/2001 |
| JP | A-2001-228404 | 8/2001 |
| JP | A-2001-230323 | 8/2001 |
| JP | A-2001-242269 | 9/2001 |
| JP | A-2001-265581 | 9/2001 |
| JP | A-2001-267227 | 9/2001 |
| JP | A-2001-272764 | 10/2001 |
| JP | A-2001-274083 | 10/2001 |
| JP | A-2001-282526 | 10/2001 |
| JP | A-2001-284228 | 10/2001 |
| JP | A-2001-296105 | 10/2001 |
| JP | A-2001-297976 | 10/2001 |
| JP | A-2001-304332 | 10/2001 |
| JP | A-2001-307982 | 11/2001 |
| JP | A-2001-307983 | 11/2001 |
| JP | A-2001-313250 | 11/2001 |
| JP | B2-3246615 | 11/2001 |
| JP | A-2001-338868 | 12/2001 |
| JP | A-2001-345262 | 12/2001 |
| JP | A-2002-14005 | 1/2002 |
| JP | A-2002-15978 | 1/2002 |
| JP | A-2002-16124 | 1/2002 |
| JP | A-2002-43213 | 2/2002 |
| JP | A-2002-57097 | 2/2002 |
| JP | 2002-075859 A | 3/2002 |
| JP | A-2002-66428 | 3/2002 |
| JP | A-2002-71513 | 3/2002 |
| JP | A-2002-75816 | 3/2002 |
| JP | A-2002-075816 | 3/2002 |
| JP | A-2002-075835 | 3/2002 |
| JP | A-2002-91922 | 3/2002 |
| JP | A-2002-93686 | 3/2002 |
| JP | A-2002-93690 | 3/2002 |
| JP | A-2002-100561 | 4/2002 |
| JP | A-2002-118058 | 4/2002 |
| JP | A-2002-141270 | 5/2002 |
| JP | A-2002-158157 | 5/2002 |
| JP | A-2002-162655 | 6/2002 |
| JP | A-2002-170495 | 6/2002 |
| JP | A-2002-190438 | 7/2002 |
| JP | A-2002-195912 | 7/2002 |
| JP | A-2002-198284 | 7/2002 |
| JP | A-2002-202221 | 7/2002 |
| JP | A-2002-203763 | 7/2002 |
| JP | A-2002-208562 | 7/2002 |
| JP | A-2002-520810 | 7/2002 |
| JP | A-2002-222754 | 8/2002 |
| JP | A-2002-227924 | 8/2002 |
| JP | A-2002-231619 | 8/2002 |
| JP | A-2002-258487 | 9/2002 |
| JP | A-2002-261004 | 9/2002 |
| JP | A-2002-263553 | 9/2002 |
| JP | A-2002-277742 | 9/2002 |
| JP | A-2002-289505 | 10/2002 |
| JP | A-2002-305140 | 10/2002 |
| JP | A-2002-323658 | 11/2002 |
| JP | A-2002-324743 | 11/2002 |

(56) References Cited

FOREIGN PATENT DOCUMENTS

| | | |
|---|---|---|
| JP | A-2002-329651 | 11/2002 |
| JP | A-2002-334836 | 11/2002 |
| JP | 2002-359176 A | 12/2002 |
| JP | A-2002-353105 | 12/2002 |
| JP | A-2002-357715 | 12/2002 |
| JP | A-2002-359174 | 12/2002 |
| JP | A-2002-362737 | 12/2002 |
| JP | A-2002-365783 | 12/2002 |
| JP | A-2002-367523 | 12/2002 |
| JP | A-2002-367886 | 12/2002 |
| JP | A-2002-373849 | 12/2002 |
| JP | A-2003-15040 | 1/2003 |
| JP | A-2003-015314 | 1/2003 |
| JP | A-2003-17003 | 1/2003 |
| JP | A-2003-17404 | 1/2003 |
| JP | A-2003-28673 | 1/2003 |
| JP | A-2003-35822 | 2/2003 |
| JP | A-2003-035822 | 2/2003 |
| JP | A-2003-43223 | 2/2003 |
| JP | A-2003-45219 | 2/2003 |
| JP | A-2003-45712 | 2/2003 |
| JP | A-2003-59799 | 2/2003 |
| JP | A-2003-59803 | 2/2003 |
| JP | A-2003-059821 | 2/2003 |
| JP | A-2003-59826 | 2/2003 |
| JP | 2003-068607 A | 3/2003 |
| JP | A-2003-068600 | 3/2003 |
| JP | A-2003-068604 | 3/2003 |
| JP | A-2003-75703 | 3/2003 |
| JP | A-2003-81654 | 3/2003 |
| JP | A-2003-84445 | 3/2003 |
| JP | A-2003-090978 | 3/2003 |
| JP | A-2003-98651 | 4/2003 |
| JP | A-2003-100597 | 4/2003 |
| JP | A-2003-114387 | 4/2003 |
| JP | A-2003-124095 | 4/2003 |
| JP | A-2003-130132 | 5/2003 |
| JP | A-2003-149363 | 5/2003 |
| JP | A-2003-151880 | 5/2003 |
| JP | A-2003-161882 | 6/2003 |
| JP | A-2003-163158 | 6/2003 |
| JP | A-2003-166856 | 6/2003 |
| JP | A2003-173957 | 6/2003 |
| JP | A-2003-188087 | 7/2003 |
| JP | A-2003-224961 | 8/2003 |
| JP | A-2003-229347 | 8/2003 |
| JP | A-2003-233001 | 8/2003 |
| JP | A-2003-234285 | 8/2003 |
| JP | A-2003-238577 | 8/2003 |
| JP | A-2003-240906 | 8/2003 |
| JP | A-2003-249443 | 9/2003 |
| JP | A-2003-258071 | 9/2003 |
| JP | A-2003-262501 | 9/2003 |
| JP | A-2003-263119 | 9/2003 |
| JP | A-2003-272837 | 9/2003 |
| JP | A-2003-273338 | 9/2003 |
| JP | A-2003-282423 | 10/2003 |
| JP | A-2003-297727 | 10/2003 |
| JP | A-2003-532281 | 10/2003 |
| JP | A-2003-532282 | 10/2003 |
| JP | A-2003-311923 | 11/2003 |
| JP | A-2004-7417 | 1/2004 |
| JP | A-2004-14642 | 1/2004 |
| JP | A-2004-14876 | 1/2004 |
| JP | A-2004-15187 | 1/2004 |
| JP | A-2004-22708 | 1/2004 |
| JP | A-2004-38247 | 2/2004 |
| JP | A-2004-39952 | 2/2004 |
| JP | A-2004-40039 | 2/2004 |
| JP | A-2004-45063 | 2/2004 |
| JP | A-2004-051717 | 2/2004 |
| JP | A-2004-63847 | 2/2004 |
| JP | A-2004-71851 | 3/2004 |
| JP | A-2004-078136 | 3/2004 |
| JP | A-2004-85612 | 3/2004 |
| JP | A-2004-087987 | 3/2004 |
| JP | A-2004-95653 | 3/2004 |
| JP | U-3102327 | 3/2004 |
| JP | A-2004-98012 | 4/2004 |
| JP | A-2004-101362 | 4/2004 |
| JP | A-2004-103674 | 4/2004 |
| JP | A-2004-104654 | 4/2004 |
| JP | A-2004-111569 | 4/2004 |
| JP | A-2004-119497 | 4/2004 |
| JP | A-2004-119717 | 4/2004 |
| JP | A-2004-128307 | 4/2004 |
| JP | A-2004-134682 | 4/2004 |
| JP | A-2004-140145 | 5/2004 |
| JP | A-2004-145269 | 5/2004 |
| JP | A-2004-146702 | 5/2004 |
| JP | A-2004-152705 | 5/2004 |
| JP | A-2004-153064 | 5/2004 |
| JP | A-2004-153096 | 5/2004 |
| JP | A-2004-163555 | 6/2004 |
| JP | A-2004-165249 | 6/2004 |
| JP | A-2004-165416 | 6/2004 |
| JP | A-2004-172471 | 6/2004 |
| JP | A-2004-177468 | 6/2004 |
| JP | A-2004-179172 | 6/2004 |
| JP | A-2004-187401 | 7/2004 |
| JP | A-2004-193252 | 7/2004 |
| JP | A-2004-193425 | 7/2004 |
| JP | A-2004-198748 | 7/2004 |
| JP | A-2004-205698 | 7/2004 |
| JP | A-2004-207696 | 7/2004 |
| JP | A-2004-207711 | 7/2004 |
| JP | A-2004-260115 | 7/2004 |
| JP | A-2004-520618 | 7/2004 |
| JP | A-2004-221253 | 8/2004 |
| JP | A-2004-224421 | 8/2004 |
| JP | A-2004-228497 | 8/2004 |
| JP | A-2004-241666 | 8/2004 |
| JP | A-2004-247527 | 9/2004 |
| JP | A-2004-258670 | 9/2004 |
| JP | A-2004-259828 | 9/2004 |
| JP | A-2004-259966 | 9/2004 |
| JP | A-2004-259985 | 9/2004 |
| JP | A-2004-260043 | 9/2004 |
| JP | A-2004-260081 | 9/2004 |
| JP | A-2004-294202 | 10/2004 |
| JP | A-2004-301825 | 10/2004 |
| JP | A-2004-302043 | 10/2004 |
| JP | A-2004-303808 | 10/2004 |
| JP | A-2004-304135 | 10/2004 |
| JP | A-2004-307264 | 11/2004 |
| JP | A-2004-307265 | 11/2004 |
| JP | A-2004-307266 | 11/2004 |
| JP | A-2004-307267 | 11/2004 |
| JP | A-2004-319724 | 11/2004 |
| JP | A-2004-320017 | 11/2004 |
| JP | A-2004-327660 | 11/2004 |
| JP | A-2004-335808 | 11/2004 |
| JP | A-2004-335864 | 11/2004 |
| JP | A-2004-336922 | 11/2004 |
| JP | A-2004-342987 | 12/2004 |
| JP | A-2004-349645 | 12/2004 |
| JP | A-2004-356410 | 12/2004 |
| JP | A-2005-5295 | 1/2005 |
| JP | A-2005-5395 | 1/2005 |
| JP | A-2005-5521 | 1/2005 |
| JP | A-2005-005521 | 1/2005 |
| JP | A-2005-11990 | 1/2005 |
| JP | A-2005-012190 | 1/2005 |
| JP | A-2005-12228 | 1/2005 |
| JP | A-2005-19628 | 1/2005 |
| JP | A-2005-19864 | 1/2005 |
| JP | A-2005-26634 | 1/2005 |
| JP | A-2005-51147 | 2/2005 |
| JP | A-2005-55811 | 3/2005 |
| JP | A-2005-64210 | 3/2005 |
| JP | A-2005-64391 | 3/2005 |
| JP | A-2005-79222 | 3/2005 |
| JP | A-2005-79584 | 3/2005 |
| JP | A-2005-79587 | 3/2005 |

(56) References Cited

FOREIGN PATENT DOCUMENTS

| | | |
|---|---|---|
| JP | A-2005-86148 | 3/2005 |
| JP | A-2005-91023 | 4/2005 |
| JP | A-2005-93324 | 4/2005 |
| JP | A-2005-093522 | 4/2005 |
| JP | A-2005-93948 | 4/2005 |
| JP | A-2005-97057 | 4/2005 |
| JP | A-2005-108925 | 4/2005 |
| JP | A-2005-108934 | 4/2005 |
| JP | A-2005-114882 | 4/2005 |
| JP | A-2005-116570 | 4/2005 |
| JP | A-2005-116571 | 4/2005 |
| JP | A-2005-116831 | 4/2005 |
| JP | A-2005-123586 | 5/2005 |
| JP | A-2005-127460 | 5/2005 |
| JP | A-2005-136404 | 5/2005 |
| JP | A-2005-140999 | 6/2005 |
| JP | A-2005-150759 | 6/2005 |
| JP | A-2005-156592 | 6/2005 |
| JP | A-2005-166871 | 6/2005 |
| JP | A-2005-167254 | 6/2005 |
| JP | A-2005-175176 | 6/2005 |
| JP | A-2005-175177 | 6/2005 |
| JP | A-2005-191344 | 7/2005 |
| JP | A-2005-203483 | 7/2005 |
| JP | A-2005-209705 | 8/2005 |
| JP | A-2005-209706 | 8/2005 |
| JP | A-2005-524112 | 8/2005 |
| JP | A-2005-233979 | 9/2005 |
| JP | A-2005-234359 | 9/2005 |
| JP | A-2005-236088 | 9/2005 |
| JP | A-2005-243770 | 9/2005 |
| JP | A-2005-243904 | 9/2005 |
| JP | A-2005-251549 | 9/2005 |
| JP | A-2005-257740 | 9/2005 |
| JP | A-2005-259789 | 9/2005 |
| JP | A-2005-259830 | 9/2005 |
| JP | A-2005-268700 | 9/2005 |
| JP | A-2005-268741 | 9/2005 |
| JP | A-2005-268742 | 9/2005 |
| JP | A-2005-276932 | 10/2005 |
| JP | A-2005-302826 | 10/2005 |
| JP | A-2005-303167 | 10/2005 |
| JP | A-2005-311020 | 11/2005 |
| JP | A-2005-315918 | 11/2005 |
| JP | A-2005-340605 | 12/2005 |
| JP | A-2005-366813 | 12/2005 |
| JP | A-2006-1821 | 1/2006 |
| JP | A-2006-5197 | 1/2006 |
| JP | A-2006-17895 | 1/2006 |
| JP | A-2006-019702 | 1/2006 |
| JP | A-2006-24706 | 1/2006 |
| JP | A-2006-24819 | 1/2006 |
| JP | A-2006-32750 | 2/2006 |
| JP | A-2006-41302 | 2/2006 |
| JP | A-2006-54364 | 2/2006 |
| JP | A-2006-73584 | 3/2006 |
| JP | A-2006-73951 | 3/2006 |
| JP | A-2006-80281 | 3/2006 |
| JP | A-2006-86141 | 3/2006 |
| JP | A-2006-86442 | 3/2006 |
| JP | A-2006-100363 | 4/2006 |
| JP | A-2006-100686 | 4/2006 |
| JP | A-2006-113437 | 4/2006 |
| JP | A-2006-513442 | 4/2006 |
| JP | A-2006-120985 | 5/2006 |
| JP | A-2006-128192 | 5/2006 |
| JP | A-2006-135165 | 5/2006 |
| JP | A-2006-140366 | 6/2006 |
| JP | A-2006-170811 | 6/2006 |
| JP | A-2006-170899 | 6/2006 |
| JP | A-2006-177865 | 7/2006 |
| JP | A-2006-184414 | 7/2006 |
| JP | A-2006-194665 | 7/2006 |
| JP | A-2006-250587 | 9/2006 |
| JP | A-2006-253572 | 9/2006 |
| JP | A-2006-269762 | 10/2006 |
| JP | A-2006-278820 | 10/2006 |
| JP | A-2006-289684 | 10/2006 |
| JP | A-2006-524349 | 10/2006 |
| JP | A-2006-332355 | 12/2006 |
| JP | A-2006-349946 | 12/2006 |
| JP | A-2006-351586 | 12/2006 |
| JP | A-2007-5830 | 1/2007 |
| JP | A-2007-43980 | 2/2007 |
| JP | A-2007-48819 | 2/2007 |
| JP | A-2007-51300 | 3/2007 |
| JP | A-2007-87306 | 4/2007 |
| JP | A-2007-93546 | 4/2007 |
| JP | A-2007-103153 | 4/2007 |
| JP | A-2007-113939 | 5/2007 |
| JP | A-2007-119851 | 5/2007 |
| JP | A-2007-120333 | 5/2007 |
| JP | A-2007-120334 | 5/2007 |
| JP | A-2007-142313 | 6/2007 |
| JP | A-2007-144864 | 6/2007 |
| JP | A-2007-515768 | 6/2007 |
| JP | A-2007-170938 | 7/2007 |
| JP | A-2007-187649 | 7/2007 |
| JP | A-2007-207821 | 8/2007 |
| JP | A-2007-227637 | 9/2007 |
| JP | A-2007-235041 | 9/2007 |
| JP | A-2007-527549 | 9/2007 |
| JP | A-2007-274881 | 10/2007 |
| JP | A-2007-280623 | 10/2007 |
| JP | A-2007-295702 | 11/2007 |
| JP | A-2008-3740 | 1/2008 |
| JP | A-2008-58580 | 3/2008 |
| JP | A-2008-64924 | 3/2008 |
| JP | A-2008-103737 | 5/2008 |
| JP | A-2008-180492 | 8/2008 |
| JP | A-2009-17540 | 1/2009 |
| JP | A-2009-60339 | 3/2009 |
| JP | A-2010-514716 | 5/2010 |
| JP | B2-4582096 | 9/2010 |
| JP | A-2010-226117 | 10/2010 |
| JP | B2-4747844 | 8/2011 |
| JP | A-2011-233911 | 11/2011 |
| JP | B2-4976015 | 7/2012 |
| JP | B2-4976094 | 7/2012 |
| KP | 1995-0009365 A | 9/1994 |
| KR | 10-0474578 B1 | 1/1997 |
| KR | 10-1997-0016641 A | 4/1997 |
| KR | 10-2011-0036050 | 4/1997 |
| KR | 10-2000-0048227 | 7/2000 |
| KR | 2000-0076783 A | 12/2000 |
| KR | 2001-0051438 A | 6/2001 |
| KR | A-2001-0053240 | 6/2001 |
| KR | 10-2002-0042462 A | 6/2002 |
| KR | 10-2003-0036105 | 5/2003 |
| KR | 10-2006-0132598 | 12/2006 |
| KR | 10-0839686 B1 | 6/2008 |
| KR | 10-0869390 B1 | 11/2008 |
| KR | 10-2010-0061551 | 6/2010 |
| KR | 10-1020378 B1 | 3/2011 |
| KR | 10-1020455 B1 | 3/2011 |
| TW | 480585 B | 3/2002 |
| TW | 516097 | 1/2003 |
| TW | 518662 | 1/2003 |
| TW | 200301848 A | 7/2003 |
| TW | 094100817 | 8/2005 |
| WO | WO 97/11411 A1 | 3/1997 |
| WO | WO 98/15952 A1 | 4/1998 |
| WO | WO 98/24115 A1 | 6/1998 |
| WO | WO 98/59364 A1 | 12/1998 |
| WO | WO 99/23692 A1 | 5/1999 |
| WO | WO 99/27568 A1 | 6/1999 |
| WO | WO 99/31716 A1 | 6/1999 |
| WO | WO 99/34255 A1 | 7/1999 |
| WO | WO 99/49366 A1 | 9/1999 |
| WO | WO 99/49504 A1 | 9/1999 |
| WO | WO 99/50712 A1 | 10/1999 |
| WO | WO 99/66370 A1 | 12/1999 |
| WO | WO 00/02092 | 1/2000 |
| WO | WO 00/11706 A1 | 3/2000 |

(56) References Cited

FOREIGN PATENT DOCUMENTS

| | | |
|---|---|---|
| WO | WO 00/67303 A1 | 11/2000 |
| WO | WO 01/03170 A1 | 1/2001 |
| WO | WO 01/10137 A1 | 2/2001 |
| WO | WO 01/20733 A1 | 3/2001 |
| WO | WO 01/22480 A1 | 3/2001 |
| WO | WO 01/23935 A1 | 4/2001 |
| WO | WO 01/27978 A1 | 4/2001 |
| WO | WO 01/35451 A1 | 5/2001 |
| WO | WO 01/59502 A1 | 8/2001 |
| WO | WO 01/65296 A1 | 9/2001 |
| WO | WO 01/81977 A2 | 11/2001 |
| WO | WO 02/16993 A1 | 2/2002 |
| WO | WO 02/063664 A1 | 8/2002 |
| WO | WO 02/069049 A2 | 9/2002 |
| WO | WO 02/080185 A1 | 10/2002 |
| WO | WO 02/084720 A2 | 10/2002 |
| WO | WO 02/084850 A1 | 10/2002 |
| WO | WO 02/093209 A2 | 11/2002 |
| WO | WO 02/101804 A1 | 12/2002 |
| WO | WO 03/003429 A1 | 1/2003 |
| WO | WO 03/023832 A1 | 3/2003 |
| WO | WO 03/063212 A1 | 7/2003 |
| WO | WO 03/077036 A1 | 9/2003 |
| WO | WO 03/085708 A1 | 10/2003 |
| WO | WO 2004/051717 A1 | 6/2004 |
| WO | WO 2004/053596 A2 | 6/2004 |
| WO | WO 2004/053950 A1 | 6/2004 |
| WO | WO 2004/053951 A1 | 6/2004 |
| WO | WO2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/071070 A2 | 8/2004 |
| WO | WO 2004/086468 A1 | 10/2004 |
| WO | WO 2004/086470 A1 | 10/2004 |
| WO | WO 2004/090956 A1 | 10/2004 |
| WO | WO 2004/091079 A1 | 10/2004 |
| WO | WO 2004/094940 A1 | 11/2004 |
| WO | WO 2004/104654 A1 | 12/2004 |
| WO | WO 2004/105106 A1 | 12/2004 |
| WO | WO 2004/105107 A1 | 12/2004 |
| WO | WO 2004/107048 A2 | 12/2004 |
| WO | WO 2004/107417 A1 | 12/2004 |
| WO | WO 2004/109780 A1 | 12/2004 |
| WO | WO 2004/114380 A1 | 12/2004 |
| WO | WO 2005/006415 A1 | 1/2005 |
| WO | WO 2005/006418 A1 | 1/2005 |
| WO | WO 2005/008754 A1 | 1/2005 |
| WO | WO 2005/022615 A1 | 3/2005 |
| WO | WO 2005/026843 A2 | 3/2005 |
| WO | WO 2005/027207 A1 | 3/2005 |
| WO | WO 2005/029559 A1 | 3/2005 |
| WO | WO 2005/031467 | 4/2005 |
| WO | WO 2005/036619 A1 | 4/2005 |
| WO | WO 2005/036620 A1 | 4/2005 |
| WO | WO 2005/036622 A1 | 4/2005 |
| WO | WO 2005/036623 A1 | 4/2005 |
| WO | WO 2005/041276 A1 | 5/2005 |
| WO | WO 2005/041277 A1 | 5/2005 |
| WO | WO 2005/048325 A1 | 5/2005 |
| WO | WO 2005/048326 A1 | 5/2005 |
| WO | WO 2005/050718 A1 | 6/2005 |
| WO | WO 2005/057636 A1 | 6/2005 |
| WO | WO 2005/067013 A1 | 7/2005 |
| WO | WO 2005/069081 A2 | 7/2005 |
| WO | WO 2005/071717 A1 | 8/2005 |
| WO | WO 2005/076045 A1 | 8/2005 |
| WO | WO 2005/076321 A1 | 8/2005 |
| WO | WO 2005/076323 A1 | 8/2005 |
| WO | WO 2005/081291 A1 | 9/2005 |
| WO | WO 2005/081292 A1 | 9/2005 |
| WO | WO 2005/104195 A1 | 11/2005 |
| WO | WO 2006/006730 A1 | 1/2006 |
| WO | WO 2006/016551 A1 | 2/2006 |
| WO | WO 2006/019124 A1 | 2/2006 |
| WO | WO 2006/025341 A1 | 3/2006 |
| WO | WO 2006/028188 A1 | 3/2006 |
| WO | WO 2006/030727 A1 | 3/2006 |
| WO | WO 2006/030910 A1 | 3/2006 |
| WO | WO 2006-035775 A1 | 4/2006 |
| WO | WO 2006/049134 A1 | 5/2006 |
| WO | WO 2006/051909 A1 | 5/2006 |
| WO | WO 2006/064851 A1 | 6/2006 |
| WO | WO 2006/068233 A1 | 6/2006 |
| WO | WO 2006/077958 A1 | 7/2006 |
| WO | WO 2006/080285 A1 | 8/2006 |
| WO | WO 2006/085524 A1 | 8/2006 |
| WO | WO 2006/100889 A1 | 9/2006 |
| WO | WO 2006/118108 A1 | 11/2006 |
| WO | WO 2007/003563 A1 | 1/2007 |
| WO | WO 2007/018127 A1 | 2/2007 |
| WO | WO 2007/055120 A1 | 5/2007 |
| WO | WO 2007/055237 A1 | 5/2007 |
| WO | WO 2007/055373 A1 | 5/2007 |
| WO | WO 2007/066692 A1 | 6/2007 |
| WO | WO 2007/066758 A1 | 6/2007 |
| WO | WO 2007/097198 A1 | 8/2007 |
| WO | WO 2007/132862 A1 | 11/2007 |
| WO | WO 2007/141997 A1 | 12/2007 |
| WO | WO 2008/041575 A1 | 4/2008 |
| WO | WO 2008/059748 A1 | 5/2008 |
| WO | WO 2008/061681 A2 | 5/2008 |
| WO | WO 2006/343023 | 6/2008 |
| WO | WO 2008/065977 A1 | 6/2008 |
| WO | WO 2008/074673 A2 | 6/2008 |
| WO | WO 2008/075613 A1 | 6/2008 |
| WO | WO 2008/078688 A1 | 7/2008 |
| WO | WO 2008/090975 A1 | 7/2008 |
| WO | WO 2008/139848 A1 | 11/2008 |
| WO | WO 2009/153925 A1 | 12/2009 |
| WO | WO 2009/157154 A1 | 12/2009 |
| WO | WO 2010/001537 A1 | 1/2010 |

OTHER PUBLICATIONS

Apr. 14, 2010 Notice of Allowance issued in U.S. Appl. No. 11/644,966.
Apr. 15, 2009 Office Action in U.S. Appl. No. 11/902,277.
Apr. 15, 2010 Office Action in U.S. Appl. No. 10/587,254.
Apr. 15, 2010 Office Action issued in Japanese Patent Application No. 2007-251263 (with translation).
Apr. 15, 2011 Office Action in European Patent Application No. 04 817 303.3.
Apr. 16, 2009 Office Action issued in U.S. Appl. No. 12/155,301.
Apr. 2, 2007 European Search Report issued in European Patent Application No. 04724369.6.
Apr. 2, 2013 Office Action issued in Japanese Patent Application No. 2010-290979 (with translation).
Apr. 2, 2013 Translation of Office Action issued in Japanese Patent Application No. 2010-286303.
Apr. 20, 2011 Office Acton in Chinese Patent Application No. 200710110949.7 (with English translation).
Apr. 21, 2010 Office Action in U.S. Appl. No. 12/289,518.
Apr. 22, 2008 Office Action issued in U.S. Appl. No. 11/644,966.
Apr. 22, 2010 Office Action in Japanese Patent Application No. P-2006-553907 (with English translation).
Apr. 22, 2010 Office Action issued in U.S. Appl. No. 12/155,301.
Apr. 24, 2008 Supplemental European Search Report issued in European Patent Application No. 08002882.2.
Apr. 24, 2009 Office Action in Chinese Patent Application No. 2006800006868 (with English translation).
Apr. 24, 2012 Office Action issued in Japanese Patent Application No. 2009-149426 (with translation).
Apr. 25, 2007 Office Action issued in U.S. Appl. No. 11/140,103.
Apr. 25, 2011 Office Action in Korean Patent Application No. 10-2011-7001502 (with English translation).

(56) References Cited

OTHER PUBLICATIONS

Apr. 25, 2011 Office Action in Korean Patent Application No. 10-2010-7008438 (with English translation).
Apr. 26, 2011 Office Action in Chinese Patent Application No. 200710110950.X (with English translation).
Apr. 26, 2011 Office Action in Chinese Patent Application No. 200710110951.4 (with English translation).
Apr. 26, 2011 Office Action in U.S. Appl. No. 11/902,282.
Apr. 26, 2012 Office Action issued in Chinese Patent Application No. 200910126047.1 (with translation).
Apr. 28, 2010 Office Action issued in Chinese Patent Application No. 200710195642.1 (with translation).
Apr. 28, 2011 Office Action in Korean Patent Application No. 10-2006-7012265 (with English translation).
Apr. 28, 2011 Office Action in Korean Patent Application No. 10-2010-7001898 (with English translation).
Apr. 28, 2011 Office Action in Korean Patent Application No. 10-2010-7001907 (with English translation).
Apr. 28, 2011 Office Action in Korean Patent Application No. 10-2009-7023904 (with English translation).
Apr. 3, 2008 Office Action issued in Korean Patent Application No. 10-2006-7008368 (with translation).
Apr. 30, 2012 Office Action issued in Korean Patent Application No. 10-2006-7012265 (with translation).
Apr. 30, 2012 Office Action issued in Korean Patent Application No. 10-2010-7001898 (with translation).
Apr. 30, 2012 Office Action issued in Korean Patent Application No. 10-2010-7001907 (with translation).
Apr. 5, 2011 Office Action in Japanese Patent Application No. P2009-149426 (with English translation).
Apr. 5, 2012 Notice of Allowance issued in U.S. Appl. No. 11/644,966.
Apr. 6, 2011 Office Action in Taiwanese Patent Application No. 093131323 (with English translation).
Apr. 8, 2011 Office Action in Chinese Patent Application No. 200810211496.1 (with English translation).
Apr. 9, 2013 Office Action issued in Korean Patent Application No. 10-2012-7008342 (with translation).
Aug. 10, 2012 Office Action issued in U.S. Appl. No. 13/137,002.
Aug. 11, 2011 Office Action in Korean Patent Application No. 10-2010-7000897 (with English translation).
Aug. 11, 2011 Office Action in Korean Patent Application No. 10-2010-7000893 (with English translation).
Aug. 2, 2010 Notice of Allowance issued in U.S. Appl. No. 11/644,966.
Aug. 20, 2012 Notice of Allowance issued in Taiwanese Patent Application No. 097117881 (with translation).
Aug. 20, 2012 Written Opinion against the Written Answer submitted in Korean Patent Application No. 10-0869390 (with translation).
Aug. 20, 2012 Written Opinion against the Written Answer submitted in Korean Patent Application No. 10-0839686 (with translation).
Aug. 20, 2012 Written Opinion against the Written Answer submitted in Korean Patent Application No. 10-1020455 (with translation).
Aug. 20, 2012 Written Opinion against the Written Answer submitted in Korean Patent Application No. 10-1020378 (with translation).
Aug. 21, 2009 Office Action issued in Chinese Patent Application No. 200810126659.6 (with translation).
Aug. 23, 2010 Office Action in Chinese Application No. 200810211496.1 (with English Translation).
Aug. 3, 2010 Notice of Allowance in Japanese Patent Application No. 2006-553907.
Aug. 3, 2010 Office Action in Japanese Patent Application No. P-2005-515570 (with English translation).
Aug. 3, 2010 Office Action issued in Japanese Patent Application No. 2006-262589 (with translation).
Aug. 3, 2012 Office Action issued in U.S. Appl. No. 13/137,342.
Aug. 31, 2011 Office Action issued in U.S. Appl. No. 12/093,303.
Aug. 4, 2011 Office Action in Taiwanese Patent Application No. 093131767 (with English translation).
Aug. 5, 2009 Office Action issued in Japanese Patent Application No. 2004-570728 (with translation).
Aug. 6, 2012 Office Action issued in U.S. Appl. No. 13/137,004.
Aug. 7, 2009 Office Action issued in Chinese Patent Application No. 2007101956440 (with translation).
Aug. 7, 2012 Office Action issued in U.S. Appl. No. 13/137,003.
Brunner, et al. "High NA Lithographic Imaging at Brewster's Angle." SPIE (U.S.A.), vol. 4691, pp. 1-24, 2002.
Carl Zeiss SMT GmbH—Microsoft Internet Explorer, "Semiconductor Technologies", http://www.zeiss.com.
Halliday, et al., "Fundamental of Physics: Extended, 4/e", Jul. 25, 1995, John Wiley & Sons, Inc. (with partial translation).
Dec. 1, 2009 Office Action in U.S. Appl. No. 11/902,277.
Dec. 12, 2011 Office Action issued in European Patent Application No. 10 174 843.2.
Dec. 12, 2012 Notice of Allowance issued in U.S. Appl. No. 12/289,515.
Dec. 14, 2009 Office Action in U.S. Appl. No. 11/902,282.
Dec. 14, 2010 Office Action issued in Chinese Patent Application No. 200380104450.5 (with translation).
Dec. 14, 2011 Office Action issued in U.S. Appl. No. 11/902,277.
Dec. 15, 2011 Office Action issued in U.S. Appl. No. 12/382,277.
Dec. 18, 2009 Office Action issued in Chinese Patent Application No. 2007101956421 (with translation).
Dec. 18, 2009 Office Action issued in Chinese Patent Application No. 2007101956417 (with translation).
Dec. 18, 2009 Office Action issued in Chinese Patent Application No. 2007101956440 (with translation).
Dec. 18, 2012 Office Action issued in Japanese Patent Application No. 2009-149426 (with translation).
Dec. 26, 2012 Office Action issued in Taiwanese Patent Application No. 097151814 (with translation).
Dec. 26, 2012 Office Action issued in Taiwanese Patent Application No. 097151805 (with translation).
Dec. 27, 2012 Office Action issued in Taiwanese Patent Application No. 095100035 (with translation).
Dec. 27, 2012 Office Action issued in Taiwanese Patent Application No. 097151801 (with translation).
Dec. 3, 2004 Office Action issued in Taiwanese Patent Application No. 092133642 (with translation).
Dec. 3, 2010 Office Action issued in Korean Patent Application No. 10-2008-7029536 (with translation).
Dec. 4, 2007 Office Action issued in U.S. Appl. No. 11/246,642.
Dec. 4, 2009 Office Action issued in Chinese Patent Application No. 2007101109529 (with translation).
Dec. 5, 2012 Office Action issued in Taiwanese Patent Application No. 096138500 (with translation).
Dec. 7, 2010 Extended Search Report in European Patent Application No. 10012876.8.
HECHT, "Optics Fourth Edition", Addison Wesley, 2002.
HECHT, "Optics Second Edition", Addison Wesley, 1974 (with translation).
Feb. 1, 2011 Office Action in Chinese Application No. 200810126659.6 (with English translation).
Feb. 1, 2011 Office Action in Japanese Patent Application No. P-2006-262588 (with English translation).
Feb. 1, 2011 Office Action in Japanese Patent Application No. P-2006-262590 (with English translation).
Feb. 1, 2011 Office Action in Japanese Patent Application No. P-2005-517637 (with English translation).
Feb. 10, 2012 Office Action issued in European Patent Application No. 10 012 876.8.
Feb. 13, 2012 Office Action issued in Taiwanese Patent Application No. 094100817 (with English translation).
Feb. 14, 2008 Office Action issued in U.S. Appl. No. 11/140,103.
Feb. 14, 2012 Office Action issued in Japanese Patent Application No. 2010-003941 (with translation).
Feb. 14, 2012 Office Action issued in Japanese Patent Application No. 2010-003938 (with translation).

(56) References Cited

OTHER PUBLICATIONS

Feb. 15, 2011 Office Action in European Patent Application No. 05 703 646.9.
Feb. 15, 2011 Office Action in U.S. Appl. No. 11/902,277.
Feb. 19, 2013 Office Action issued in Japanese Patent Application No. P2010-087010 (with translation).
Feb. 19, 2013 Office Action issued in Japanese Patent Application No. P2011-138703 (with translation).
Feb. 2, 2007 Office Action issued in Korean Patent Application No. 10-2006-7008368 (with translation).
Feb. 20, 2007 Office Action issued in U.S. Appl. No. 11/246,642.
Feb. 20, 2009 Office Action issued in Japanese Patent Application No. 2005-505207 (with translation).
Feb. 22, 2012 Office Action issued in Chinese Patent Application No. 200910173715.6 (with translation).
Feb. 22, 2013 Written Opinion against the Reference Opinion submitted in Korean Patent Application No. 10-2007-7022489 (with translation).
Feb. 22, 2013 Written Opinion against the Reference Opinion submitted in Korean Patent Application No. 10-2006-7008368 (with translation).
Feb. 22, 2013 Written Opinion against the Reference Opinion submitted in Korean Patent Application No. 10-2008-7019081 (with translation).
Feb. 22, 2013 Written Opinion against the Reference Opinion submitted in Korean Patent Application No. 10-2008-7019082 (with translation).
Feb. 23, 2009 Office Action issued in European Patent Application No. 08002882.2.
Feb. 23, 2010 Office Action in Japanese Patent Application No. P-2006-262589 (with English translation).
Feb. 23, 2010 Office Action in Japanese Patent Application No. P-2005-515570 (with English translation).
Feb. 24, 2011 Office Action in Chinese Patent Application No. 201010128876.6 (with English translation).
Feb. 24, 2011 Office Action in Chinese Patent Application No. 200910173717.5 (with English translation).
Feb. 24, 2013 Office Action issued in Korean Patent Application No. 2012-7034127 (with translation).
Feb. 25, 2010 Extended Search Report in European Patent Application No. 06822564.8.
Feb. 25, 2013 Office Action issued in U.S. Appl. No. 12/382,277.
Feb. 26, 2009 Office Action in U.S. Appl. No. 11/347,421.
Feb. 26, 2009 Office Action in U.S. Appl. No. 11/319,057.
Feb. 27, 2013 Office Action issued in Korean Patent Application No. 10-2012-7034128 (with translation).
Feb. 28, 2011 Office Action in Korean Patent Application No. 10-2010-7008441 (with English translation).
Feb. 28, 2011 Patent Register of Korean Patent No. 10-1020378.
Feb. 28, 2011 Patent Register of Korean Patent No. 10-1020455.
Feb. 28, 2013 Trial Decision issued in Korean Patent No. 10-0839686, Appeal No. 2011Dang301 (with translation).
Feb. 28, 2013 Trial Decision issued in Korean Patent No. 10-0869390, Appeal No. 2011Dang302 (with translation).
Feb. 28, 2013 Trial Decision issued in Korean Patent No. 10-1020455, Appeal No. 2011Dang510 (with translation).
Feb. 28, 2013 Trial Decision issued in Korean Patent No. 10-1020378, Appeal No. 2011Dang511 (with translation).
Feb. 4, 2013 Written Opinion submitted in Korean Patent Application No. 10-0869390, Appeal No. 2011(Dang302) (with translation).
Feb. 4, 2013 Written Opinion submitted in Korean Patent Application No. 10-0839686, Appeal No. 2011(Dang301) (with translation).
Feb. 6, 1996 Office Action issued in Taiwanese Patent Application No. 093109836 (with translation).
Feb. 6, 2007 Written Opinion in International Patent Application No. PCT/JP2006/321607 (with English translation).
Feb. 6, 2013 Written Opinion submitted in Korean Patent Application No. 10-2006-7008368, Appeal No. 2011Dang301, 2011Dang510, and 2011Dang511 (with translation).
Feb. 6, 2013 Written Opinion submitted in Korean Patent Application No. 10-2007-7022489, Appeal No. 2011Dang301, 2011Dang302, and 2011Dang510 (with translation).
Feb. 6, 2013 Written Opinion submitted in Korean Patent Application No. 10-2008-7019081, Appeal No. 2011Dang302, 2011Dang510, and 2011Dang511 (with translation).
Feb. 6, 2013 Written Opinion submitted in Korean Patent Application No. 10-2008-7019082, Appeal No. 2011Dang301, 2011Dang302, and 2011Dang511 (with translation).
Feb. 8, 2011 Notice of Allowance issued in U.S. Appl. No. 11/644,966.
Feb. 8, 2011 Office Action in U.S. Appl. No. 12/320,465.
Feb. 8, 2011 Third Party Submission Information Statement issued in Korean Patent No. 10-0869390 (with English translation).
Feb. 8, 2011 Third Party Submission Information Statement issued in Korean Patent No. 10-0839686 (with English translation).
Feb. 9, 2009 Office Action in U.S. Appl. No. 11/902,282.
Hans-Peter Herzig, "Micro-optics, Elements, Systems and Applications", Taylor & Francis, 1997.
Jan. 11, 2011 Office Action in U.S. Appl. No. 12/461,801.
Jan. 14, 2011 Office Action in U.S. Appl. No. 12/461,852.
Jan. 14, 2011 Office Action in U.S. Appl. No. 12/320,480.
Jan. 14, 2011 Office Action in U.S. Appl. No. 12/320,468.
Jan. 14, 2013 Office Action issued in Chinese Patent Application No. 201010128876.6 (with translation).
Jan. 14, 2013 Office Action issued in Chinese Patent Application No. 200910126047.1 (with translation).
Jan. 16, 2013 Office Action issued in Chinese Patent Application No. 200910173714.1 (with translation).
Jan. 17, 2012 Office Action issued in Japanese Application No. 2006-262589 (with translation).
Jan. 17, 2012 Office Action issued in Japanese Patent Application No. 2005-515570 (with translation).
Jan. 18, 2008 Office Action issued in Chinese Patent Application No. 2003801044505 (with translation).
Jan. 18, 2010 Office Action issued in Korean Patent Application No. 10-2008-701908.1 (with translation).
Jan. 18, 2010 Office Action issued in Korean Patent Application No. 10-2008-7019082 (with translation).
Jan. 18, 2012 Office Action issued in European Patent Application No. 10 174 843.2.
Jan. 18, 2013 Office Action issued in Chinese Patent Application No. 200810211496.1 (with translation).
Jan. 19, 2012 Office Action issued in U.S. Appl. No. 12/458,635.
Jan. 2, 2013 Office Action issued in Korean Patent Application No. 10-2007-7005320 (with translation).
Jan. 24, 2011 Office Action in Korean Patent Application No. 2009-7010158 (with English translation).
Jan. 24, 2011 Office Action in Korean Patent Application No. 2005-7018973 (with English translation).
Jan. 25, 2010 Extended Search Report in European Patent Application No. 09015058.2.
Jan. 25, 2011 Office Action in Korean Patent Application No. 2009-7010159 (with English translation).
Jan. 25, 2012 Office Action issued in U.S. Appl. No. 12/801,043.
Jan. 26, 2011 Office Action in Chinese Patent Application No. 200910173715.6 (with English translation).
Jan. 28, 2010 Extended Search Report in European Patent Application No. 06711853.9.
Jan. 28, 2010 Office Action issued in Japanese Patent Application No. 2008-077129 (with translation).
Jan. 28, 2010 Office Action issued in Japanese Patent Application No. 2005-515005 (with translation).
Jan. 30, 2013 Technical Presentation Document submitted in Invalidation Trial against Korean Patent Application No. 10-2008-7019081, Appeal No. 10-1020455(2011Dang510) (with translation).

(56) References Cited

OTHER PUBLICATIONS

Jan. 30, 2013 Technical Presentation Document submitted in Invalidation Trial against Korean Patent Application No. 10-2008-7019082, Appeal No. 10-1020378(2011Dang511) (with translation).
Jan. 4, 2008 Office Action issued in Korean Patent Application No. 10-2006-7008368 (with translation).
Jan. 4, 2010 Notice of Allowance issued in U.S. Appl. No. 11/644,966.
Jan. 6, 2011 Office Action in U.S. Appl. No. 11/902,282.
Jan. 7, 2010 Office Action in U.S. Appl. No. 12/289,518.
Jan. 7, 2013 Office Action issued in Chinese Patent Application No. 200910173715.6 (with translation).
Jan. 8, 2009 Office Action in U.S. Appl. No. 11/410,952.
Jan. 8, 2010 Office Action issued in Chinese Patent Application No. 2003801044505 (with translation).
Jan. 9, 2013 Technical Presentation Document submitted in Invalidation Trial against Korean Patent Application No. 10-2007-7022489, Appeal No. 839686 (2011Dang301) (with translation).
Jan. 9, 2013 Technical Presentation Document submitted in Invalidation Trial against Korean Patent Application No. 10-2006-7008368, Appeal No. 869390 (2011Dang302) (with translation).
Jul. 12, 2007 Office Action issued in U.S. Appl. No. 11/140,103.
Jul. 12, 2010 Office Action in U.S. Appl. No. 12/461,801.
Jul. 12, 2010 Office Action issued in European Patent Application No. 06 711 853.9.
Jul. 13, 2006 Office Action issued in Taiwanese Patent Application No. 092133642 (with translation).
Jul. 13, 2011 Notice of Allowance in U.S. Appl. No. 11/410,952.
Jul. 14, 2008 Notice of Allowance issued in U.S. Appl. No. 11/246,642.
Jul. 17, 2012 Office Action issued in U.S. Appl. No. 11/902,277.
Jul. 17, 2012 Office Action issued in U.S. Appl. No. 12/382,277.
Jul. 19, 2012 Office Action issued in U.S. Appl. No. 11/902,282.
Jul. 20, 2010 Korean Office Action in Korean Patent Application No. 10-2010-7008438 (with English translation).
Jul. 20, 2010 Korean Office Action in Korean Patent Application No. 10-2010-7008441 (with English translation).
Jul. 20, 2010 Korean Office Action in Korean Patent Application No. 10-2010-7008444 (with English translation).
Jul. 20, 2010 Notice of Allowance in U.S. Appl. No. 12/289,515.
Jul. 20, 2011 Office Action in Taiwanese Patent Application No. 094100817 (with English translation).
Jul. 25, 2008 Office Action issued in Chinese Patent Application No. 200710110949.7 (with translation).
Jul. 25, 2008 Office Action issued in Chinese Patent Application No. 2007101109482 (with translation).
Jul. 25, 2008 Office Action issued in Chinese Patent Application No. 2007101109514 (with translation).
Jul. 25, 2008 Office Action issued in Chinese Patent Application No. 200710110950X (with translation).
Jul. 26, 2011 Office Action in Korean Patent Application No. 10-2006-7018069 (with English translation).
Jul. 27, 2009 Office Action issued in Taiwanese Patent Application No. 092133642 (with translation).
Jul. 3, 2008 Office Action in U.S. Appl. No. 11/319,057.
Jul. 30, 2012 Office Action issued in Korean Patent Application No. 10-2006-7018069 (with translation).
Jul. 5, 2011 Office Action in Chinese Patent Application No. 201010128136.2 (with English translation).
Jul. 8, 2011 Office Action in U.S. Appl. No. 12/318,216.
Jun. 1, 2012 Office Action issued in European Patent Application No. 09 015 058.2.
Jun. 10, 2010 Office Action issued in Chinese Patent Application No. 200810211497.6 (with translation).
Jun. 10, 2011 Office Action in U.S. Appl. No. 12/289,515.
Jun. 11, 2012 Office Action issued in Korean Patent Application No. 10-2012-7003793 (with translation).
Jun. 12, 2008 Patent Register of Korean Patent No. 10-0839686.

Jun. 13, 2008 Office Action issued in Chinese Patent Application No. 2003801044505 (with translation).
Jun. 14, 2010 Office Action issued in Japanese Patent Application No. 2010-006125 (with translation).
Jun. 14, 2011 Office Action in Korean Patent Application No. 10-2011-7006842 (with English translation).
Jun. 15, 2011 Notice of Allowance in U.S. Appl. No. 12/289,518.
Jun. 16, 2010 Office Action in U.S. Appl. No. 11/410,952.
Jun. 20, 2008 Corrected Notice of Allowance issued in U.S. Appl. No. 11/140,103.
Jun. 23, 2011 Office Action in Chinese Patent Application No. 200910173714.1 (with English translation).
Jun. 25, 2008 Office Action in U.S. Appl. No. 11/902,277.
Jun. 25, 2008 Office Action in U.S. Appl. No. 11/902,282.
Jun. 25, 2009 Office Action in U.S. Appl. No. 11/644,966.
Jun. 25, 2010 European Search Report issued in European Patent Application No. 09167707.0.
Jun. 27, 2012 Office Action issued in Korean Patent Application No. 10-2009-7010158 (with translation).
Jun. 28, 2012 Office Action issued in Korean Patent Application No. 10-2012-7008342 (with translation).
Jun. 29, 2007 Office Action issued in Chinese Patent Application No. 2003801044505 (with translation).
Jun. 29, 2012 Office Action issued in Chinese Patent Application No. 200910173714.1 (with translation).
Jun. 4, 2012 Office Action issued in Chinese Patent Application No. 200710110950.X (with translation).
Jun. 5, 2009 Office Action issued in Chinese Patent Application No. 2007101109497 (with translation).
Jun. 5, 2009 Office Action issued in Chinese Patent Application No. 2007101109482 (with translation).
Jun. 5, 2009 Office Action issued in Chinese Patent Application No. 2007101109529 (with translation).
Jun. 5, 2009 Office Action issued in Chinese Patent Application No. 2007101109514 (with translation).
Jun. 5, 2009 Office Action issued in Chinese Patent Application No. 200710110950X (with translation).
Jun. 5, 2009 Office Action issued in Chinese Patent Application No. 2007101956421 (with translation).
Jun. 5, 2009 Office Action issued in Chinese Patent Application No. 2007101956417 (with translation).
Jun. 8, 2012 Office Action issued in Korean Patent Application No. 10-2007-7005320 (with translation).
Jun. 9, 2011 Office Action in U.S. Appl. No. 11/902,277.
Korean Language Dictionary, 5th Edition, Jan. 10, 2002, MinJungseorim, Seoul, Korea (with English translation).
Levinson, Harry J., "Principles of Lithography," Bellingham, WA: SPIE Press, 2001, pp. 205-206.
Himel et al., "Design and fabrication of customized illumination patterns for low k1 lithography : a diffractive approach", Proceedings of SPIE, vol. 4346, pp. 11-1-11-7.
Mar. 17, 2008 Office Action issued in Taiwanese Patent Application No. 092133642 (with translation).
Mar. 19, 2013 Office Action issued in Japanese Patent Application No. 2010-145155 (with translation).
Mar. 20, 2013 Office Action issued in U.S. Appl. No. 11/902,282.
Mar. 21, 2008 Office Action in Chinese Patent Application No. 2004800341246 (with English translation).
Mar. 23, 2011 Notice of Allowance issued in U.S. Appl. No. 12/289,515.
Mar. 23, 2011 Office Action in Chinese Patent Application No. 200910173718.X (with English translation).
Mar. 24, 2011 Office Action issued in Japanese Patent Application No. 2007-251263 (with translation).
Mar. 26, 2010 Office Action in U.S. Appl. No. 11/902,282.
Mar. 26, 2013 Office Action issued in U.S. Appl. No. 11/902,277.
Mar. 27, 2009 Office Action issued in Chinese Patent Application No. 2007101956440 (with translation).
Mar. 29, 2011 Office Action in Japanese Patent Application No. P2007-251263 (with English translation).
Mar. 30, 2012 Office Action issued in U.S. Appl. No. 12/318,216.
Mar. 31, 2009 Office Action issued in European Patent Application No. 04 799 453.8.

(56) References Cited

OTHER PUBLICATIONS

Mar. 31, 2011 Notice of Allowance in U.S. Appl. No. 11/410,952.
Mar. 5, 2013 Office Action issued in Chinese Patent Application No. 200710110949.7 (with translation).
Mar. 5, 2013 Office Action issued in Chinese Patent Application No. 200710110951.4 (with translation).
Mar. 6, 2012 Notice of Allowance issued in U.S. Appl. No. 12/289,515.
Mar. 6, 2012 Office Action issued in Japanese Patent Application No. 2007-544099 (with translation).
Mar. 8, 2010 Office Action issued in Japanese Patent Application No. 2005-505207 (with translation).
Mar. 8, 2011 Office Action in Chinese Patent Application No. 200910173716.0 (with English translation).
Mar. 8, 2012 Office Action issued in Taiwanese Patent Application No. 093131767 (with translation).
Mar. 9, 2011 Third Party Submission Information Statement issued in Korean Patent No. 10-1020455 (with English translation).
Mar. 9, 2011 Third Party Submission Information Statement issued in Korean Patent No. 10-1020378 (with English translation).
May 11, 2011 Office Action in European Patent Application No. 04724369.6.
May 12, 2009 Office Action issued in European Patent Application No. 04 724 369.6.
May 14, 2008 English translation of International Preliminary Report on Patentability in International Patent Application No. PCT/JP2006/321607.
May 17, 2007 Office Action issued in U.S. Appl. No. 11/246,642.
May 21, 2012 Office Action issued in Chinese Patent Application No. 201010128876.6 (with translation).
May 24, 2011 Office Action in U.S. Appl. No. 12/382,277.
May 26, 2010 Office Action issued in European Patent Application No. 07 017 146.7.
May 31, 2010 Translation of Korean Office Action in Korean Patent Application No. 10-2008-7019082.
May 31, 2010 Translation of Korean Office Action in Korean Patent Application No. 10-2008-7019081.
May 31, 2011 Office Action issued in Japanese Patent Application No. 2009-225810 (with translation).
May 4, 2005 Office Action issued in Taiwanese Patent Application No. 092133642 (with translation).
May 4, 2012 Office Action issued in Taiwanese Patent Application No. 096138500 (with translation).
May 5, 2010 Office Action issued in Chinese Patent Application No. 200810126659.6 (with translation).
May 9, 2012 Office Action issued in Chinese Patent Application No. 200810211496.1 (with translation).
Bass, "Handbook of Optics, vol. 1, Fundamental, Techniques, and Design", Second Edition, McGraw-Hill, 1995, 5.22-5.25.
Nov. 10, 2009 Office Action issued in Japanese Patent Application No. 2003-390672 (with translation).
Nov. 10, 2011 Office Action issued in European Patent Application No. 07 017 146.7.
Nov. 12, 2008 Office Action issued in U.S. Appl. No. 11/410,952.
Nov. 12, 2008 Patent Register of Korean Patent No. 10-0869390.
Nov. 12, 2010 Office Action in Chinese Patent Application No. 200710110948.2 (with English translation).
Nov. 12, 2010 Office Action in Chinese Patent Application No. 200910126047.1 (with English translation).
Nov. 13, 2009 Office Action issued in Chinese Patent Application No. 200810211496.1 (with translation).
Nov. 15, 2007 Office Action issued in Korean Patent Application No. 10-2007-7022489 (with translation).
Nov. 15, 2011 Office Action issued in European Patent Application No. 09 167 707.0.
Nov. 15, 2011 Office Action issued in Korean Patent Application No. 10-2009-7010158 (with English translation).
Nov. 15, 2011 Office Action issued in Korean Patent Application No. 10-2009-7010159 (with English translation).
Nov. 17, 2011 Office Action issued in Taiwanese Patent Application No. 096119463 (with English translation).
Nov. 18, 2010 Notice of Allowance issued in U.S. Appl. No. 12/289,515.
Nov. 19, 2010 Office Action issued in Korean Patent Application No. 10-2008-7029535 (with translation).
Nov. 21, 2012 Office Action issued in European Patent Application No. 05703646.9.
Nov. 22, 2011 Office Action issued in Chinese Patent Application No. 200910173718.X (with English translation).
Nov. 25, 2009 Office Action in U.S. Appl. No. 11/410,952.
Nov. 25, 2011 Office Action issued in European Patent Application No. 06 711 853.9.
Nov. 26, 2012 Written Opinion against the Written Answer issued in Korean Patent Application No. 10-1020455, Appeal No. 2011Dang510 (with translation).
Nov. 26, 2012 Written Opinion against the Written Answer issued in Korean Patent Application No. 10-1020378, Appeal No. 2011Dang511 (with translation).
Nov. 28, 2011 Office Action issued in U.S. Appl. No. 12/801,043.
Nov. 29, 2011 Written Rebuttal against the Written Answer filed by the Respondent in Korean Patent Application No. 10-2006-7008368 (with English translation).
Nov. 29, 2011 Written Rebuttal against the Written Answer filed by the Respondent in Korean Patent Application No. 10-2007-7022489 (with English translation).
Nov. 29, 2011 Written Rebuttal against the Written Answer filed by the Respondent in Korean Patent Application No. 10-2008-7019081 (with English translation).
Nov. 29, 2011 Written Rebuttal against the Written Answer filed by the Respondent in Korean Patent Application No. 10-2008-7019082 (with English translation).
Nov. 3, 2010 Office Action in European Patent Application No. 09015058.2.
Nov. 30, 2010 Notice of Allowance in Korean Patent Application No. 10-2008-7019082.
Nov. 30, 2010 Notice of Allowance in Korean Patent Application No. 10-2008-7019081.
Nov. 30, 2010 Notice of Allowance issued in U.S. Appl. No. 12/289,518.
Nov. 30, 2011 Office Action issued in U.S. Appl. No. 11/902,282.
Nov. 6, 2008 Office Action issued in U.S. Appl. No. 12/155,301.
Nov. 6, 2009 Office Action in Chinese Patent Application No. 2008102114957 (with English translation).
Nov. 6, 2012 Written Opinion against the Written Answer issued in Korean Patent Application No. 10-839686, Appeal No. 2011Dang301 (with translation).
Nov. 6, 2012 Written Opinion against the Written Answer issued in Korean Patent Application No. 10-869390, Appeal No. 2011Dang302 (with translation).
Nov. 9, 2009 Office Action issued in Japanese Patent Application No. 2003-402584 (with translation).
Nov. 9, 2012 Office Action issued in U.S. Appl. No. 11/644,966.
Oct. 1, 2008 Supplemental European Search Report issued in European Patent Application No. 04817303.3.
Oct. 10, 2011 Office Action issued in Chinese Patent Application No. 200710110952.9 (with English translation).
Oct. 10, 2012 Office Action issued in Chinese Patent Application No. 200910173717.5 (with translation).
Oct. 12, 2012 Office Action issued in U.S. Appl. No. 12/458,635.
Oct. 13, 2009 European Search Report issued in European Patent Application No. 09167707.0.
Oct. 17, 2012 Notice of Allowance issued in Korean Patent Application No. 10-2010-7001907 (with translation).
Oct. 18, 2007 European Search Report issued in European Patent Application No. 07017146.7.
Oct. 18, 2010 Office Action in U.S. Appl. No. 12/382,277.
Oct. 18, 2011 Office Action issued in Japanese Patent Application No. 2006-262589 (with English translation).
Oct. 18, 2011 Office Action issued in Japanese Patent Application No. 2005-515570 (with English translation).
Oct. 24, 2008 Office Action issued in Chinese Patent Application No. 2007101109529 (with translation).

(56) References Cited

OTHER PUBLICATIONS

Oct. 26, 2004 Office Action issued in Chinese Patent Application No. 200480031414.5 (with translation).
Oct. 26, 2010 Office Action in Japanese Patent Application No. P-2005-517637 (with English translation).
Oct. 26, 2010 Office Action in Japanese Patent Application No. P-2006-262588 (with English translation).
Oct. 26, 2010 Office Action in Japanese Patent Application No. 2006-262590 (with English translation).
Oct. 26, 2012 Office Action issued in Taiwanese Patent Application No. 097117893 (with translation).
Oct. 27, 2010 Office Action issued in Korean Patent Application No. 10-2005-7009937 (with translation).
Oct. 29, 2009 Office Action in U.S. Appl. No. 12/289,515.
Oct. 30, 2012 Office Action issued in Korean Patent Application No. 10-2012-7023534 (with translation).
Oct. 4, 2010 European Search Report in EP 05 70 3646.
Oct. 4, 2010 International Search Report in International Patent Application No. PCT/JP2010/061300.
Oct. 4, 2010 Written Opinion of the International Searching Authority in International Patent Application No. PCT/JP2010/061300.
Oct. 7, 2009 Office Action issued in European Patent Application No. 04 799 453.8.
Oct. 8, 2010 Office Action in Chinese Patent Application No. 200810126659.6 (with English translation).
Oct. 8, 2010 Office Action issued in European Patent Application No. 06822564.8.
Oct. 8, 2012 Office Action issued in Chinese Patent Application No. 200910173716.0 (with translation).
Polarizer, Wikipedia, http://en.wikipedia.org/wiki/Polarizer, Oct. 18, 2011 (11 pp.).
Sep. 1, 2011 Office Action in U.S. Appl. No. 11/902,277.
Sep. 11, 2009 Office Action in Chinese Patent Application No. 2008102114976 (with English translation).
Sep. 11, 2012 Office Action issued in Taiwanese Patent Application No. 097117896 (with translation).
Sep. 13, 2011 Office Action in European Patent Application No. 04 799 453.8.
Sep. 14, 2009 Office Action issued in U.S. Appl. No. 12/155,301.
Sep. 15, 2008 Office Action in U.S. Appl. No. 11/644,966.
Sep. 18, 2012 Office Action issued in Chinese Patent Application No. 200910173718.X (with translation).
Sep. 18, 2012 Office Action issued in Japanese Patent Application No. 2010-094216 (with translation).
Sep. 18, 2012 Office Action issued in Japanese Patent Application No. 2011-144669 (with translation).
Sep. 20, 2010 Notice of Allowance in U.S. Appl. No. 11/410,952.
Sep. 20, 2011 Office Action issued in Japanese Patent Application No. 2009-225810 (with translation).
Sep. 20, 2012 Office Action issued in European Patent Application No. 04 817 303.3.
Sep. 25, 2007 Office Action issued in European Patent Application No. 04 799 453.8.
Sep. 27, 2010 Office Action in U.S. Appl. No. 10/587,254.
Sep. 27, 2011 Office Action issued in Japanese Patent Application No. 2010-003941 (with translation).
Sep. 27, 2011 Office Action issued in Japanese Patent Application No. 2010-003938 (with translation).
Sep. 29, 2010 European Search Report in European Patent Application No. 10174843.2.
Sep. 30, 2011 Office Action in Korean Patent Application No. 10-2005-7018973 (with English translation).
Sep. 4, 2012 Office Action issued in Japanese Patent Application No. 2010-087010 (with translation).
Sep. 6, 2011 Notice of Allowance in U.S. Appl. No. 11/644,966.
Tsuruta, T. "Applied Optics II," Baifukan Co., Ltd., pp. 166-167, Jul. 1990.
Wave Plate, Wikipedia, the free encyclopedia, http://en.wikipedia.org/wiki/Wave_plate, Feb. 7, 2011, pp. 16-1-16-16.
Apr. 23, 2013 Office Action issued in Chinese Patent Application No. 201010128876.6 (with translation).
Jul. 1, 2013 Preparatory Document (1), Patent Invalidation Action 2013HEO3937 issued in Korean Patent Application No. 10-2006-7008368 (with translation).
Jul. 1, 2013 Preparatory Document (1), Patent Invalidation Action 2013HEO3920 issued in Korean Patent Application No. 10-2007-7022489 (with translation).
Jul. 1, 2013 Preparatory Document (1), Patent Invalidation Action 2013HEO3944 issued in Korean Patent Application No. 10-2008-7019081 (with translation).
Jul. 1, 2013 Preparatory Document (1), Patent Invalidation Action 2013HEO3951 issued in Korean Patent Application No. 10-2008-7019082 (with translation).
Jul. 1, 2013 Definition of Technical Terms (with translation).
Doosan Encyclopedia, Optic axis (with translation).
Bass et al., "Handbook of Optics", McGraw-Hill, 1995.
Buhrer, "Four waveplate dual tuner for birefringent filters and multiplexers", Applied Optics vol. 26, No. 17, Sep. 1, 1987, pp. 3628-3632.
Niziev et al., "Influence of Beam Polarization on Laser Cutting Efficiency", Journal of Physics D Applied Physics 32, 1999, pp. 1455-1461.
Bagini et al., "The Simon-Mukunda polarization gadget", Eur. J. Phys. 17, 1996, pp. 279-284.
McGuire Jr., et al., "Analysis of spatial pseudodepolarizers in imaging systems", Optical Engineering, vol. 29 No. 12, 1990, pp. 1478-1484.
May 2, 2013 Office Action issued in Taiwanese Patent Application No. 101102214 (with translation).
May 14, 2013 Office Action issued in Japanese Patent Application No. 2011-130545 (with translation).
Jun. 13, 2013 Search Report issued in European Patent Application No. 13 156 325.6.
May 29, 2013 Office Action issued in European Patent Application No. 04 799 453.8.
May 16, 2013 Office Action issued in Taiwanese Patent Application No. 098115513 (with translation).
Jun. 18, 2013 Search Report issued in European Patent Application No. 13156322.3.
Jun. 21, 2013 Search Report issued in European Patent Application No. 13156324.9.
May 28, 2013 Office Action issued in Japanese Patent Application No. 2011-144669 (with translation).
May 28, 2013 Office Action issued in Japanese Patent Application No. 2010-092416 (with translation).
Jun. 4, 2013 Office Action issued in Chinese Patent Application No. 200710110950.X (with translation).
Jul. 23, 2013 Office Action issued in U.S. Appl. No. 12/458,635.
Jul. 15, 2013 Office Action issued in U.S. Appl. No. 13/067,958.
Jul. 23, 2013 Office Action issued in U.S. Appl. No. 11/410,952.
Jul. 15, 2013 Office Action issued in Chinese Patent Application No. 200910173718.X (with translation).
Jul. 22, 2013 Notice of Allowance issued in U.S. Appl. No. 12/289,515.
Aug. 1, 2013 Office Action issued in U.S. Appl. No. 12/318,216.
Aug. 6, 2013 Office Action issued in U.S. Appl. No. 13/889,798.
Sep. 11, 2013 Office Action issued in U.S. Appl. No. 13/890,603.
Aug. 23, 2013 Reply Brief, Patent Invalidation Action 2013HEO3975 issued in Korean Patent Application No. 10-2007-7022489 (with translation).
Aug. 23, 2013 Reply Brief, Patent Invalidation Action 2013HEO3982 issued in Korean Patent Application No. 10-2008-7019081 (with translation).
Apr. 17, 2013 Office Action issued in Korean Patent Application No. 10-2013-7002721 (with translation).
Apr. 3, 2013 Office Action issued in Chinese Patent Application No. 200910173717.5 (with translation).
May 7, 2013 Office Action issued in European Patent Application No. 04817303.3.
Apr. 3, 2013 Office Action issued in Chinese Patent Application No. 200910173716.0 (with translation).

(56) References Cited

OTHER PUBLICATIONS

Apr. 18, 2013 Office Action issued in Korean Patent Application No. 10-2012-7003793 (with translation.
Apr. 4, 2014 Office Action issued in Chinese Patent Application No. 200910173718.X (with translation).
Apr. 16, 2014 Office Action issued in U.S. Appl. No. 12/458,635.
Apr. 23, 2014 Submission Document, Patent Invalidation Action No. 2013HEO3920, issued in Korean Patent Application No. 10-2007-7022489 (with translation).
Apr. 23, 2014 Submission Document, Patent Invalidation Action No. 2013HEO3937, issued in Korean Patent Application No. 10-2006-7008368 (with translation).
Apr. 23, 2014 Submission Document, Patent Invalidation Action No. 2013HEO3944, issued in Korean Patent Application No. 10-2008-7019081 (with translation).
Apr. 23, 2014 Submission Document, Patent Invalidation Action No. 2013HEO3951, issued in Korean Patent Application No. 10-2008-7019082 (with translation).
Apr. 23, 2014 Submission Document, Patent Invalidation Action No. 2013HEO3975, issued in Korean Patent Application No. 10-2007-7022489 (with translation).
Apr. 23, 2014 Submission Document, Patent Invalidation Action No. 2013HEO3982, issued in Korean Patent Application No. 10-2008-7019081 (with translation).
Apr. 29, 2014 Office Action issued in European Patent Application No. 13156325.6.
Apr. 29, 2014 Office Action issued in European Patent Application No. 13156324.9.
Apr. 29, 2014 Office Action issued in European Patent Application No. 13156322.3.
Oct. 10, 2013 Office Action issued in U.S. Appl. No. 13/890,547.
Oct. 15, 2013 Office Action issued in U.S. Appl. No. 13/889,965.
Oct. 15, 2013 Office Action issued in U.S. Appl. No. 13/137,342.
Oct. 16, 2013 Office Action issued in U.S. Appl. No. 13/137,003.
Oct. 17, 2013 Notice of Allowance issued in Korean Patent Application No. 2012-7008342 (with English translation).
Oct. 21, 2013 Office Action issued in U.S. Appl. No. 13/137,002.
Oct. 29, 2013 Office Action issued in U.S. Appl. No. 13/890,142.
Oct. 17, 2013 Notice of Allowance issued in U.S. Appl. No. 11/902,277.
Oct. 18, 2013 Office Action issued in U.S. Appl. No. 11/902,282.
Oct. 29, 2013 Office Action issued in U.S. Appl. No. 13/890,547.
Nov. 5, 2013 Office Action issued in Japanese Patent Application No. 2012-080675 (with English translation).
Nov. 5, 2013 Office Action issued in Japanese Patent Application No. 2012-080678 (with English translation).
Nov. 7, 2013 Office Action issued in U.S. Appl. No. 12/289,518.
Nov. 8, 2013 Office Action issued in U.S. Appl. No. 13/912,832.
Nov. 13, 2013 Office Action issued in U.S. Appl. No. 13/889,965.
Jan. 23, 2014 Reference Document, Patent Invalidation Action 2013HEO3920 issued in Korean Patent Application No. 10-2007-7022489 (with translation).
Jan. 23, 2014 Reference Document, Patent Invalidation Action 2013HEO3937 issued in Korean Patent Application No. 10-2006-7008368 (with translation).
Jan. 23, 2014 Reference Document, Patent Invalidation Action 2013HEO3944 issued in Korean Patent Application No. 10-2008-7019081 (with translation).
Jan. 23, 2014 Reference Document, Patent Invalidation Action 2013HEO3951 issued in Korean Patent Application No. 10-2008-7019082 (with translation).
Jan. 23, 2014 Reference Document, Patent Invalidation Action 2013HEO3975 issued in Korean Patent Application No. 10-2007-7022489 (with translation).
Jan. 23, 2014 Reference Document, Patent Invalidation Action 2013HEO3982 issued in Korean Patent Application No. 10-2008-7019081 (with translation).
Dec. 4, 2013 Office Action issued in Chinese Patent Application No. 200710110950.X (with English translation).
Dec. 17, 2013 Office Action issued in Korean Patent Application No. 10-2013-7026632 (with English translation).
Dec. 18, 2013 Office Action issued in Korean Patent Application No. 10-2012-7034127 (with English translation).
Mar. 14, 2014 Office Action issued in U.S. Appl. No. 13/889,798.
Nov. 20, 2013 Office Action issued in U.S. Appl. No. 12/289,515.
Oct. 22, 2013, H.G.Oh, "Notarial Certificate of affiant Professor H.G.Oh" (with English translation).
Oct. 8, 2013, "Declaration of Dr. Michael Totzeck" (with English translation).
"Korean Patent Office Guidelines for Examination," 2010 (with partial translation).
Oct. 25, 2013 Preparatory Document (2-1), Korean Invalidation Action 2013HEO03937 (with English translation).
Oct. 25, 2013 Preparatory Document (2-2), Korean Invalidation Action 2013HEO03937 (with English translation).
Dec. 13, 2013 Office Action issued in European Patent Application No. 09015058.2.
Sep. 10, 2014 Office Action issued in U.S. Appl. No. 13/890,547.
Oct. 21, 2014 Office Action issued in Japanese Application No. 2013-272100.
Dec. 2, 2014 Office Action issued in Japanese Application No. 2013-272068.
Nov. 5, 2014 Office Action issued in Chinese Application No. 200910126047.1.
Jun. 5, 2014 Office Action issued in U.S. Appl. No. 13/890,603.
Dec. 10, 2014 Office Action issued in U.S. Appl. No. 12/289,518.
Feb. 5, 2014 Office Action issued in U.S. Appl. No. 12/382,277.
Feb. 6, 2014 Office Action issued in U.S. Appl. No. 13/890,142.
Feb. 6, 2014 Office Action issued in U.S. Appl. No. 13/890,547.
Decision Rendered by Division II of Korean Patent Court dated May 15, 2014 for KR patent invalidation Action 2013HEO3920 (with translation).
Decision Rendered by Division II of Korean Patent Court dated May 15, 2014 for KR patent invalidation Action 2013HEO3937 (with translation).
Decision Rendered by Division IIK of Korean Patent Court dated May 15, 2014 for KR patent invalidation Action 2013HEO03944 (with translation).
Decision Rendered by Division II of Korean Patent Court dated May 15, 2014 for KR patent invalidation Action 2013HEO3951 (with translation).
Decision Rendered by Division II of Korean Patent Court dated May 15, 2014 for KR patent invalidation Action 2013HEO3975 (with translation).
Decision Rendered by Division II of Korean Patent Court dated May 15, 2014 for KR patent invalidation Action 2013HEO3982 (with translation).
Jun. 24, 2014 Office Action issued in European Patent Application No. 04817303.3.
Jun. 26, 2014 Search Report issued in European Patent Application No. 13165334.7.
Jun. 26, 2014 Search Report issued in European Patent Application No. 13165335.4.
Jun. 26, 2014 Search Report issued in European Patent Application No. 13165338.8.
Jun. 26, 2014 Search Report issued in European Patent Application No. 13165340.4.
Jul. 16, 2014 Office Action issued in U.S. Appl. No. 12/289,515.
Jun. 27, 2014 Office Action issued in U.S. Appl. No. 13/912,832.
Aug. 28, 2014 Office Action issued in Korean Patent Application No. 10-2012-7034128 (with English translation).
Aug. 6, 2014 Office Action issued in U.S. Appl. No. 13/137,342.
Aug. 6, 2014 Office Action issued in U.S. Appl. No. 13/137,003.
Aug. 6, 2014 Office Action issued in U.S. Appl. No. 13/137,002.
Sep. 11, 2014 Office Action issued in U.S. Appl. No. 12/382,277.
Sep. 12, 2014 Office Action issued in U.S. Appl. No. 13/890,142.
Jun. 13, 2014 Office Action issued in Taiwanese Patent Application No. 101133189 (with translation).
Jun. 13, 2014 Office Action issued in Taiwanese Patent Application No. 101141665 (with translation).
Aug. 11, 2014 Office Action issued in Taiwanese Patent Application No. 101102214 (with translation).

(56) References Cited

OTHER PUBLICATIONS

Aug. 6, 2014 Office Action issued in U.S. Appl. No. 13/889,965.
Jun. 6, 2014 Office Action issued in Taiwanese Patent Application No. 101103772 (with translation).
Jun. 3, 2014 Office Action issued in Japanese Patent Application No. P2013-157042 (with English translation).
Jun. 3, 2014 Office Action issued in Japanese Patent Application No. P2013-157044 (with English translation).
Mar. 24, 2015 Office Action issued in Japanese Patent Application No. P2014-087750.
Jun. 23, 2015 Office Action issued in Japanese Application No. 2014-158994.
Dec. 13, 2013 The Second Division of Korean Patent Court, Preparatory Document (3), Re: Patent Invalidation Action 2013HEO3920.
Oct. 30, 2013 The Second Division of Korean Patent Court, Preparatory Document (2), Re: Patent Invalidation Action 2013HEO3920.
Dec. 13, 2013 The Second Division of Korean Patent Court, Preparatory Document (3), Re: Patent Invalidation Action 2013HEO3937.
Dec. 13, 2013 The Second Division of Korean Patent Court, Preparatory Document (3), Re: Patent Invalidation Action 2013HEO3944.
Oct. 30, 2013 The Second Division of Korean Patent Court, Preparatory Document (2), Re: Patent Invalidation Action 2013HEO3944.
Dec. 13, 2013 The Second Division of Korean Patent Court, Preparatory Document (3), Re: Patent Invalidation Action 2013HEO3951.
Oct. 30, 2013 The Second Division of Korean Patent Court, Preparatory Document (2), Re: Patent Invalidation Action 2013HEO3951.
Jan. 14, 2014 The Second Division of Korean Patent Court, Reference Document, Re: Patent Invalidation Action 2013HEO3975.
Feb. 2, 2015 Office Action issued in U.S. Appl. No. 13/912,832.
Feb. 5, 2015 Office Action issued in U.S. Appl. No. 12/289,515.
Feb. 10, 2015 Office Action issued in Korean Patent Application No. 10-2014-7003559.
Feb. 11, 2015 Office Action issued in Korean Patent Application No. 10-2010-7008441.
Apr. 6, 2015 Office Action issued in U.S. Appl. No. 14/048,563.
Apr. 21, 2015 Office Action issued in U.S. Appl. No. 13/890,547.
Apr. 24, 2015 Office Action issued in U.S. Appl. No. 13/890,142.
Apr. 27, 2015 Office Action issued in Korean Patent Application No. 10-2014-7009172.
Jan. 6, 2014 Office Action issued in Chinese Application No. 200910173717.5.
Oct. 6, 2015 Office Action issued in Japanese Patent Application No. JP2014-256977.
Oct. 8, 2015 Office Action issued in Korean Patent Application No. 10-2010-7008441.
Oct. 22, 2015 Office Action issued in U.S. Appl. No. 14/713,428.
Oct. 22, 2015 Office Action issued in U.S. Appl. No. 14/048,563.
Nov. 16, 2015 Office Action issued in Korean Patent Application No. 10-2014-7003559.
Sep. 28, 2016 Office Action issued in Korean Patent Application No. 10-2015-7022796.
Oct. 3, 2016 Office Action issued in Korean Patent Application No. 10-2014-7036570.
Oct. 11, 2016 Office Action issued in Korean Patent Application No. 10-2015-7005285.
Nov. 29, 2016 Office Action issued in Japanese Patent Application No. 2016-043787.
Jul. 16, 2015 Office Action issued in U.S. Appl. No. 13/912,832.
Jul. 20, 2015 Notice of Allowance issued in U.S. Appl. No. 13/067,958.
Jul. 15, 2015 Office Action issued in U.S. Appl. No. 12/289,515.
Dec. 1, 2015 Office Action issued in Korean Patent Application No. 10-2014-7036570.
Jan. 5, 2016 Office Action issued in Japanese Patent Application No. 2015-018675.
Dec. 30, 2015 Office Action issued in Taiwanese Patent Application No. 102142028.
Jan. 21, 2016 Advisory Action issued in U.S. Appl. No. 12/289,515.
Jan. 29, 2016 Advisory Action issued in U.S. Appl. No. 13/912,832.
Jan. 12, 2016 Office Action issued in Taiwanese Application No. 103116064.
Mar. 23, 2016 Office Action issued in U.S. Appl. No. 13/890,142.
Mar. 24, 2016 Office Action issued in U.S. Appl. No. 13/890,547.
Jan. 27, 2016 Office Action issued in Taiwanese Patent Application No. 103116066.
Feb. 1, 2016 Office Action issued in Korean Patent Application No. 10-2015-7005285.
May 17, 2016 Office Action issued in U.S. Appl. No. 14/713,385.
May 24, 2016 Office Action issued in Japanese Patent Application No. 2015-165058.
Jun. 14, 2016 Office Action issued in Japanese Patent Application No. 2014-256977.
Sep. 6, 2016 Office Action issued in Japanese Patent Application No. 2015-238871.
Aug. 4, 2015 Office Action issued in Japanese Patent Application No. 2014-197119.
Aug. 4, 2015 Office Action issued in Japanese Patent Application No. 2014-216961.
Aug. 4, 2015 Office Action issued in Japanese Patent Application No. 2014-216964.
Mar. 16, 2017 Office Action issued in Taiwanese Patent Application No. 105123963.
Apr. 25, 2017 Office Action issued in Japanese Patent Application No. 2016-145649.

\* cited by examiner

POLARIZATION-MODULATING ELEMENT, ILLUMINATION OPTICAL APPARATUS, EXPOSURE APPARATUS, AND EXPOSURE METHOD

CROSS-REFERENCE TO RELATED APPLICATIONS

This is a Continuation of application Ser. No. 13/067,958 filed Jul. 11, 2011, which is a Continuation of application Ser. No. 12/461,801 filed Aug. 25, 2009 (abandoned), which is Continuation of application Ser. No. 11/347,421 filed Feb. 6, 2006 (abandoned), which is a Continuation-In-Part of Application No. PCT/JP2005/000407 filed on Jan. 14, 2005, which claims priority to Japanese Application Nos. 2004-030555 filed Feb. 6, 2004 and 2004-358218 filed Dec. 12, 2004. The disclosures of the prior applications are hereby incorporated herein by reference in their entireties.

BACKGROUND OF THE INVENTION

Field of the Invention

The present invention relates to a polarization-modulating element, illumination optical apparatus, exposure apparatus, and exposure method and, more particularly, to an exposure apparatus for production of microdevices such as semiconductor elements, image pickup elements, liquid crystal display elements, and thin-film magnetic heads by lithography.

Related Background Art

In the typical exposure apparatus of this type, a beam emitted from a light source travels through a fly's eye lens as an optical integrator to form a secondary light source as a substantial surface illuminant consisting of a number of light sources. Beams from the secondary light source (generally, an illumination pupil distribution formed on or near an illumination pupil of the illumination optical apparatus) are limited through an aperture stop disposed near the rear focal plane of the fly's eye lens and then enter a condenser lens.

The beams condensed by the condenser lens superposedly illuminate a mask on which a predetermined pattern is formed. The light passing through the pattern of the mask is focused on a wafer through a projection optical system. In this manner, the mask pattern is projected for exposure (or transcribed) onto the wafer. The pattern formed on the mask is a highly integrated pattern, and, in order to accurately transcribe this fine pattern onto the wafer, it is indispensable to obtain a uniform illuminance distribution on the wafer.

For example, Japanese Patent No. 3246615 owned by the same Applicant of the present application discloses the following technology for realizing the illumination condition suitable for faithful transcription of the fine pattern in arbitrary directions: the secondary light source is formed in an annular shape on the rear focal plane of the fly's eye lens and the beams passing the secondary light source of the annular shape are set to be in a linearly polarized state with a direction of polarization along the circumferential direction thereof (hereinafter referred to as a "azimuthal polarization state").

SUMMARY OF THE INVENTION

An object of the embodiment is to transform incident light in a linearly polarized state having a direction of polarization virtually along a single direction, into light in a azimuthal polarization state having a direction of polarization virtually along a circumferential direction, while suppressing the loss of light quantity.

Another object of the embodiment is to form an illumination pupil distribution of an annular shape in a azimuthal polarization state while well suppressing the loss of light quantity, using a polarization-modulating element capable of transforming incident light in a linearly polarized state having a direction of polarization virtually along a single direction, into light in a azimuthal polarization state having a direction of polarization virtually along a circumferential direction.

Another object of the embodiment is to transcribe a fine pattern under an appropriate illumination condition faithfully and with high throughput, using an illumination optical apparatus capable of forming an illumination pupil distribution of an annular shape in a azimuthal polarization state while well suppressing the loss of light quantity.

In order to achieve the above objects, a first aspect of the embodiment is to provide a polarization-modulating element for modulating a polarization state of incident light into a predetermined polarization state, the polarization-modulating element being made of an optical material with optical activity and having a circumferentially varying thickness profile.

A second aspect of the embodiment is to provide an illumination optical apparatus comprising a light source for supplying illumination light, and the polarization-modulating element of the first aspect disposed in an optical path between the light source and a surface to be illuminated.

A third aspect of the embodiment is to provide an illumination optical apparatus for illuminating a surface to be illuminated, based on illumination light supplied from a light source, the illumination optical apparatus satisfying the following relations:

$$RSP_h(Ave) > 70\%, \text{ and } RSP_v(Ave) > 70\%,$$

where $RSP_h(Ave)$ is an average specific polarization rate about polarization in a first direction in a predetermined effective light source region in a light intensity distribution formed in an illumination pupil plane of the illumination optical apparatus or in a plane conjugate with the illumination pupil plane, and $RSP_v(Ave)$ is an average specific polarization rate about polarization in a second direction in the predetermined effective light source region.

The average specific polarization rates above are defined as follows:

$$RSP_h(Ave) = Ix(Ave)/(Ix+Iy)Ave$$

$$RSP_v(Ave) = Iy(Ave)/(Ix+Iy)Ave.$$

In the above equations, Ix(Ave) represents an average intensity of a polarization component in the first direction in a bundle of rays passing through the predetermined effective light source region and arriving at a point on an image plane, Iy(Ave) an average intensity of a polarization component in the second direction in a bundle of rays passing through the predetermined effective light source region and arriving at a point on the image plane, and (Ix+Iy)Ave an average intensity of an entire beam passing through the predetermined effective light source region. The illumination pupil plane of the illumination optical apparatus can be defined as a plane in the optical relation of Fourier transform with the surface to be illuminated and, where the illumination optical apparatus is combined with a projection optical system, it can be defined as a plane in the illumination optical apparatus optically conjugate with an aperture stop of the projection optical system. The plane conjugate with the illumination pupil plane of the illumination optical apparatus is not limited to a plane in the illumination optical apparatus, but, for example, in a case where the illumination optical apparatus is combined with a projection optical system, it may be a plane in the projection optical system, or may be a plane in a polarization measuring device for measuring a polarization state in the illumination optical apparatus (or in the projection exposure apparatus).

A fourth aspect of the embodiment is to provide an exposure apparatus comprising the illumination optical apparatus of the second aspect or the third aspect, the exposure apparatus projecting a pattern onto a photosensitive substrate through the illumination optical apparatus.

A fifth aspect of the embodiment is to provide an exposure method of projecting a pattern onto a photosensitive substrate, using the illumination optical apparatus of the second aspect or the third aspect.

A sixth aspect of the embodiment is to provide a production method of a polarization-modulating element for modulating a polarization state of incident light into a predetermined polarization state, comprising:

a step of preparing an optical material with optical activity; and a step of providing the optical material with a circumferentially varying thickness profile.

The polarization-modulating element of the embodiment is made of the optical material with optical activity, for example, like crystalline quartz, and has the circumferentially varying thickness profile. The thickness profile herein is set, for example, so that light in a linearly polarized state having a direction of polarization virtually along a single direction is transformed into light in a azimuthal polarization state having a direction of polarization virtually along the circumferential direction. In consequence, the embodiment realizes the polarization-modulating element capable of transforming the incident light in the linearly polarized state having the direction of polarization virtually along a single direction, into light in the azimuthal polarization state having the direction of polarization virtually along the circumferential direction, while suppressing the loss of light quantity. Particularly, since the polarization-modulating element is made of the optical material with optical activity, the invention has the advantage that the polarization-modulating element is extremely easy to produce, for example, as compared with wave plates.

Therefore, since the illumination optical apparatus of the embodiment uses the polarization-modulating element capable of transforming the incident light in the linearly polarized state having the direction of polarization virtually along a single direction, into the light in the azimuthal polarization state having the direction of polarization virtually along the circumferential direction, it is able to form an illumination pupil distribution of an annular shape in the azimuthal polarization state while well suppressing the loss of light quantity. Since the exposure apparatus and exposure method of the embodiment use the illumination optical apparatus capable of forming the illumination pupil distribution of the annular shape in the azimuthal polarization state while well suppressing the loss of light quantity, they are able to transcribe a fine pattern under an appropriate illumination condition faithfully and with high throughput and, eventually, to produce good devices with high throughput.

The embodiment will be more fully understood from the detailed description given hereinbelow and the accompanying drawings, which are given by way of illustration only and are not to be considered as limiting the embodiment.

Further scope of applicability of the embodiment will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Embodiments of the present invention will be described based on the accompanying drawings.

Figure 1:
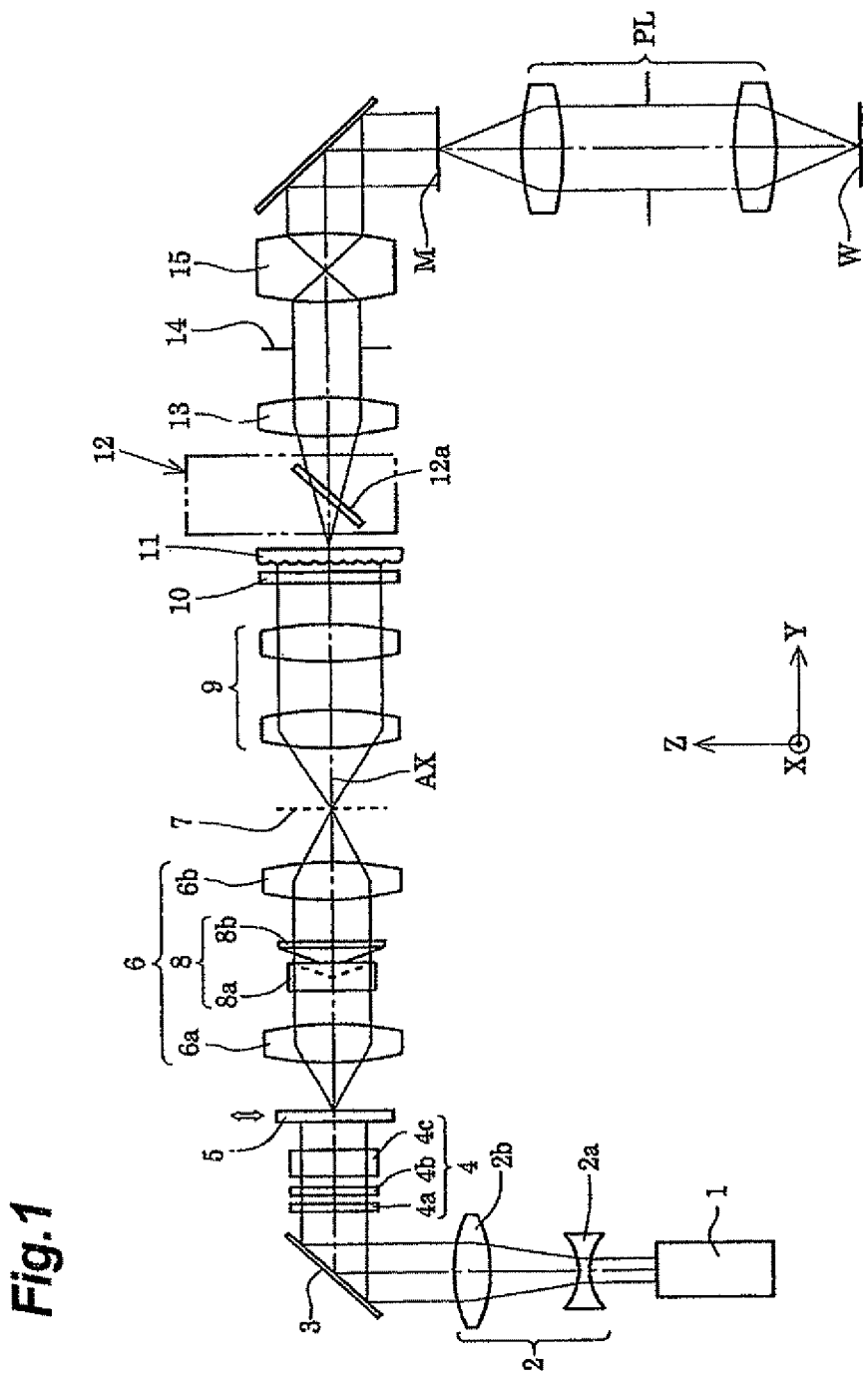
FIG. 1 is an illustration schematically showing a configuration of an exposure apparatus according to an embodiment of the present invention.

FIG. 1 is an illustration schematically showing a configuration of an exposure apparatus according to an embodiment of the present invention. In FIG. 1, the Z-axis is defined along a direction of a normal to a wafer W being a photosensitive substrate, the Y-axis along a direction parallel to the plane of FIG. 1 in the plane of the wafer W, and the X-axis along a direction of a normal to the plane of FIG. 1 in the plane of wafer W. With reference to FIG. 1, the exposure apparatus of the present embodiment is provided with a light source 1 for supplying exposure radiation (light) [(illumination light)].

The light source 1 can be, for example, a KrF excimer laser light source for supplying light with the wavelength of 248 nm, an ArF excimer laser light source for supplying light with the wavelength of 193 nm, or the like. A nearly parallel beam emitted along the Z-direction from the light source 1 has a cross section of a rectangular shape elongated along the X-direction, and is incident to a beam expander 2 consisting of a pair of lenses 2a and 2b. The lenses 2a and 2b have a negative refracting power and a positive refracting power, respectively, in the plane of FIG. 1 (or in the YZ plane). Therefore, the beam incident to the beam expander 2 is enlarged in the plane of FIG. 1 and shaped into a beam having a cross section of a predetermined rectangular shape.

The nearly parallel beam passing through the beam expander 2 as a beam shaping optical system is deflected into the Y-direction by a bending mirror 3, and then travels through a quarter wave plate 4a, a half wave plate 4b, a depolarizer (depolarizing element) 4c, and a diffractive optical element 5 for annular illumination to enter an afocal lens 6. Here the quarter wave plate 4a, half wave plate 4b, and depolarizer 4c constitute a polarization state converter 4, as described later. The afocal lens 6 is an afocal system (afocal optic) set so that the front focal position thereof approximately coincides with the position of the diffractive optical element 5 and so that the rear focal position thereof approximately coincides with the position of a predetermined plane 7 indicated by a dashed line in the drawing.

In general, a diffractive optical element is constructed by forming level differences with the pitch of approximately the wavelength of exposure light (illumination light) in a substrate and has the action of diffracting an incident beam at desired angles. Specifically, the diffractive optical element 5 for annular illumination has the following function: when a parallel beam having a rectangular cross section is incident thereto, it forms a light intensity distribution of an annular shape in its far field (or Fraunhofer diffraction region).

Therefore, the nearly parallel beam incident to the diffractive optical element 5 as a beam transforming element forms a light intensity distribution of an annular shape on the pupil plane of the afocal lens 6 and then emerges as a nearly parallel beam from the afocal lens 6. In an optical path between front lens unit 6a and rear lens unit 6b of the afocal lens 6 there is a conical axicon system 8 arranged on or near the pupil plane thereof, and the detailed configuration and action thereof will be described later. For easier description, the fundamental configuration and action will be described below, in disregard of the action of the conical axicon system 8.

The beam through the afocal lens 6 travels through a zoom lens 9 for variation of σ-value and a polarization-modulating element 10 and then enters a micro fly's eye lens (or fly's eye lens) 11 as an optical integrator. The configuration and action of the polarization-modulating element 10 will be described later. The micro fly's eye lens 11 is an optical element consisting of a number of micro lenses with a positive refracting power arranged lengthwise and breadthwise and densely. In general, a micro fly's eye lens is constructed, for example, by forming a micro lens group by etching of a plane-parallel plate.

Here each micro lens forming the micro fly's eye lens is much smaller than each lens element forming a fly's eye lens. The micro fly's eye lens is different from the fly's eye lens consisting of lens elements spaced from each other, in that a number of micro lenses (micro refracting surfaces) are integrally formed without being separated from each other. In the sense that lens elements with a positive refracting power are arranged lengthwise and breadthwise, however, the micro fly's eye lens is a wavefront splitting optical integrator of the same type as the fly's eye lens. Detailed explanation concerning the micro fly's eye lens capable of being used in the present invention is disclosed, for example, in U.S. Pat. No. 6,913,373(B2) which is incorporated herein by reference in its entirety.

The position of the predetermined plane 7 is arranged near the front focal position of the zoom lens 9, and the entrance surface of the micro fly's eye lens 11 is arranged near the rear focal position of the zoom lens 9. In other words, the zoom lens 9 arranges the predetermined plane 7 and the entrance surface of the micro fly's eye lens 11 substantially in the relation of Fourier transform and eventually arranges the pupil plane of the afocal lens 6 and the entrance surface of the micro fly's eye lens 11 approximately optically conjugate with each other.

Accordingly, for example, an illumination field of an annular shape centered around the optical axis AX is formed on the entrance surface of the micro fly's eye lens 11, as on the pupil plane of the afocal lens 6. The entire shape of this annular illumination field similarly varies depending upon the focal length of the zoom lens 9. Each micro lens forming the micro fly's eye lens 11 has a rectangular cross section similar to a shape of an illumination field to be formed on a mask M (eventually, a shape of an exposure region to be formed on a wafer W).

The beam incident to the micro fly's eye lens 11 is two-dimensionally split by a number of micro lenses to form on or near the rear focal plane (eventually on the illumination pupil) a secondary light source having much the same light intensity distribution as the illumination field formed by the incident beam, i.e., a secondary light source consisting of a substantial surface illuminant of an annular shape centered around the optical axis AX. Beams from the secondary light source formed on or near the rear focal plane of the micro fly's eye lens 11 travel through beam splitter 12a and condenser optical system 13 to superposedly illuminate a mask blind 14.

In this manner, an illumination field of a rectangular shape according to the shape and focal length of each micro lens forming the micro fly's eye lens 11 is formed on the mask blind 14 as an illumination field stop. The internal configuration and action of polarization monitor 12 incorporating a beam splitter 12a will be described later. Beams through a rectangular aperture (light transmitting portion) of the mask blind 14 are subject to light condensing action of imaging optical system 15 and thereafter superposedly illuminate the mask M on which a predetermined pattern is formed.

Namely, the imaging optical system 15 forms an image of the rectangular aperture of the mask blind 14 on the mask M. A beam passing through the pattern of mask M travels through a projection optical system PL to form an image of the mask pattern on the wafer W being a photosensitive substrate. In this manner, the pattern of the mask M is sequentially printed in each exposure area on the wafer W through full-wafer exposure or scan exposure with two-dimensional drive control of the wafer W in the plane (XY plane) perpendicular to the optical axis AX of the projection optical system PL.

In the polarization state converter 4, the quarter wave plate 4a is arranged so that its crystallographic axis is rotatable around the optical axis AX, and it transforms incident light of elliptical polarization into light of linear polarization. The half wave plate 4b is arranged so that its crystallographic axis is rotatable around the optical axis AX, and it changes the plane of polarization of linearly polarized light incident thereto. The depolarizes 4c is composed of a wedge-shaped crystalline quartz prism and a wedge-shaped fused silica prism having complementary shapes. The crystalline quartz prism and the fused silica prism are constructed as an integral prism assembly so as to be set into and away from the illumination optical path.

Where the light source 1 is the KrF excimer laser light source or the ArF excimer laser light source, light emitted from these light sources typically has the degree of polarization of 95% or more and light of almost linear polarization is incident to the quarter wave plate 4a. However, if a right-angle prism as a back-surface reflector is interposed in the optical path between the light source 1 and the polarization state converter 4, the linearly polarized light will be changed into elliptically polarized light by virtue of total reflection in the right-angle prism unless the plane of polarization of the incident, linearly polarized light agrees with the P-polarization plane or S-polarization plane.

In the case of the polarization state converter 4, for example, even if light of elliptical polarization is incident thereto because of the total reflection in the right-angle prism, light of linear polarization transformed by the action of the quarter wave plate 4a will be incident to the half wave plate 4b. Where the crystallographic axis of the half wave plate 4b is set at an angle of 0° or 90° relative to the plane of polarization of the incident, linearly polarized light, the light of linear polarization incident to the half wave plate 4b will pass as it is, without change in the plane of polarization.

Where the crystallographic axis of the half wave plate 4b is set at an angle of 45° relative to the plane of polarization of the incident, linearly polarized light, the light of linear polarization incident to the half wave plate 4b will be transformed into light of linear polarization with change of polarization plane of 90°. Furthermore, where the crystallographic axis of the crystalline quartz prism in the depolarizer 4c is set at an angle of 45° relative to the polarization plane of the incident, linearly polarized light, the light of linear polarization incident to the crystalline quartz prism will be transformed (or depolarized) into light in an unpolarized state.

The polarization state converter 4 is arranged as follows: when the depolarizer 4c is positioned in the illumination optical path, the crystallographic axis of the crystalline quartz prism makes the angle of 45° relative to the polarization plane of the incident, linearly polarized light. Incidentally, where the crystallographic axis of the crystalline quartz prism is set at the angle of 0° or 90° relative to the polarization plane of the incident, linearly polarized light, the light of linear polarization incident to the crystalline quartz prism will pass as it is, without change of the polarization plane. Where the crystallographic axis of the half wave plate 4b is set at an angle of 22.5° relative to the polarization plane of incident, linearly polarized light, the light of linear polarization incident to the half wave plate 4b will be transformed into light in an unpolarized state including a linear polarization component directly passing without change of the polarization plane and a linear polarization component with the polarization plane rotated by 90°.

The polarization state converter 4 is arranged so that light of linear polarization is incident to the half wave plate 4b, as described above, and, for easier description hereinafter, it is assumed that light of linear polarization having the direction of polarization (direction of the electric field) along the Z-axis in FIG. 1 (hereinafter referred to as "Z-directionally polarized light") is incident to the half wave plate 4b. When the depolarizer 4c is positioned in the illumination optical path and when the crystallographic axis of the half wave plate 4b is set at the angle of 0° or 90° relative to the polarization plane (direction of polarization) of the Z-directionally polarized light incident thereto, the light of Z-directional polarization incident to the half wave plate 4b passes as kept as Z-directionally polarized light without change of the polarization plane and enters the crystalline quartz prism in the depolarizer 4c. Since the crystallographic axis of the crystalline quartz prism is set at the angle of 45° relative to the polarization plane of the Z-directionally polarized light incident thereto, the light of Z-directional polarization incident to the crystalline quartz prism is transformed into light in an unpolarized state.

The light depolarized through the crystalline quartz prism travels through the quartz prism as a compensator for compensating the traveling direction of the light and is incident into the diffractive optical element 5 while being in the depolarized state. On the other hand, if the crystallographic axis of the half wave plate 4b is set at the angle of 45° relative to the polarization plane of the Z-directionally polarized light incident thereto, the light of Z-directional polarization incident to the half wave plate 4b will be rotated in the polarization plane by 90° and transformed into light of linear polarization having the polarization direction (direction of the electric field) along the X-direction in FIG. 1 (hereinafter referred to as "X-directionally polarized light") and the X-directionally polarized light will be incident to the crystalline quartz prism in the depolarizer 4c. Since the crystallographic axis of the crystalline quartz prism is set at the angle of 45° relative to the polarization plane of the incident, X-directionally polarized light as well, the light of X-directional polarization incident to the crystalline quartz prism is transformed into light in the depolarized state, and the light travels through the quartz prism to be incident in the depolarized state into the diffractive optical element 5.

In contrast, when the depolarizer 4c is set away from the illumination optical path, if the crystallographic axis of the half wave plate 4b is set at the angle of 0° or 90° relative to the polarization plane of the Z-directionally polarized light incident thereto, the light of Z-directional polarization incident to the half wave plate 4b will pass as kept as Z-directionally polarized light without change of the polarization plane, and will be incident in the Z-directionally polarized state into the diffractive optical element 5. If the crystallographic axis of the half wave plate 4b is set at the angle of 45° relative to the polarization plane of the Z-directionally polarized light incident thereto on the other hand, the light of Z directional polarization incident to the half wave plate 4b will be transformed into light of X-directional polarization with the polarization plane rotated by 90°, and will be incident in the X-directionally polarized state into the diffractive optical element 5.

In the polarization state converter 4, as described above, the light in the depolarized state can be made incident to the diffractive optical element 5 when the depolarizer 4c is set and positioned in the illumination optical path. When the depolarizer 4c is set away from the illumination optical path and when the crystallographic axis of the half wave plate 4b is set at the angle of 0° or 90° relative to the polarization plane of the Z-directionally polarized light incident thereto, the light in the Z-directionally polarized state can be made incident to the diffractive optical element 5. Furthermore, when the depolarizer 4c is set away from the illumination optical path and when the crystallographic axis of the half wave plate 4b is set at the angle of 45° relative to the polarization plane of the Z-directionally polarized light incident thereto, the light in the X-directionally polarized state can be made incident to the diffractive optical element 5.

In other words, the polarization state converter 4 is able to switch the polarization state of the incident light into the diffractive optical element 5 (therefore, the polarization state of light to illuminate the mask M and wafer W) between the linearly polarized state and the unpolarized state through the action of the polarization state converter consisting of the quarter wave plate 4a, half wave plate 4b, and depolarizer 4c, and, in the case of the linearly polarized state, it is able to switch between mutually orthogonal polarization states (between the Z-directional polarization and the X-directional polarization).

Furthermore, when the polarization state converter 4 is so set that the half wave plate 4b and depolarizer 4c both are set away from the illumination optical path and that the crystallographic axis of the quarter wave plate 4a makes a predetermined angle relative to the incident, elliptically polarized light, light in a circularly polarized state can be made incident to the diffractive optical element 5. In general, the polarization state of incident light to the diffractive optical element 5 can also be set in a linearly polarized state having a direction of polarization along an arbitrary direction by the action of the half wave plate 4b.

Next, the conical axicon system 8 is composed of a first prism member 8a whose plane is kept toward the light source and whose refracting surface of a concave conical shape is kept toward the mask, and a second prism member 8b whose plane is kept toward the mask and whose refracting surface of a convex conical shape is kept toward the light source, in order from the light source side. The refracting surface of the concave conical shape of the first prism member 8a and the refracting surface of the convex conical shape of the second prism member 8b are formed in a complementary manner so as to be able to be brought into contact with each other. At least one of the first prism member 8a and the second prism member 8b is arranged movable along the optical axis AX, so that the spacing can be varied between the refracting surface of the concave conical shape of the first prism member 8a and the refracting surface of the convex conical shape of the second prism member 8b.

In a state in which the refracting surface of the concave conical shape of the first prism member 8a and the refracting surface of the convex conical shape of the second prism member 8b are in contact with each other, the conical axicon system 8 functions as a plane-parallel plate and has no effect on the secondary light source of the annular shape formed. However, when the refracting surface of the concave conical shape of the first prism member 8a and the refracting surface of the convex conical shape of the second prism member 8b are spaced from each other, the conical axicon system 8 functions a so-called beam expander. Therefore, the angle of the incident beam to the predetermined plane 7 varies according to change in the spacing of the conical axicon system 8.

Figure 2:
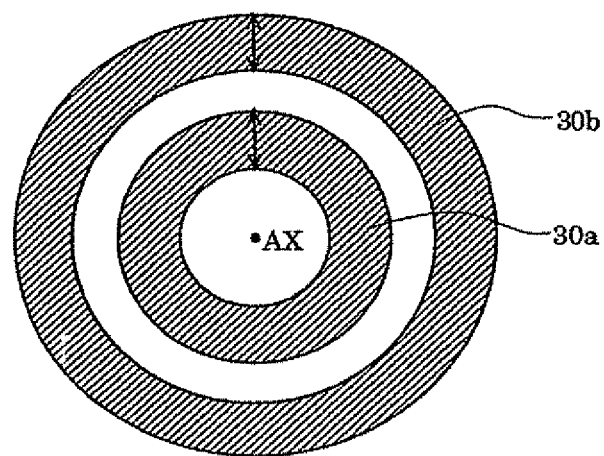
FIG. 2 is an illustration to illustrate the action of a conical axicon system on a secondary light source of an annular shape.

FIG. 2 is an illustration to illustrate the action of the conical axicon system on the secondary right source of the annular shape. With reference to FIG. 2, the secondary light source 30a of the minimum annular shape formed in a state where the spacing of the conical axicon system 8 is zero and where the focal length of the zoom lens 9 is set at the minimum (this state will be referred to hereinafter as a "standard state") is changed into secondary light source 30b of an annular shape with the outside diameter and inside diameter both enlarged and without change in the width (half of the difference between the inside diameter and the outside diameter: indicated by arrows in the drawing) when the spacing of the conical axicon system 8 is increased from zero to a predetermined value. In other words, an annular ratio (inside diameter/outside diameter) and size (outside diameter) both vary through the action of the conical axicon system 8, without change in the width of the secondary light source of the annular shape.

Figure 3:
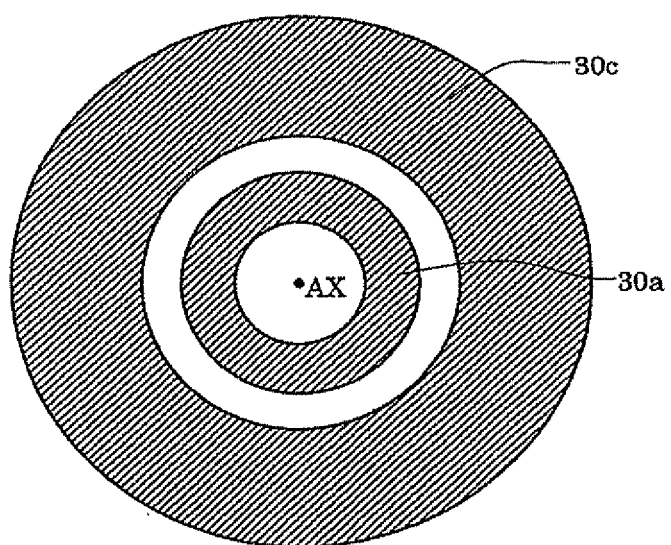
FIG. 3 is an illustration to illustrate the action of a zoom lens on a secondary light source of an annular shape.

FIG. 3 is an illustration to illustrate the action of the zoom lens on the secondary light source of the annular shape. With reference to FIG. 3, the secondary light source 30a of the annular shape formed in the standard state is changed into secondary light source 30c of an annular shape whose entire shape is similarly enlarged by increasing the focal length of the zoom lens 9 from the minimum to a predetermined value. In other words, the width and size (outside diameter) both vary through the action of zoom lens 9, without change in the annular ratio of the secondary light source of the annular shape.

Figure 4:
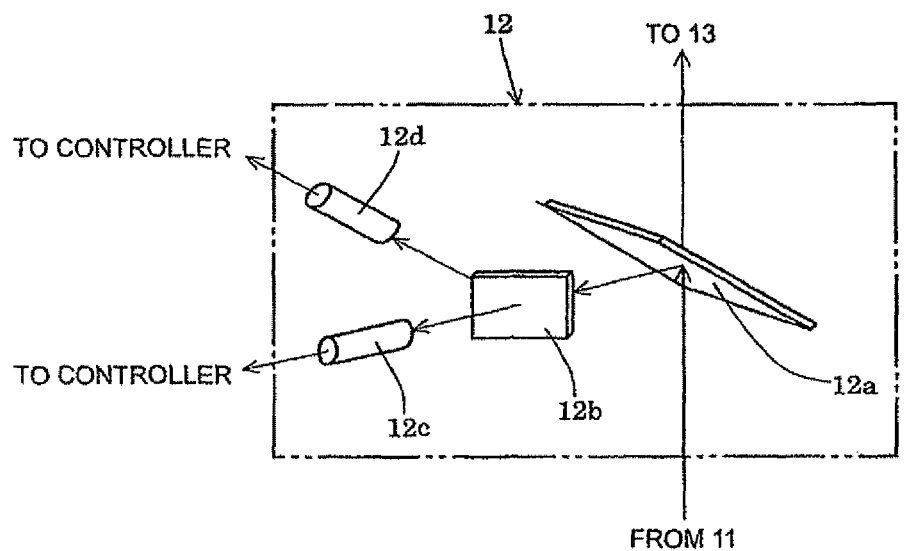
FIG. 4 is a perspective view schematically showing an internal configuration of a polarization monitor in FIG. 1.

FIG. 4 is a perspective view schematically showing the internal configuration of the polarization monitor shown in FIG. 1. With reference to FIG. 4, the polarization monitor 12 is provided with a first beam splitter 12a disposed in the optical path between the micro fly's eye lens 11 and the condenser optical system 13. The first beam splitter 12a has, for example, the form of a non-coated plane-parallel plate made of quartz glass (i.e., raw glass), and has a function of taking reflected light in a polarization state different from a polarization state of incident light, out of the optical path.

The light taken out of the optical path by the first beam splitter 12a is incident to a second beam splitter 12b. The second beam splitter 12b has, for example, the form of a non-coated plane-parallel plate made of quartz glass as the first beam splitter 12a does, and has a function of generating reflected light in a polarization state different from the polarization state of incident light. The polarization monitor is so set that the P-polarized light for the first beam splitter 12a becomes the S-polarized light for the second beam splitter 12b and that the S-polarized light for the first beam splitter 12a becomes the P-polarized light for the second beam splitter 12b.

Light transmitted by the second beam splitter 12b is detected by first light intensity detector 12c, while light reflected by the second beam splitter 12b is detected by second light intensity detector 12d. Outputs from the first light intensity detector 12c and from the second light intensity detector 12d are supplied each to a controller (not shown). The controller drives the quarter wave plate 4a, half wave plate 4b, and depolarizer 4c constituting the polarization state converter 4, according to need.

As described above, the reflectance for the P-polarized light and the reflectance for the S-polarized light are substantially different in the first beam splitter 12a and in the second beam splitter 12b. In the polarization monitor 12, therefore, the reflected light from the first beam splitter 12a includes the S-polarization component (i.e., the S-polarization component for the first beam splitter 12a and P-polarization component for the second beam splitter 12b), for example, which is approximately 10% of the incident light to the first beam splitter 12a, and the P-polarization component (i.e., the P-polarization component for the first beam splitter 12a and S-polarization component for the second beam splitter 12b), for example, which is approximately 1% of the incident light to the first beam splitter 12a.

The reflected light from the second beam splitter 12b includes the P-polarization component (i.e., the P-polarization component for the first beam splitter 12a and S-polarization component for the second beam splitter 12b), for example, which is approximately 10% 1%=0.1% of the incident light to the first beam splitter 12a, and the S-polarization component (i.e., the S-polarization component for the first beam splitter 12a and P-polarization component for the second beam splitter 12b), for example, which is approximately 1% 10%=0.1% of the incident light to the first beam splitter 12a.

In the polarization monitor 12, as described above, the first beam splitter 12a has the function of extracting the reflected light in the polarization state different from the polarization state of the incident light out of the optical path in accordance with its reflection characteristic. As a result, though there is slight influence of variation of polarization due to the polarization characteristic of the second beam splitter 12b, it is feasible to detect the polarization state (degree of polarization) of the incident light to the first beam splitter 12a and, therefore, the polarization state of the illumination light to the mask M, based on the output from the first light intensity detector 12c (information about the intensity of transmitted light from the second beam splitter 12b, i.e., information about the intensity of light virtually in the same polarization state as that of the reflected light from the first beam splitter 12a).

The polarization monitor 12 is so set that the P-polarized light for the first beam splitter 12a becomes the S-polarized light for the second beam splitter 12b and that the S-polarized light for the first beam splitter 12a becomes the P-polarized light for the second beam splitter 12b. As a result, it is feasible to detect the light quantity (intensity) of the incident light to the first beam splitter 12a and, therefore, the light quantity of the illumination light to the mask M, with no substantial effect of the change in the polarization state of the incident light to the first beam splitter 12a, based on the output from the second light intensity detector 12d (information about the intensity of light successively reflected by the first beam splitter 12a and the second beam splitter 12b).

In this manner, it is feasible to detect the polarization state of the incident light to the first beam splitter 12a and, therefore, to determine whether the illumination light to the mask M is in the desired unpolarized state, linearly polarized state, or circularly polarized state, using the polarization monitor 12. When the controller determines that the illumination light to the mask M (eventually, to the wafer W) is not in the desired unpolarized state, linearly polarized state, or circularly polarized state, based on the detection result of the polarization monitor 12, it drives and adjusts the quarter wave plate 4a, half wave plate 4b, and depolarizer 4c constituting the polarization state converter 4 so that the state of the illumination light to the mask M can be adjusted into the desired unpolarized state, linearly polarized state, or circularly polarized state.

Quadrupole illumination can be implemented by setting a diffractive optical element for quadrupole illumination (not shown) in the illumination optical path, instead of the diffractive optical element 5 for annular illumination. The diffractive optical element for quadrupole illumination has such a function that when a parallel beam having a rectangular cross section is incident thereto, it forms a light intensity distribution of a quadrupole shape in the far field thereof. Therefore, the beam passing through the diffractive optical element for quadrupole illumination forms an illumination field of a quadrupole shape consisting of four circular illumination fields centered around the optical axis AX, for example, on the entrance surface of the micro fly's eye lens 11. As a result, the secondary light source of the same quadrupole shape as the illumination field formed on the entrance surface is also formed on or near the rear focal plane of the micro fly's eye lens 11.

In addition, ordinary circular illumination can be implemented by setting a diffractive optical element for circular illumination (not shown) in the illumination optical path, instead of the diffractive optical element 5 for annular illumination. The diffractive optical element for circular illumination has such a function that when a parallel beam having a rectangular cross section is incident thereto, it forms a light intensity distribution of a circular shape in the far field. Therefore, a beam passing through the diffractive optical element for circular illumination forms a circular illumination field centered around the optical axis AX, for example, on the entrance surface of the micro fly's eye lens 11. As a result, the secondary light source of the same circular shape as the illumination field formed on the entrance surface is also formed on or near the rear focal plane of the micro fly's eye lens 11.

Furthermore, a variety of multipole illuminations (dipole illumination, octapole illumination, etc.) can be implemented by setting other diffractive optical elements for multipole illuminations (not shown), instead of the diffractive optical element 5 for annular illumination. Likewise, modified illuminations in various forms can be implemented by setting diffractive optical elements with appropriate characteristics (not shown) in the illumination optical path, instead of the diffractive optical element 5 for annular illumination.

Figure 5:
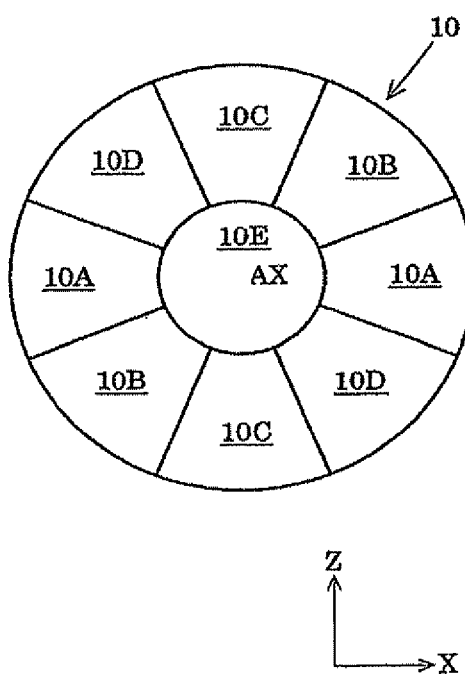
FIG. 5 is an illustration schematically showing a configuration of a polarization-modulating element in FIG. 1.
Figure 6:
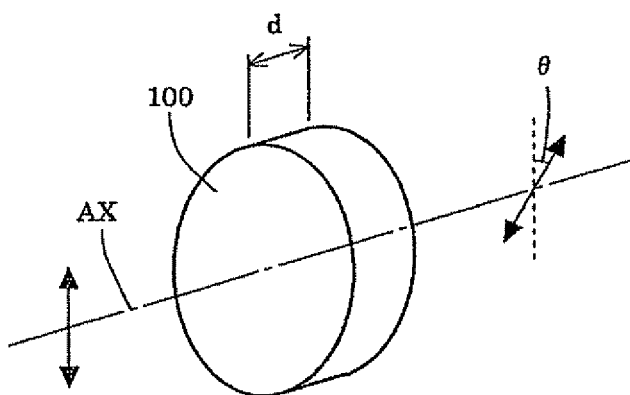
FIG. 6 is an illustration to illustrate the optical activity of crystalline quartz.
Figure 7:
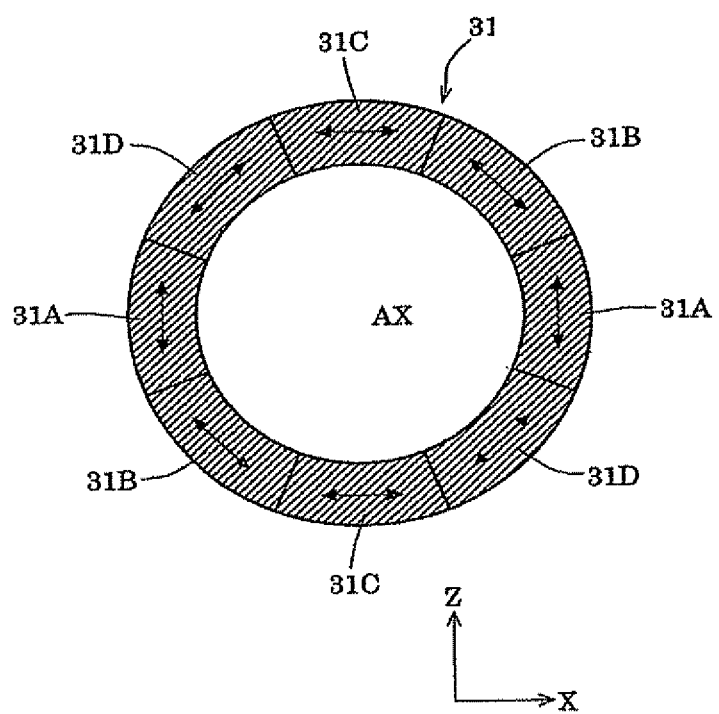
FIG. 7 is an illustration schematically showing a secondary light source of an annular shape set in a azimuthal polarization state by the action of the polarization-modulating element.

FIG. 5 is an illustration schematically showing the configuration of the polarization-modulating element shown in FIG. 1. FIG. 6 is an illustration to illustrate the optical activity of crystalline quartz. FIG. 7 is an illustration schematically showing the secondary light source of the annular shape set in the azimuthal polarization state by the action of the polarization-modulating element. The polarization-modulating element 10 according to the present embodiment is located immediately before the micro fly's eye lens 11, i.e., on or near the pupil of the illumination optical apparatus (1 to PL). Therefore, in the case of the annular illumination, the beam having an approximately annular cross section centered around the optical axis AX is incident to the polarization-modulating element 10.

With reference to FIG. 5, the polarization-modulating element 10 has an effective region of an annular shape centered around the optical axis AX as a whole, and this effective region of the annular shape is composed of eight elementary elements of a sector shape as circumferentially equally divided around the optical axis AX. Among these eight elementary elements, a pair of elementary elements facing each other with the optical axis AX in between have the same characteristic. Namely, the eight elementary elements include four types of elementary elements 10A-10D two each with different thicknesses (lengths in the direction of the optical axis) along the direction of transmission of light (Y-direction).

Specifically, the thickness of the first elementary elements 10A is the largest, the thickness of the fourth elementary elements 10D is the smallest, and the thickness of the second elementary elements 10B is set larger than the thickness of the third elementary elements 10C. As a result, one surface (e.g., the entrance surface) of the polarization-modulating element 10 is planar, while the other surface (e.g., the exit surface) is uneven because of the differences among the thicknesses of the elementary elements 10A-10D. It is also possible to form the both surfaces (the entrance surface and exit surface) of the polarization-modulating element 10 in an uneven shape.

In the present embodiment, each elementary element 10A-10D is made of crystalline quartz as a crystalline material being an optical material with optical activity, and the crystallographic axis of each elementary element 10A-10D is set to be approximately coincident with the optical axis AX, i.e., with the traveling direction of incident light. The optical activity of crystalline quartz will be briefly described below with reference to FIG. 6. With reference to FIG. 6, an optical member 100 of a plane-parallel plate shape made of crystalline quartz and in a thickness d is arranged so that its crystallographic axis coincides with the optical axis AX. In this case, by virtue of the optical activity of the optical member 100, linearly polarized light incident thereto emerges in a state in which its polarization direction is rotated by θ around the optical axis AX.

At this time, the rotation angle (angle of optical rotation) θ of the polarization direction due to the optical activity of the optical member 100 is represented by Eq (a) below, using the thickness d of the optical member 100 and the rotatory power ρ of crystalline quartz.

$$\theta = d \cdot \rho \qquad (a)$$

In general, the rotatory power ρ of crystalline quartz has wavelength dependence (a property that the value of the optical rotatory power differs depending upon the wavelength of light used: optical rotatory dispersion) and, specifically, it tends to increase with decrease in the wavelength of light used. According to the description on page 167 in "Applied Optics II," the rotatory power ρ of crystalline quartz for light having the wavelength of 250.3 nm is 153.9°/mm.

In the present embodiment, the first elementary elements 10A are designed in such a thickness dA that when linearly polarized light having the polarization direction along the Z-direction is incident thereto, they output light of linear polarization having the polarization direction along a direction resulting from +180° rotation of the Z-direction around the Y-axis, i.e., along the Z-direction. In this case, therefore, the polarization direction of beams passing through a pair of arc (bow shape) regions 31A formed by beams subject to the optical rotating action of a pair of first elementary elements 10A, in the secondary light source 31 of the annular shape shown in FIG. 7, is the Z-direction.

The second elementary elements 10B are designed in such a thickness dB that when linearly polarized light having the polarization direction along the Z-direction is incident thereto, they output light of linear polarization having the polarization direction along a direction resulting from +135° rotation of the Z-direction around the Y-axis, i.e., along a direction resulting from −45° rotation of the Z-direction around the Y-axis. In this case, therefore, the polarization direction of beams passing through a pair of arc (bow shape) regions 31B formed by beams subject to the optical rotating action of a pair of second elementary elements 10B, in the secondary light source 31 of the annular shape shown in FIG. 7, is a direction obtained by rotating the Z-direction by −45° around the Y-axis.

The third elementary elements 10C are designed in such a thickness dC that when linearly polarized light having the polarization direction along the Z-direction is incident thereto, they output light of linear polarization having the polarization direction along a direction resulting from +90° rotation of the Z-direction around the Y-axis, i.e., along the X-direction. In this case, therefore, the polarization direction of beams passing through a pair of arc (bow shape) regions 31C formed by beams subject to the optical rotating action of a pair of third elementary elements 10C, in the secondary light source 31 of the annular shape shown in FIG. 7, is the X-direction.

The fourth elementary elements 10D are designed in such a thickness dD that when linearly polarized light having the polarization direction along the Z-direction is incident thereto, they output light of linear polarization having the polarization direction along a direction resulting from +45° rotation of the Z-direction around the Y-axis. In this case, therefore, the polarization direction of beams passing through a pair of arc (bow shape) regions 31D formed by beams subject to the optical rotating action of a pair of fourth elementary elements 10D, in the secondary light source 31 of the annular shape shown in FIG. 7, is a direction obtained by rotating the Z-direction by +45° around the Y-axis.

The polarization-modulating element 10 can be constructed by combining the eight elementary elements prepared separately, or the polarization-modulating element 10 can also be constructed by forming the required uneven shape (level differences) in a crystalline quartz substrate of a plane-parallel plate shape. For allowing the ordinary circular illumination with the polarization-modulating element 10 being kept in the optical path, the polarization-modulating element 10 is provided with a central region 10E of a circular shape in the size not less than 3/10, preferably, not less than 1/3 of the radial size of the effective region of the polarization-modulating element 10 and without optical activity. The central region 10E may be made of an optical material without optical activity, for example, like quartz, or may be simply a circular aperture. It is, however, noted that the central region 10E is not an essential element for the polarization-modulating element 10. The size of the central region 10E determines the boundary between the region in the azimuthal polarization state and the other region.

In the present embodiment, on the occasion of the circumferentially polarized annular illumination (modified illumination in which beams passing through the secondary light source of the annular shape are set in the azimuthal polarization state), the linearly polarized light having the polarization direction along the Z-direction is made incident to the polarization-modulating element 10. As a result, as shown in FIG. 7, the secondary light source of the annular shape (illumination pupil distribution of annular shape) 31 is formed on or near the rear focal plane of the micro fly's eye lens 11, and beams passing through this secondary light source 31 of the annular shape are set in the azimuthal polarization state. In the azimuthal polarization state, the beams passing through the respective arc (bow shape) regions 31A-31D constituting the secondary light source 31 of the annular shape turn into a linearly polarized state having the polarization direction approximately coincident with a tangential direction to a circle centered around the optical axis AX, at the central position along the circumferential direction of each arc region 31A-31D.

In this manner, the present embodiment, different from the conventional technology giving rise to the large loss of light quantity at the aperture stop, is able to form the secondary light source 31 of the annular shape in the azimuthal polarization state, with no substantial loss of light quantity, through the optical rotating action of the polarization-modulating element 10. In other words, the illumination optical apparatus of the present embodiment is able to form the illumination pupil distribution of the annular shape in the azimuthal polarization state while well suppressing the loss of light quantity. Furthermore, since the present embodiment uses the polarizing action of the optical elements, it has the excellent effect that the polarization-modulating element itself is extremely easy to produce and, typically, the thickness tolerance of each elementary element can be set to be extremely loose.

In the circumferentially polarized annular illumination based on the illumination pupil distribution of the annular shape in the azimuthal polarization state, the light illuminating the wafer W as a last surface to be illuminated is in a polarized state in which the principal component is S-polarized light. Here the S-polarized light is linearly polarized light having the polarization direction along a direction normal to the plane of incidence (i.e., polarized light with the electric vector oscillating in the direction normal to the plane of incidence). The plane of incidence is defined as follows: when light arrives at a boundary surface of a medium (surface to be illuminated: surface of wafer W), the plane of incidence is a plane including a normal to the boundary surface at that point and the direction of incidence of light.

Consequently, the circumferentially polarized annular illumination realizes an improvement in the optical performance (depth of focus and the like) of the projection optical system and enables formation of a mask pattern image with high contrast on the wafer (photosensitive substrate). Namely, since the exposure apparatus of the present embodiment uses the illumination optical apparatus capable of forming the illumination pupil distribution of the annular shape in the azimuthal polarization state while well suppressing the loss of light quantity, it is able to transcribe a fine pattern under an appropriate illumination condition faithfully and with high throughput.

Figure 8:
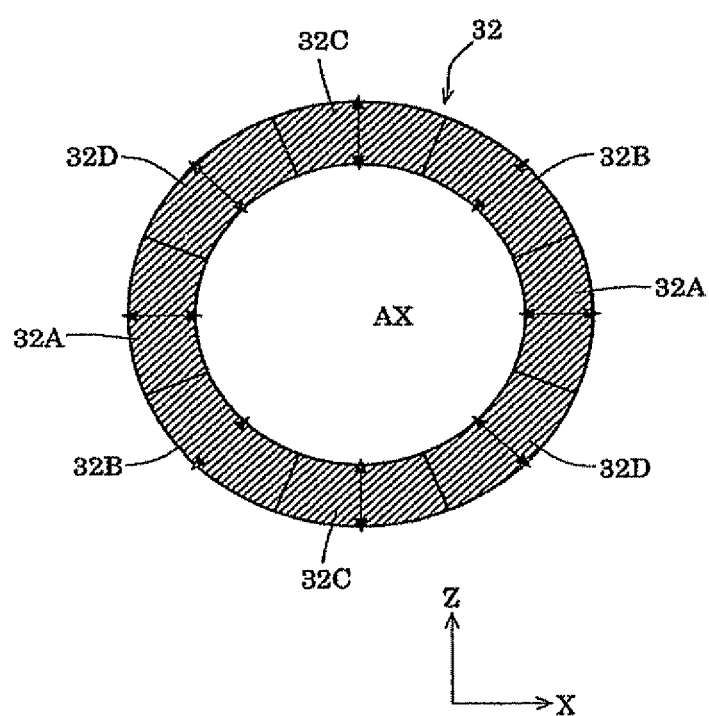
FIG. 8 is an illustration schematically showing a secondary light source of an annular shape set in a radially polarized state by the action of the polarization-modulating element.

Incidentally, the present embodiment enables radially polarized annular illumination (modified illumination in which beams passing through the secondary light source of the annular shape are set in a radially polarized state) by injecting linearly polarized light having the polarization direction along the X-direction into the polarization-modulating element 10 and thereby setting the beams passing through the secondary light source 32 of the annular shape in the radially polarized state as shown in FIG. 8. In the radially polarized state, beams passing through the respective arc (bow shape) regions 32A-32D constituting the secondary light source 32 of the annular shape are in the linearly polarized state having the polarization direction approximately coincident with a radial direction of a circle centered around the optical axis AX, at the central position along the circumferential direction of each arc region 32A-32D.

In the radially polarized annular illumination based on the illumination pupil distribution of the annular shape in the radially polarized state, the light illuminating the wafer W as a last surface to be illuminated is in a polarized state in which the principal component is P-polarized light. The P-polarized light herein is linearly polarized light having the polarization direction along a direction parallel to the plane of incidence defined as described above (i.e., polarized light with the electric vector oscillating in the direction parallel to the plane of incidence). In consequence, the radially polarized annular illumination enables formation of a good mask pattern image on the wafer (photosensitive substrate) while keeping the reflectance of light low on the resist applied onto the wafer W.

The above-described embodiment realizes the circumferentially polarized annular illumination and the radially polarized annular illumination by switching the beam incident to the polarization-modulating element 10 between the linearly polarized state having the polarization direction along the Z-direction and the linearly polarized state having the polarization direction along the X-direction. However, without having to be limited to this, it is also possible to realize the circumferentially polarized annular illumination and the radially polarized annular illumination, for example, by switching the polarization-modulating element 10 between a first state shown in FIG. 5 and a second state resulting from 90° rotation around the optical axis AX, for the incident beam in the linearly polarized state having the polarization direction along the Z-direction or along the X-direction.

In the foregoing embodiment the polarization-modulating element 10 is located immediately before the micro fly's eye lens 11. However, without having to be limited to this, the polarization-modulating element 10 can also be located generally on or near the pupil of the illumination optical apparatus (1 to PL), e.g., on or near the pupil of the projection optical system PL, on or near the pupil of the imaging optical system 15, or immediately before the conical axicon system 8 (on or near the pupil of afocal lens 6).

However, where the polarization-modulating element 10 is located in the projection optical system PL or in the imaging optical system 15, the required effective diameter (clear aperture diameter) of the polarization-modulating element 10 is prone to become large, and it is rather undesirable in view of the current circumstances in which it is difficult to obtain a large crystalline quartz substrate with high quality. When the polarization-modulating element 10 is located immediately before the conical axicon system 8, the required effective diameter (clear aperture diameter) of the polarization-modulating element 10 can be kept small. However, the distance is long to the wafer W being the last surface to be illuminated, and an element to change the polarization state like an antireflection coat on a lens or a reflecting film on a mirror is likely to be interposed in the optical path to the wafer. Therefore, this arrangement is not so preferable. In passing, the antireflection coat on the lens or the reflecting film on the mirror is likely to cause the difference of reflectance depending upon the polarization states (P-polarization and S-polarization) and angles of incidence and, in turn, to change the polarization state of light.

In the foregoing embodiment, at least one surface of the polarization-modulating element 10 (e.g., the exit surface) is formed in the uneven shape and, therefore, the polarization-modulating element 10 has a thickness profile discretely (discontinuously) varying in the circumferential direction. However, without having to be limited to this, at least one surface of the polarization-modulating element 10 (e.g., the exit surface) can also be formed in such a curved shape that the polarization-modulating element 10 has a thickness profile virtually discontinuously varying in the circumferential direction.

In the foregoing embodiment the polarization-modulating element 10 is composed of the eight elementary elements of the sector shape corresponding to the division of the effective region of the annular shape into eight segments. However, without having to be limited to this, the polarization-modulating element 10 can also be composed, for example, of eight elementary elements of a sector shape corresponding to division of the effective region of a circular shape into eight segments, or of four elementary elements of a sector shape corresponding to division of the effective region of a circular shape or annular shape into four segments, or of sixteen elementary elements of a sector shape corresponding to division of the effective region of a circular shape or annular shape into sixteen segments. Namely, a variety of modification examples can be contemplated as to the shape of the effective region of the polarization-modulating element 10, the number of segments in the division of the effective region (the number of elementary elements), and so on.

In the foregoing embodiment each elementary element 10A-10D (therefore, the polarization-modulating element 10) is made of crystalline quartz. However, without having to be limited to this, each elementary element can also be made of another appropriate optical material with optical activity. In this case, it is preferable to use an optical material with an optical rotatory power of not less than 100°/mm for light of a wavelength used. Namely, use of an optical material with a small optical rotatory power is undesirable because the thickness necessary for obtaining the required rotation angle of the polarization direction becomes too large, so as to cause a loss of light quantity.

In the foregoing embodiment the polarization-modulating element 10 is fixedly provided in the illumination optical path, but the polarization-modulating element 10 may be arranged to be set into and away from the illumination optical path. The above embodiment showed the example as a combination of the annular illumination with the S-polarized light for the wafer W, but it is also possible to combine the S-polarized light for the wafer W with multipole illumination, such as dipole or quadrupole illumination, and with circular illumination. In the foregoing embodiment the illumination conditions for the mask M and the imaging conditions (numerical aperture, aberrations, etc.) for the wafer W can be automatically set, for example, according to the type of the pattern on the mask M or the like.

Figure 9:
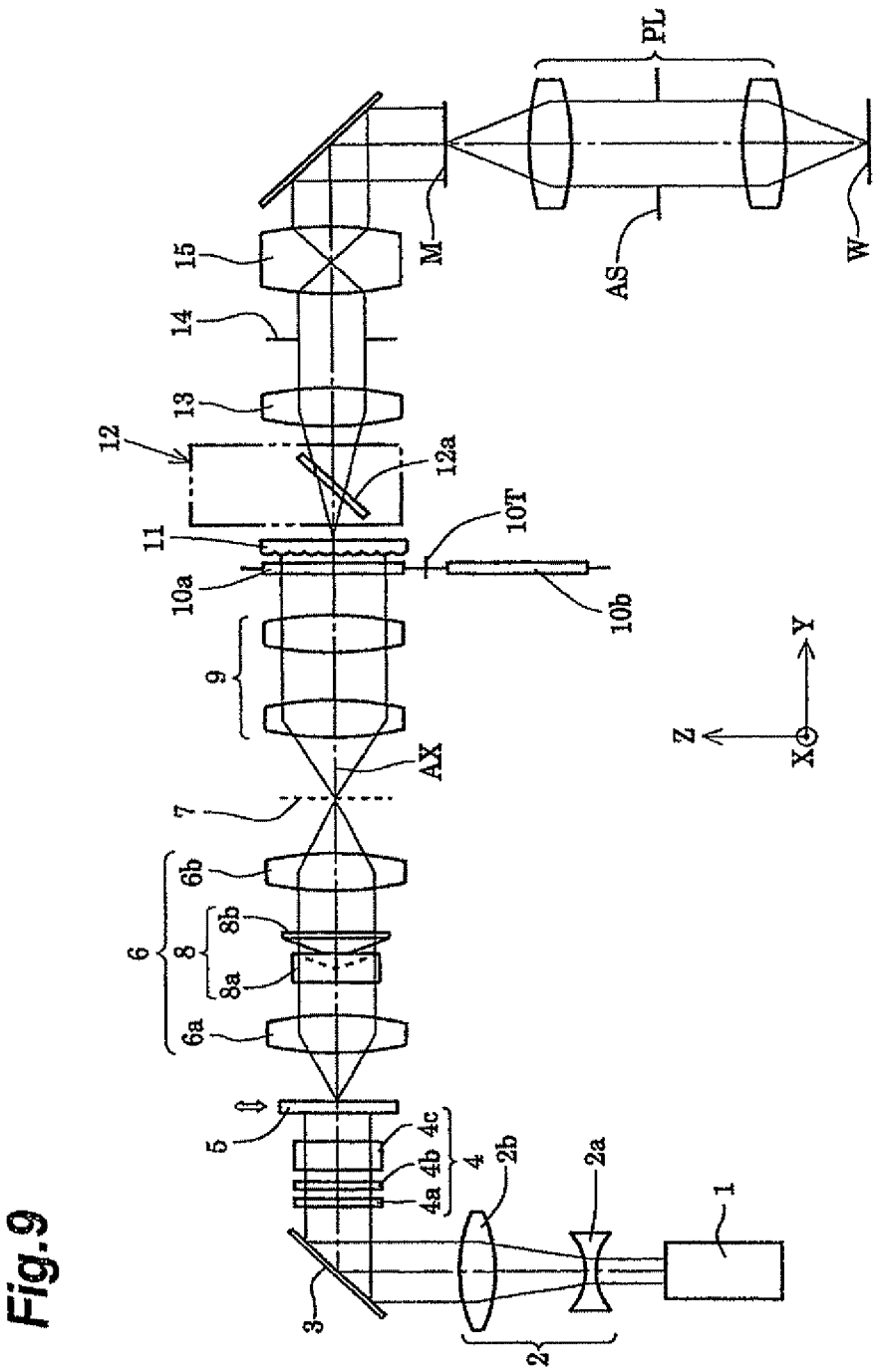
FIG. 9 is an illustration showing a modification example in which a plurality of polarization-modulating elements are arranged in a replaceable state.

FIG. 9 shows a modification example in which a plurality of polarization-modulating elements are arranged in a replaceable state. The modification example of FIG. 9 has a configuration similar to the embodiment shown in FIG. 1, but it is different in that it has a turret 10T enabling replacement of the plurality of polarization-modulating elements.

Figure 10:
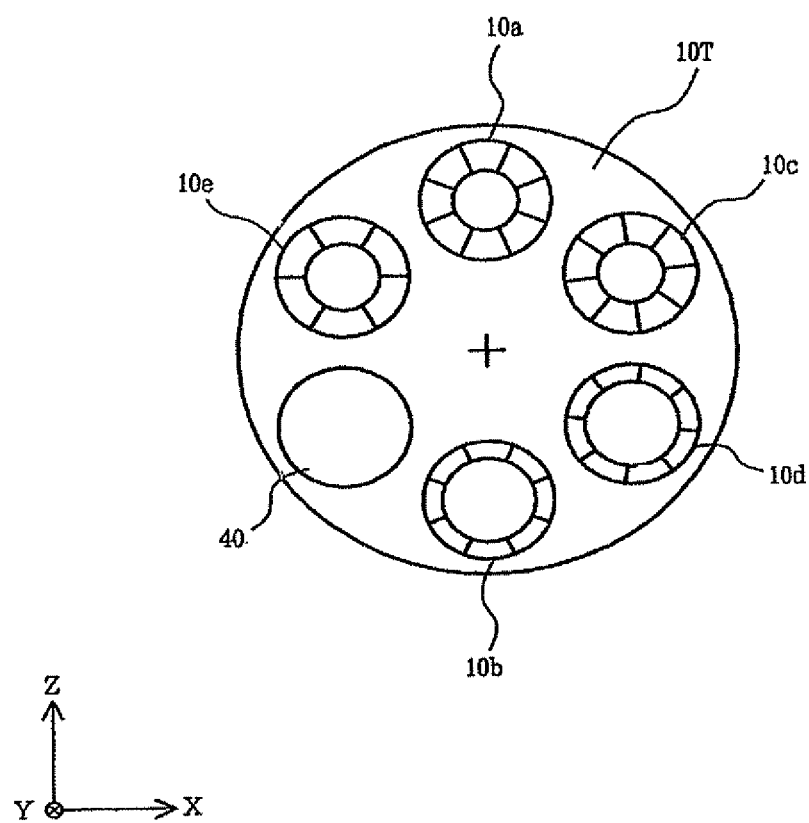
FIG. 10 is an illustration showing plural types of polarization-modulating elements 10a-10c mounted on a turret 10T as a replacing mechanism in FIG. 9.

FIG. 10 is an illustration showing plural types of polarization-modulating elements 10a-10e mounted on the turret 10T as a replacing mechanism in FIG. 9. In this modification example, as shown in FIGS. 9 and 10, the plural types of polarization-modulating elements 10a-10e are provided on the turret 10T rotatable around an axis along a direction parallel to the optical axis AX, and these plural types of polarization-modulating elements 10a-10e are arranged replaceable by rotation operation of the turret 10T. FIG. 9 depicts only the polarization-modulating elements 10a, 10b out of the plural types of polarization-modulating elements 10a-10e. The replacing mechanism for the polarization-modulating elements is not limited to the turret 10T, but may be, for example, a slider.

Figure 11A:
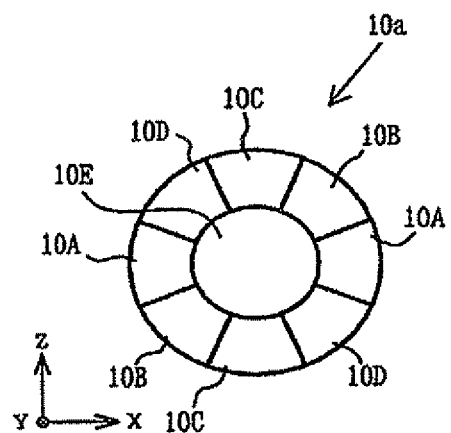
FIGS. 11A, 11B, 11C, 11D and 11E are illustrations showing respective configurations of plural types of polarization-modulating elements 10a-10e, respectively.
Figure 11B:
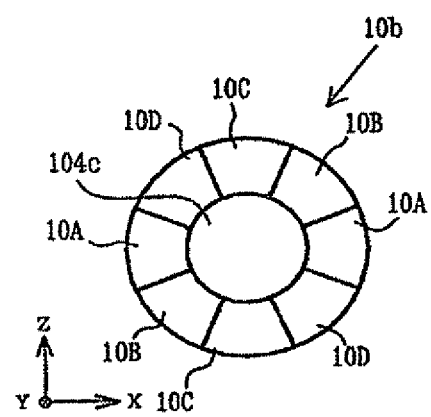

FIGS. 11A-11E are illustrations showing respective configurations of the plural types of polarization-modulating elements 10a-10e. In FIG. 11A, the first polarization-modulating element 10a has the same configuration as the polarization-modulating element 10 of the embodiment shown in FIG. 5. In FIG. 11B, the second polarization-modulating element 10b has a configuration similar to the polarization-modulating element 10a shown in FIG. 11A, but is different in that it is provided with a depolarizing member 104c in central region 10E. This depolarizing member 104c has a configuration similar to the depolarizer 4c shown in FIG. 1, and has a function of transforming incident light of linear polarization into light in a depolarized state.

Figure 11C:
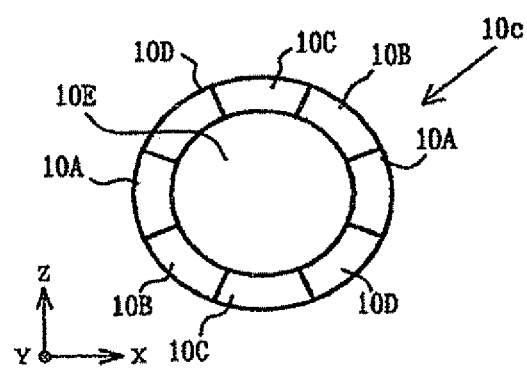
Figure 11D:
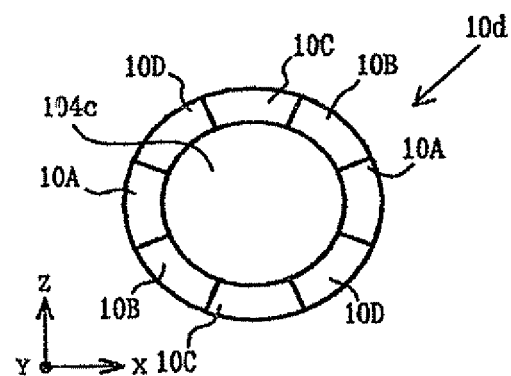

In FIG. 11C, the third polarization-modulating element 10c has a configuration similar to the polarization-modulating element 10a shown in FIG. 11A, but is different in that the size of the central region 10E is larger (i.e., in that the width of the first to fourth elementary elements 10A-10D is smaller). In FIG. 11D, the fourth polarization-modulating element 10d has a configuration similar to the polarization-modulating element 10c shown in FIG. 11C, but is different in that a depolarizing member 104c is provided in the central region 10E.

Figure 11E:
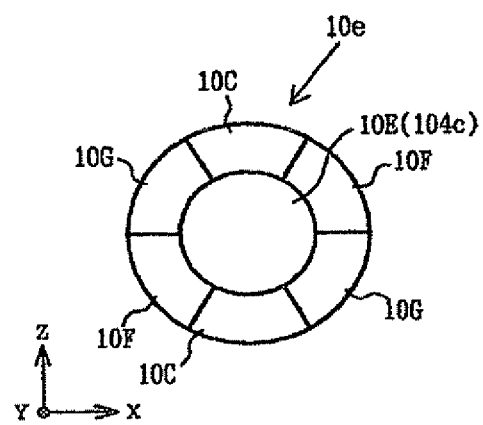

In FIG. 11E, the fifth polarization-modulating element 10e is constructed by combining six elementary elements 10C, 10F, 10G, different from the eight elementary elements. The fifth polarization-modulating element 10e has the effective region of an annular shape centered around the optical axis AX as a whole, and this effective region of the annular shape is composed of six elementary elements 10C, 10F, 10G of a sector shape as equally divided in the circumferential direction around the optical axis AX. Among these six elementary elements 10C, 10F, 10G, a pair of elementary elements facing each other with the optical axis AX in between have the same characteristic. Namely, the six elementary elements 10C, 10F, 10G include three types of elementary elements 10C, 10F, 10G with mutually different thicknesses (lengths in the direction of the optical axis) along the direction of transmission of light (the Y-direction) two each.

The elementary elements 10C are members having the same function as the third elementary elements 10C shown in FIG. 7, and thus the description of the function thereof is omitted herein. The elementary elements 10F are designed in such a thickness dF that when linearly polarized light having the polarization direction along the Z-direction is incident thereto, they output light of linear polarization having the polarization direction along a direction resulting from +150° rotation of the Z-direction around the Y-axis, i.e., along a direction resulting from −30° rotation of the Z-direction around the Y-axis. The elementary elements 10G are designed in such a thickness dG that when linearly polarized light having the polarization direction along the Z-direction is incident thereto, they output light of linear polarization having the polarization direction along a direction resulting from +30° rotation of the Z-direction around the Y-axis. A depolarizing member 104c may be provided in place of the central region 10E.

Referring again to FIG. 10, the turret 10T is provided with an opening 40 without any polarization-modulating element, and this opening 40 is located in the illumination optical path in a case where another polarized illumination is implemented different from the circumferentially polarized illumination, or in a case where unpolarized illumination is implemented under a large σ-value (σ value=numerical aperture on the mask side of the illumination optical apparatus/numerical aperture on the mask side of the projection optical system).

The above described only the examples wherein the central region 10E made of the circular opening or the material without optical activity, or the depolarizing member 104c was provided in the central region of the polarization-modulating elements 10a-10e mounted on the turret 10T, but it is also possible to mount polarization-modulating elements without central region 10E nor depolarizing member 104c (i.e., polarization-modulating elements consisting of elementary elements of a sector shape).

Figure 12A:
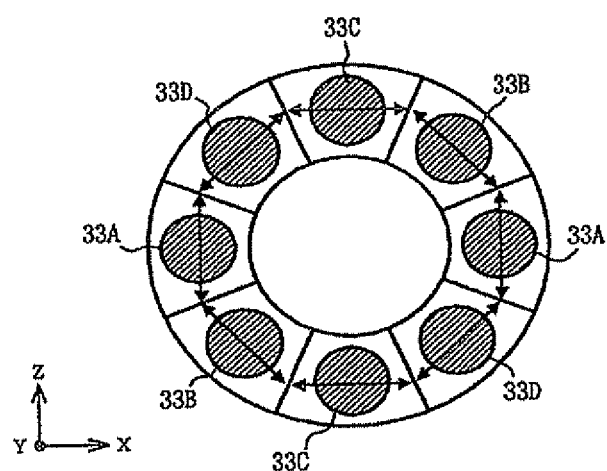
FIGS. 12A, 12B and 12C are illustrations schematically showing examples of the secondary light source set in the azimuthal polarization state by the action of the polarization-modulating element, respectively.
Figure 12B:
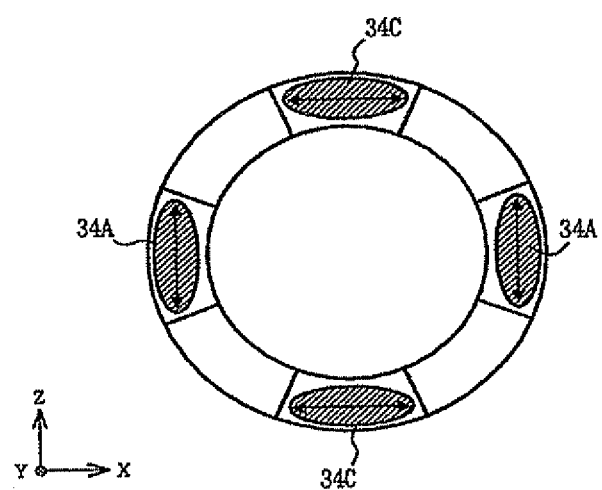
Figure 12C:
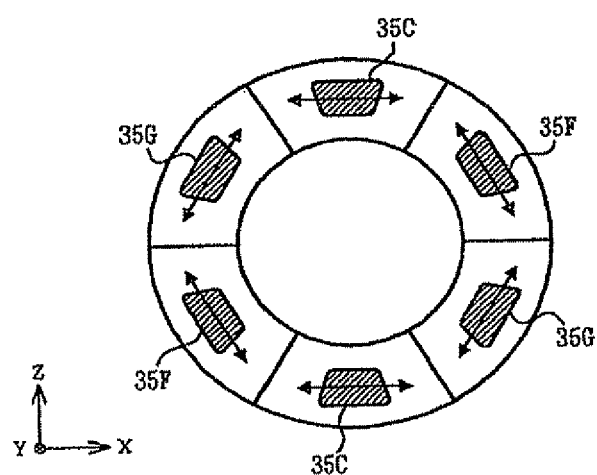

FIGS. 12A-12C are illustrations schematically showing examples of the secondary light source set in the azimuthal polarization state by the action of the polarization-modulating element. In FIGS. 12A-12C, the polarization-modulating element is also illustrated in a superimposed manner in order to facilitate understanding.

FIG. 12A shows the secondary light source 33 of an octapole shape in a case where a diffractive optical element (beam transforming element) for forming a light intensity distribution of an octapole shape in the far field (or Fraunhofer diffraction region) is located in the illumination optical path, instead of the diffractive optical element 5, and where the polarization-modulating element 10a or 10b is located in the illumination optical path. Beams passing through the secondary light source 33 of the octapole shape are set in the azimuthal polarization state. In the azimuthal polarization state, the beams passing through the respective eight circular regions 33A-33D constituting the secondary light source 33 of the octapole shape are in the linearly polarized state having the polarization direction approximately coincident with a circumferential direction of a circle connecting these eight circular regions 33A-33D, i.e., with a tangential direction to the circle connecting these eight circular regions 33A-33D. FIG. 12A shows the example wherein the secondary light source 33 of the octapole shape is composed of the eight circular regions 33A-33D, but the shape of the eight regions is not limited to the circular shape.

FIG. 12B shows the secondary light source 34 of a quadrupole shape in a case where a diffractive optical element (beam transforming element) for forming a light intensity distribution of a quadrupole shape in the far field (or Fraunhofer diffraction region) is located in the illumination optical path, instead of the diffractive optical element 5, and where the polarization-modulating element 10c or 10d is located in the illumination optical path. Beams passing through the secondary light source 34 of the quadrupole shape are set in the azimuthal polarization state. In the azimuthal polarization state, the beams passing through the respective four regions 34A, 34C constituting the secondary light source 34 of the quadrupole shape are in the linearly polarized state having the polarization direction approximately coincident with a circumferential direction of a circle connecting these four regions 34A, 34C, i.e., with a tangential direction to the circle connecting these four regions 34A, 34C. FIG. 12B shows the example wherein the secondary light source 34 of the quadrupole shape is composed of four regions 34A, 34C of an almost elliptical shape, but the shape of the four regions is not limited to the almost elliptical shape.

FIG. 12C shows the secondary light source 35 of a hexapole shape in a case where a diffractive optical element (beam transforming element) for forming a light intensity distribution of a hexapole shape in the far field (or Fraunhofer diffraction region) is located in the illumination optical path, instead of the diffractive optical element 5, and where the polarization-modulating element 10e is located in the illumination optical path. Beams passing through the secondary light source 35 of the hexapole shape are set in the azimuthal polarization state. In the azimuthal polarization state, the beams passing through the respective six regions 35C, 35F, 35G constituting the secondary light source 35 of the hexapole shape are in the linearly polarized state having the polarization direction approximately coincident with a circumferential direction of a circle connecting these six regions 35C, 35F, 35G, i.e., with a tangential direction to the circle connecting these six regions 35C, 35F, 35G. FIG. 12C shows the example wherein the secondary light source 35 of the hexapole shape is composed of the four regions 35C, 35F, 35G of an almost trapezoidal shape, but the shape of the six regions is not limited to the almost trapezoidal shape.

Figure 13:
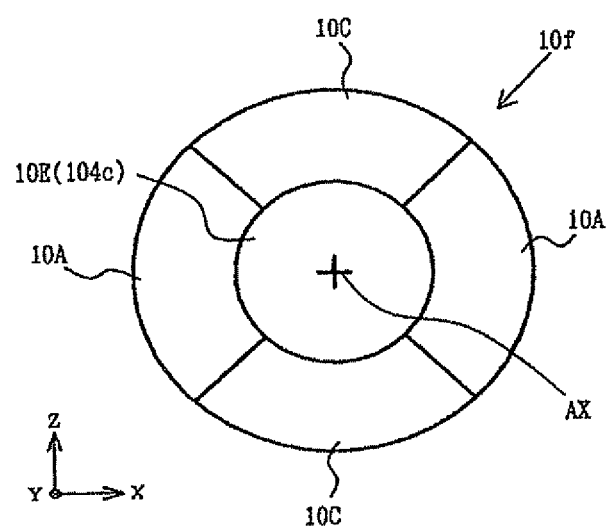
FIG. 13 is an illustration schematically showing a configuration of polarization-modulating element 10f arranged rotatable around the optical axis AX.

The foregoing embodiment and modification example showed the polarization-modulating elements fixed around the optical axis thereof, but the polarization-modulating element may be arranged rotatable around the optical axis. FIG. 13 is an illustration schematically showing a configuration of polarization-modulating element 10f arranged rotatable around the optical axis AX.

In FIG. 13, the polarization-modulating element 10f is composed of a combination of four elementary elements 10A, 10C. The polarization-modulating element 10f has the effective region of an annular shape centered around the optical axis AX as a whole, and this effective region of the annular shape is composed of four elementary elements 10A, 10C of a sector shape as equally divided in the circumferential direction around the optical axis AX. Among these four elementary elements 10A, 10C, a pair of elementary elements facing each other with the optical axis AX in between have the same characteristic. Namely, the four elementary elements 10A, 10C include two types of elementary elements 10A, 10C two each with mutually different thicknesses (lengths in the direction of the optical axis) along the direction of transmission of light (the Y-direction).

The elementary elements 10A are members having the same function as the first elementary elements 10A shown in FIG. 7, and the elementary elements 10C members having the same function as the third elementary elements 10C shown in FIG. 7. Therefore, the description of the functions is omitted herein. A depolarizing member 104c may be provided in place of the central region 10E.

Figure 14A:
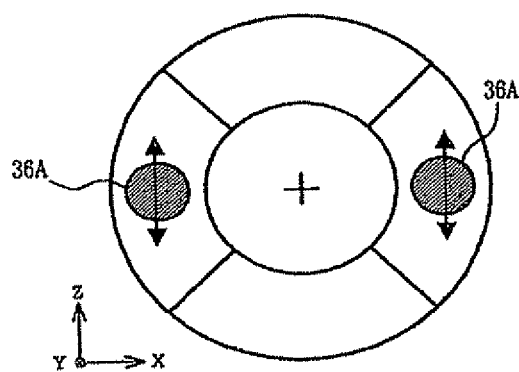
FIGS. 14A, 14B and 14C are illustrations schematically showing examples of the secondary light source set in the azimuthal polarization state by the action of polarization-modulating element 10f, respectively.
Figure 14B:
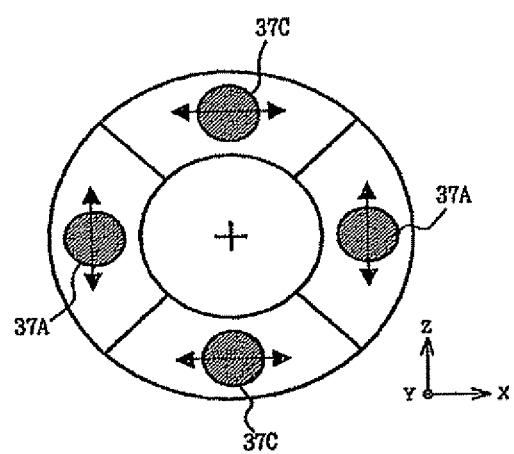
Figure 14C:
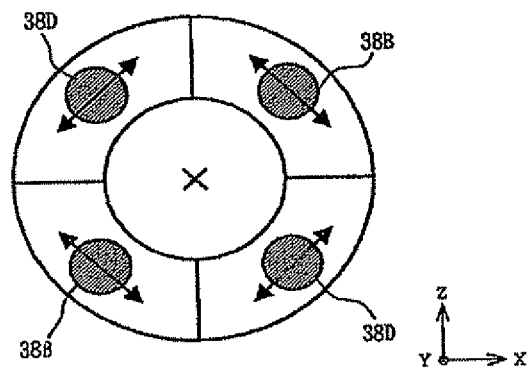

This-polarization-modulating element 10f is arranged to be rotatable around the optical axis AX and, for example, is rotatable by +45° or −45° around the optical axis AX. FIGS. 14A-14C are illustrations schematically showing examples of the secondary light source set in the azimuthal polarization state by the action of the polarization-modulating element 10f. In FIGS. 14A-14C, the polarization-modulating element 10*f* is also illustrated in a superimposed manner in order to facilitate understanding.

FIG. 14A shows the secondary light source 36 (36A) of a dipole shape in a case where a diffractive optical element (beam transforming element) for forming a light intensity distribution of a dipole shape in the far field (or Fraunhofer diffraction region) is set in the illumination optical path, instead of the diffractive optical element 5, and where the polarization-modulating element 10*f* is located in a state at the rotation angle of 0° (standard state) in the illumination optical path. In this case, beams passing through the secondary light source 36 (36A) of the dipole shape are set in a vertically polarized state.

FIG. 14B shows the secondary light source 37 of a quadrupole shape in a case where a diffractive optical element (beam transforming element) for forming a light intensity distribution of a quadrupole shape in the far field (or Fraunhofer diffraction region) is located in the illumination optical path, instead of the diffractive optical element 5, and where the polarization-modulating element 10*f* is located in the state at the rotation angle of 0° (standard state) in the illumination optical path. In this case, beams passing through the secondary light source 37 of the quadrupole shape are set in the azimuthal polarization state. The light intensity distribution of the quadrupole shape in FIG. 14B is localized in the vertical direction (Z-direction) and in the horizontal direction (X-direction) in the plane of the drawing.

In the azimuthal polarization state, beams passing through the respective four circular regions 37A, 37C constituting the secondary light source 37 of the quadrupole shape are in the linearly polarized state having the polarization direction along a circumferential direction of a circle connecting these four circular regions 37A, 37C, i.e., with a tangential direction to the circle connecting these four circular regions 37A, 37C. FIG. 14B shows the example in which the secondary light source 37 of the quadrupole shape is composed of the four circular regions 37A, 37C, but the shape of the four regions is not limited to the circular shape.

FIG. 14C shows the secondary light source 38 of a quadrupole shape in a case where a diffractive optical element (beam transforming element) for forming a light intensity distribution of a quadrupole shape localized in the direction of +45° (−135°) in the plane of the drawing and in the direction of −45° (+135°) in the plane of the drawing in the far field (or Fraunhofer diffraction region) is located in the illumination optical path, instead of the diffractive optical element shown in FIG. 14B, and where the polarization-modulating element 10*f* is set in a rotated state at the rotation angle of +45° (i.e., in a state in which it is rotated by 45° clockwise relative to the standard state) in the illumination optical path.

In FIG. 14C, the half wave plate 4*b* in the polarization state converter 4 is rotated around the optical axis, whereby the linearly polarized light having the polarization direction along the direction of +45° (the direction of −135°) is made incident to the polarization-modulating element 10*f*. The elementary elements 10A have the function of rotating the polarization direction of the incident, linearly polarized light by 180°±n 180° (n is an integer), and the elementary elements 10C have the function of rotating the polarization direction of the incident, linearly polarized light by 90°±n 180° (n is an integer). Therefore, beams passing through the secondary light source 38 of the quadrupole shape are set in the azimuthal polarization state.

In the azimuthal polarization state shown in FIG. 14C, beams passing through the respective four circular regions 38B, 38D constituting the secondary light source 38 of the quadrupole shape are in the linearly polarized state having the polarization direction along a circumferential direction of a circle connecting these four circular regions 38B, 38D, i.e., with a tangential direction to the circle connecting these four circular regions 38B, 38D. FIG. 14C shows the example in which the secondary light source 38 of the quadrupole shape is composed of the four circular regions 38B, 38D, but the shape of the four regions is not limited to the circular shape.

Through the changing operation of the polarization direction by the polarization state converter 4 and the rotation operation of the polarization-modulating element 10*f*, as described above, the azimuthal polarization state can be realized by the secondary light source of the quadrupole shape localized in the +45° (−135°) direction and in the −45° (+135°) direction, by the secondary light source of the quadrupole shape localized in the 0° (+180°) direction and in the 90° (270°) direction or in the vertical and horizontal directions, or by the secondary light source of the dipole shape localized in the 0° (+180°) direction or in the 90° (270°) direction, i.e., in the vertical or horizontal direction.

The polarization-modulating element composed of the eight elementary elements of the sector shape as equally divided in the circumferential direction around the optical axis AX may be arranged rotatable around the optical axis AX. For example, when the polarization-modulating element composed of the eight divisional elementary elements (e.g., the polarization-modulating element 10*a*) is rotated by +45° around the optical axis AX, as shown in FIG. 15A, the beams passing through the respective eight circular regions 39A-39D constituting the secondary light source 39 of the octapole shape are in the linearly polarized state having the polarization direction resulting from −45° rotation relative to the circumferential direction of the circle connecting these eight circular regions 39A-39D (i.e., relative to the tangential direction to the circle connecting these eight circular regions 39A-39D).

Figure 15A:
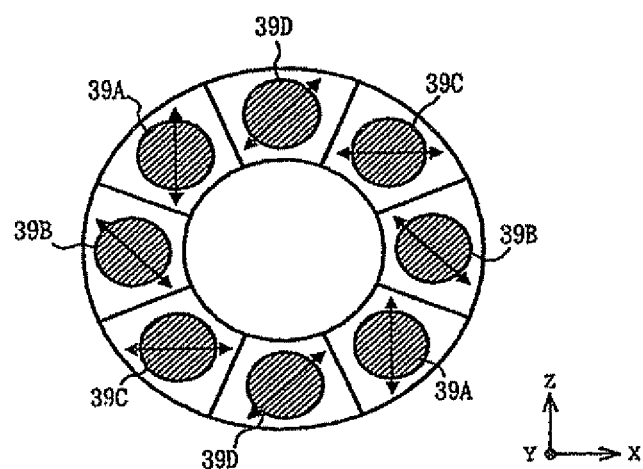
FIGS. 15A, 15B and 15C are illustrations schematically showing examples of the secondary light source obtained when the polarization-modulating element composed of elementary elements of a sector shape is arranged rotatable around the optical axis AX, respectively.
Figure 15B:
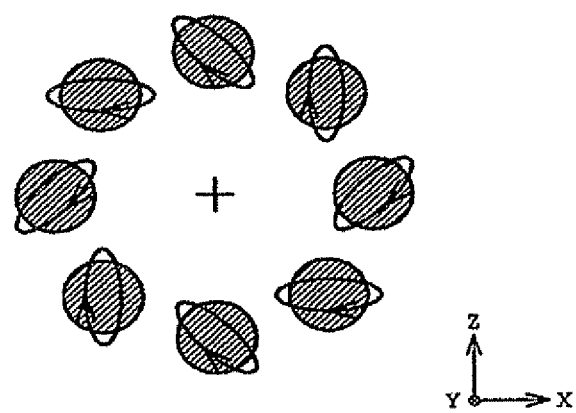
Figure 15C:
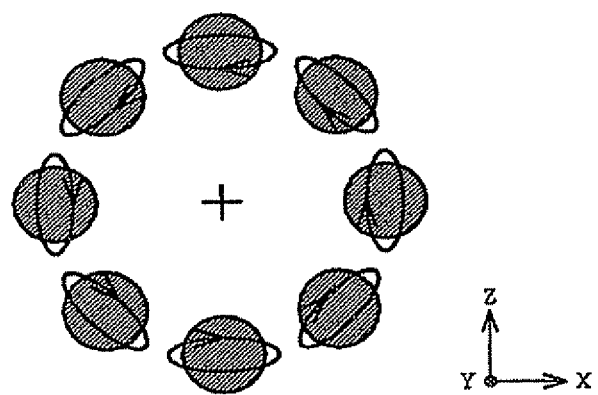

In a case, as shown in FIG. 15B, where the beams passing through the respective eight circular regions constituting the secondary light source of the octapole shape are elliptically polarized light having the major axis along a direction resulting from +45° rotation relative to the circumferential direction of the circle connecting these eight circular regions (i.e., relative to the tangential direction to the circle connecting these eight circular regions), an approximately azimuthal polarization state can be achieved, as shown in FIG. 15C, by rotating the polarization-modulating element (e.g., polarization-modulating element 10*a*) by ±45° around the optical axis AX as shown in FIG. 15A.

Figure 16:
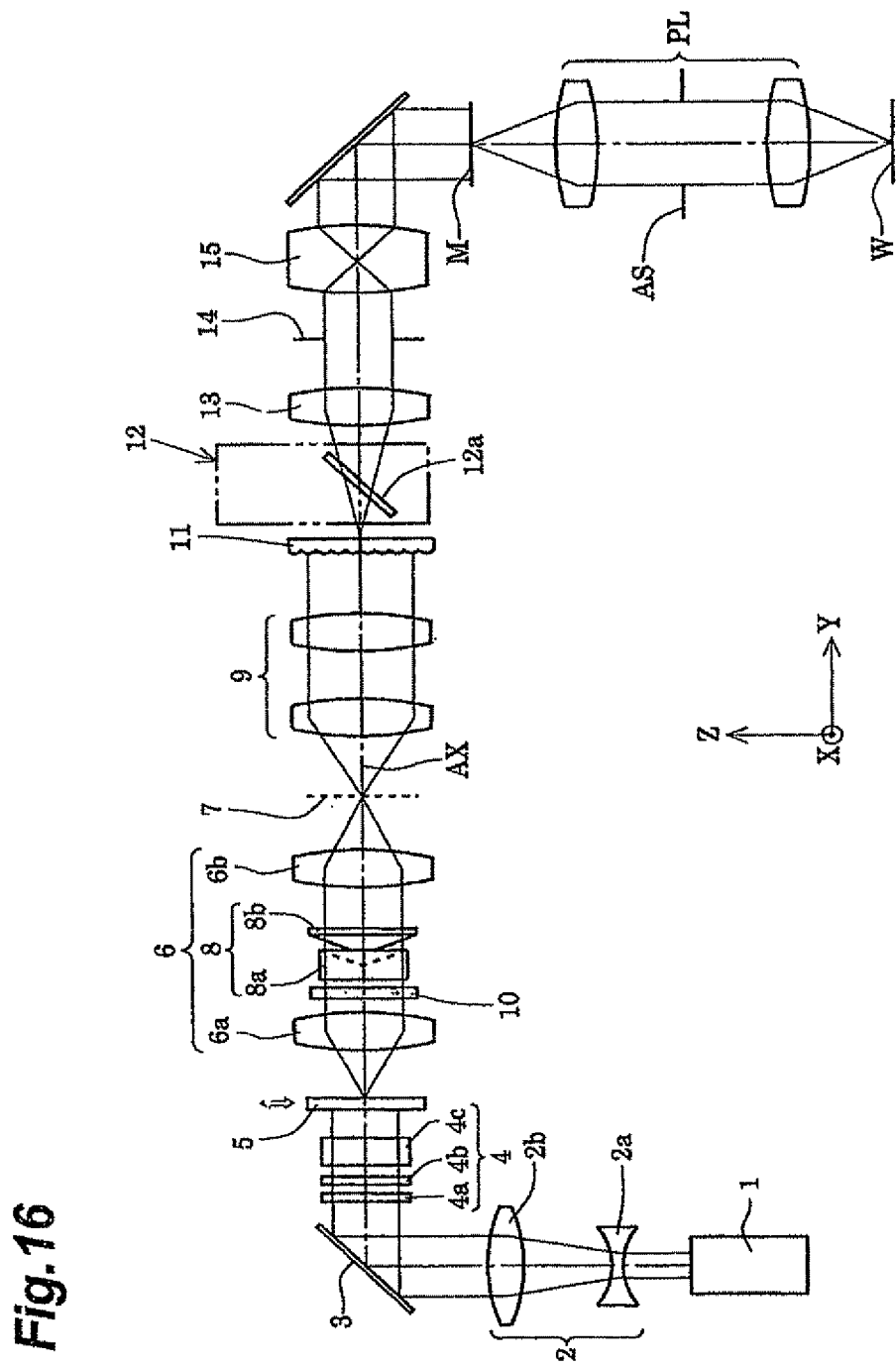
FIG. 16 is an illustration showing an example in which the polarization-modulating element is located at a position immediately before conical axicon system 8 (or at a position near the entrance side), among locations near the pupil of the illumination optical apparatus.

FIG. 16 shows an example in which the polarization-modulating element is located at a position immediately before the conical axicon system 8 (i.e., at a position near the entrance side), among locations near the pupil of the illumination optical apparatus. In this example of FIG. 16, the zoom action of the zoom lens system 9 results in changing the size of the image of the central region 10E projected onto the entrance surface of micro fly's eye lens 11 and the size of the images of the respective elementary elements 10A-10D projected onto the entrance surface of micro fly's eye lens 11, and the operation of the conical axicon system 8 results in changing the width in the radial direction around the optical axis AX in the images of the respective elementary elements 10A-10D projected onto the entrance surface of micro fly's eye lens 11.

Therefore, in a case where the polarization-modulating element having the central region 10E (or depolarizing member 104c) is located nearer the light source than the optical system with the zoom action (zoom lens 9) as in the modification example shown in FIG. 16, the size of the central region 10E can be determined with consideration to the fact that the region occupied by the central region 10E is changed with zooming of the zoom lens 9.

Figure 17:
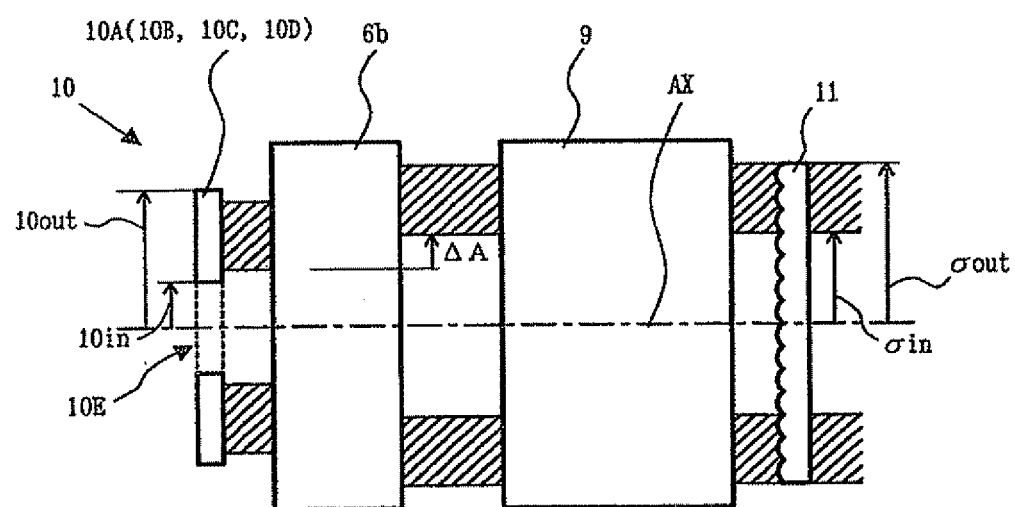
FIG. 17 is an illustration for explaining Conditions (1) and (2) to be satisfied in the modification example shown in FIG. 16.

In a case where the polarization-modulating element having the central region 10E (or depolarizing member 104c) is located nearer the light source than the optical system with the action of changing the annular ratio (the conical axicon system 8) as in the modification example shown in FIG. 16, the apparatus is preferably configured to satisfy at least one of Conditions (1) and (2) below, as shown in FIG. 17.

$$(10in+\Delta A)/10out<0.75 \qquad (1)$$

$$0.4<(10in+\Delta A)/10out \qquad (2)$$

The above conditions follow the following notation:

10in: effective radius of central region 10E of polarization-modulating element 10, 10out: outside effective radius of polarization-modulating element 10, and $\Delta A$: increase of the inside radius of the beam having passed through the optical system with the action of changing the annular ratio.

If Condition (1) is not met, the width of the region of the annular shape transformed into the azimuthal polarization state by the polarization-modulating element 10 will become too small to achieve the circumferentially polarized illumination based on the secondary light source of the annular shape or multipole shape at a small annular ratio; thus it is undesirable. If Condition (2) is not met, the diameter of the beam passing through the central region of the polarization-modulating element 10 will become too small to achieve small σ illumination without change in the polarization state, for example, unless the polarization-modulating element 10 is set off the illumination optical path; thus it is undesirable.

Figure 18:
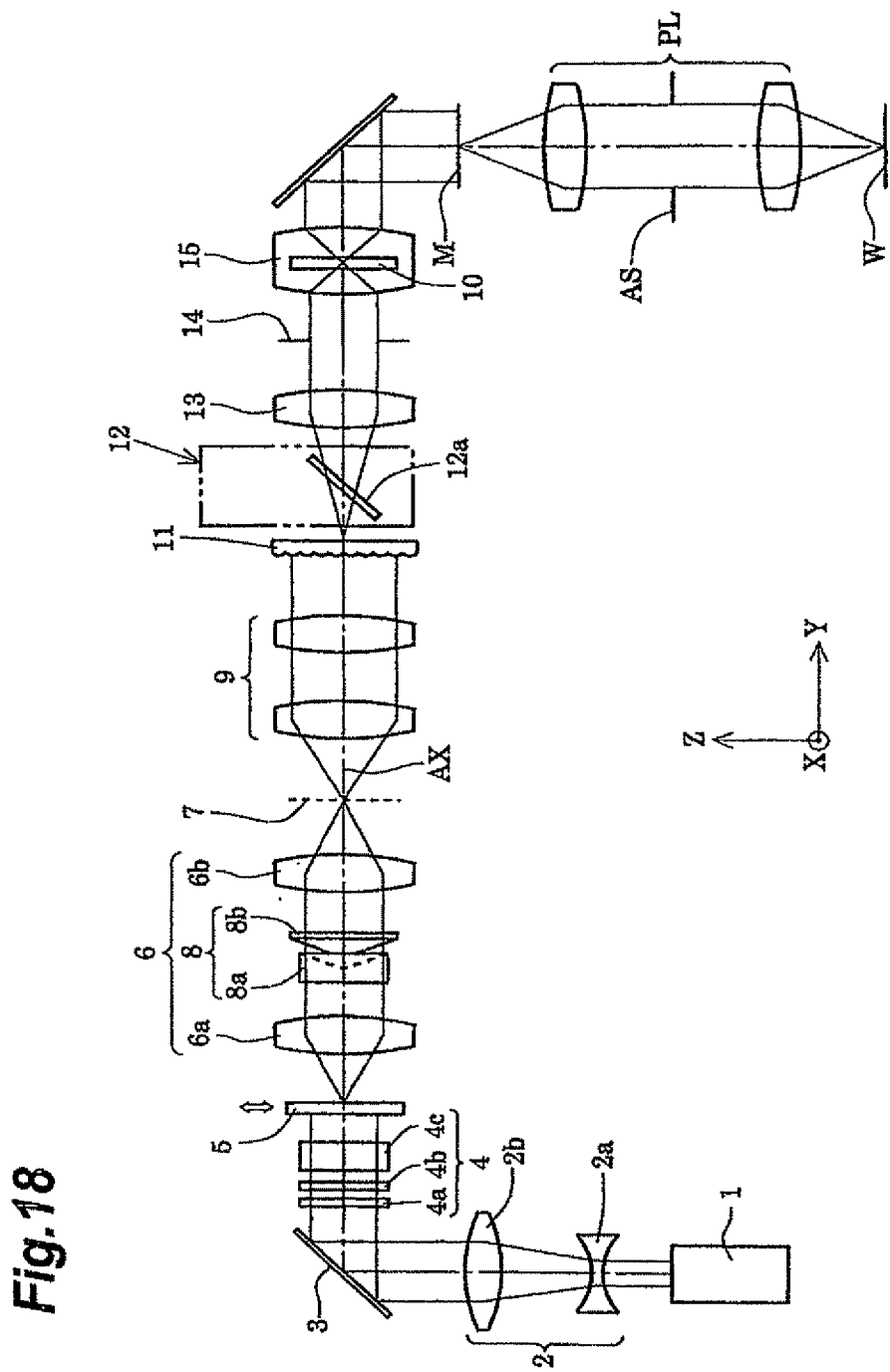
FIG. 18 is an illustration showing an example in which the polarization-modulating element is located near the pupil position of imaging optical system 15, among locations near the pupil of the illumination optical apparatus.

As shown in FIG. 18, the polarization-modulating element may be located at a position nearer the mask than the micro fly's eye lens 11, among locations near the pupil of the illumination optical apparatus; specifically, near the pupil position of the imaging optical system 15 for projecting the image of mask blind 14 onto the mask. In the embodiments shown in FIG. 16 and in FIG. 18, the plurality of polarization-modulating elements may also be arranged replaceable as in the embodiment in FIGS. 9 to 11.

In the above-described embodiments, if an optical system (the illumination optical system or the projection optical system) nearer the wafer W than the polarization-modulating element 10 has-polarization aberration (retardation), the polarization direction can vary by virtue of this-polarization aberration. In this case, the direction of the plane of polarization rotated by the polarization-modulating element 10 can be set in consideration of the influence of the polarization aberration of these optical systems. In a case where a reflecting member is located in the optical path on the wafer W side with respect to the polarization-modulating element 10, a phase difference can occur between polarization directions of light reflected by this reflecting member. In this case, the direction of the plane of polarization rotated by the polarization-modulating element 10 can be set in consideration of the phase difference of the beam caused by the polarization characteristic of the reflecting surface.

An embodiment of a technique of evaluating the polarization state will be described below. In the present embodiment, the polarization state of the beam arriving at the wafer W as a photosensitive substrate is detected using a wafer surface polarization monitor 90 which can be attached to a side of a wafer stage (substrate stage) holding the wafer W as a photosensitive substrate. The wafer surface polarization monitor 90 may be provided in the wafer stage or in a measurement stage separate from the wafer stage.

Figure 19:
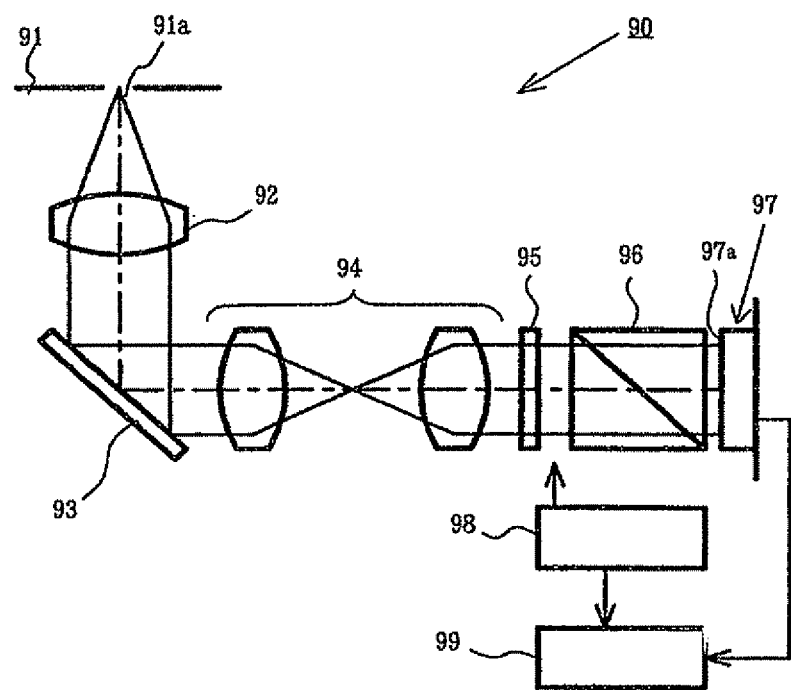
FIG. 19 is an illustration showing a schematic configuration of wafer surface polarization monitor 90 for detecting a polarization state and light intensity of light illuminating a wafer W.

FIG. 19 is an illustration showing a schematic configuration of the wafer surface polarization monitor 90 for detecting the polarization state and optical intensity of the light illuminating the wafer W. As shown in FIG. 19, the wafer surface polarization monitor 90 is provided with a pinhole member 91 which can be positioned at or near the position of the wafer W. Light passing through a pinhole 91a in the pinhole member 91 travels through a collimating lens 92 located so that its front focal position is at or near the position of the image plane of the projection optical system PL, to become a nearly parallel beam, and the beam is reflected by a reflector 93 to enter a relay lens system 94. The nearly parallel beam passing through the relay lens system 94 travels through a quarter wave plate 95 as a phase shifter and through a polarization beam splitter 96 as a polarizer, and then reaches a detection surface 97a of two-dimensional CCD 97. The detection surface 97a of two-dimensional CCD 97 is approximately optically conjugate with the exit pupil of the projection optical system PL and is thus approximately optically conjugate with the illumination pupil plane of the illumination optical apparatus.

The quarter wave plate 95 is arranged rotatable around the optical axis and a setting member 98 for setting the angle of rotation around the optical axis is connected to this quarter wave plate 95. In this configuration, when the degree of polarization of the illumination light on the wafer W is not 0, the light intensity distribution on the detection surface 97a of two-dimensional CCD 97 varies with rotation of the quarter wave plate 95 around the optical axis through the setting member 98. Therefore, the wafer surface polarization monitor 90 is able to detect the change in the light intensity distribution on the detection surface 97a with rotation of the quarter wave plate 95 around the optical axis by means of the setting member 98 and thereby to measure the polarization state of the illumination light from the detection result by the rotating compensator method.

The rotating compensator method is detailed, for example, in Tsuruta, "Pencil of Light—Applied Optics for optical engineers," K.K. Shingijutsu Communications. In practice, the polarization state of the illumination light is measured at a plurality of positions on the wafer surface while the pinhole member 90 (therefore, pinhole 90a) is two-dimensionally moved along the wafer surface. At this time, the wafer surface polarization monitor 90 detects a change of the light intensity distribution on the two-dimensional detection surface 97a, whereby it can measure a distribution of polarization states of the illumination light in the pupil on the basis of the detected distribution information.

The wafer surface polarization monitor 90 can also be configured using a half wave plate instead of the quarter wave plate 95 as a phase shifter. With use of any kind of phase shifter, in order to measure the polarization state, i.e., the four Stokes parameters, it is necessary to detect the change of the light intensity distribution on the detection surface 97a in at least four different states, by changing the relative angle around the optical axis between the phase shifter and the polarizer (polarization beam splitter 96) or by moving the phase shifter or the polarizer away from the optical path. The present embodiment is configured to rotate the quarter wave plate 95 as a phase shifter around the optical axis, but the polarization beam splitter 96 as a polarizer may be rotated around the optical axis, or both of the phase shifter and the polarizer may be rotated around the optical axis. Instead of this operation, or in addition to this operation, one or both of the quarter wave plate 95 as a phase shifter and the polarization beam splitter 96 as a polarizer may be moved into and away from the optical path.

In the wafer surface polarization monitor 90, the polarization state of light can vary depending upon the polarization characteristic of the reflector 93. In this case, since the polarization characteristic of the reflector 93 is preliminarily known, the polarization state of the illumination light can be accurately measured by compensating the measurement result of the wafer surface polarization monitor 90 on the basis of the influence of the polarization characteristic of reflector 93 on the polarization state by some calculation. In other cases where the polarization state varies due to another optical component such as a lens, as well as the reflector, the polarization state of the illumination light can also be accurately measured by compensating the measurement result in the same manner.

The evaluation for the distribution of polarization states of illumination light in the pupil will be specifically described below. A degree of specific polarization DSP is first calculated for each of rays passing a point (or a microscopic area) on the pupil and arriving at a point (microscopic area) on the image plane. The XYZ coordinate system used in FIGS. 1, 16, and 18 will be used in the description hereinafter. The above-described point (microscopic area) on the pupil corresponds to a pixel in the two-dimensional CCD 97, and the point (microscopic area) on the image plane to XY coordinates of the pinhole 90a.

This degree of specific polarization DSP is represented by the following equation:

$$DSP = (Ix - Iy)/(Ix + Iy), \quad (3)$$

where Ix is the intensity of the component of X-directional polarization (polarization with the direction of oscillation along the X-direction on the pupil) in a specific ray passing a point (or microscopic area) on the pupil and arriving at a point (microscopic area) on the image plane, and Iy the intensity of the component of Y-directional polarization (polarization with the direction of oscillation along the Y-direction on the pupil) in the specific ray. This degree of specific polarization DSP is synonymous with horizontal linear polarization intensity minus vertical linear polarization intensity $S_1$ over total intensity $S_0$, $(S_1/S_0)$.

We can also define a right polarization rate $RSP_h$ for horizontal polarization (polarization to become S-polarization for diffracted light by a mask pattern horizontally extending in the pattern surface), and a right polarization rate $RSP_v$ for vertical polarization (polarization to become S-polarization for diffracted light by a mask pattern vertically extending in the pattern surface) according to Eqs (4) and (5) below from the intensity Ix of the component of X-directional polarization (polarization with the direction of oscillation along the X-direction on the pupil) in the specific ray passing a point (or microscopic area) on the pupil and arriving at a point (microscopic area) on the image plane and the intensity Iy of the component of Y-directional polarization (polarization with the direction of oscillation along the Y-direction on the pupil) in the specific ray.

$$RSP_h = Ix/(Ix + Iy) \quad (4)$$

$$RSP_v = Iy/(Ix + Iy) \quad (5)$$

$RSP_h$ and $RSP_v$ both are 50% in ideal unpolarized illumination, $RSP_h$ is 100% in ideal horizontal polarization, and $RSP_v$ is 100% in ideal vertical polarization.

When a polarization degree V is defined by Eqs (6)-(9) below for each of rays passing a point (or microscopic area) on the pupil and arriving at a point (microscopic area) on the image plane, an average polarization degree V(Ave) can be defined as Eq (10) below for a bundle of rays passing a predetermined effective light source region and arriving at a point (microscopic area) on the image plane.

$$V = (S_1^2 + S_2^2 + S_3^2)^{1/2} / S_0 \quad (6)$$
$$= (S_{1'}^2 + S_{2'}^2 + S_{3'}^2)^{1/2}$$

$$S_1' = S_1/S_0 \quad (7)$$

$$S_2' = S_2/S_0 \quad (8)$$

$$S_3' = S_3/S_0 \quad (9)$$

In the above equations, $S_0$ represents the total intensity, $S_1$ horizontal linear polarization intensity minus vertical linear polarization intensity, $S_2$ 45° linear polarization intensity minus 135° linear polarization intensity, and $S_3$ right-handed circular polarization intensity minus left-handed circular polarization intensity.

$$V(Ave) = \Sigma[S_0(x_i, y_i) \cdot V(x_i, y_i)] / \Sigma S_0(x_i, y_i) \quad (10)$$

In Eq (10), $S_0(x_i, y_i)$ represents the total intensity $S_0$ for rays passing a point (or microscopic area) on a predetermined effective light source region $(x_i, y_i)$ and arriving at a point (microscopic area) on the image plane, and $V(x_i, y_i)$ the polarization degree of a ray passing a point (or microscopic area) on the predetermined effective light source region $(x_i, y_i)$ and arriving at a point (microscopic area) on the image plane.

In addition, we can define an average specific polarization rate $RSP_h(Ave)$ about horizontal polarization by Eq (11) below and an average specific polarization rate $RSP_v(Ave)$ about vertical polarization by Eq (12), for a bundle of rays passing the predetermined effective light source region and arriving at a point (microscopic area) on the image plane.

$$RSP_h(Ave) = Ix(Ave)/(Ix + Iy)Ave \quad (11)$$
$$= \Sigma[S_0(x_i, y_i) \cdot RSP_h(x_i, y_i)] / \Sigma S_0(x_i, y_i)$$

$$RSP_v(Ave) = Iy(Ave)/(Ix + Iy)Ave \quad (12)$$
$$= \Sigma[S_0(x_i, y_i) \cdot RSP_v(x_i, y_i)] / \Sigma S_0(x_i, y_i)$$

Ix(Ave) represents an average intensity of the component of X-directional polarization (polarization with the direction of oscillation along the X-direction on the pupil) in a bundle of rays passing the predetermined effective light source region $(x_i, y_i)$ and arriving at a point (microscopic area) on the image plane, Iy(Ave) an average intensity of the component of Y-directional polarization (polarization with the direction of oscillation along the Y-direction on the pupil) in the bundle of rays passing the predetermined effective light source region $(x_i, y_i)$ and arriving at a point (microscopic area) on the image plane, $RSP_h(x_i, y_i)$ a right polarization rate for horizontal polarization of a ray passing a point (or microscopic area) on the predetermined effective light source region $(x_i, y_i)$ and arriving at a point (microscopic area) on the image plane, and $RSP_v(x_i, y_i)$ a right polarization rate for vertical polarization of a ray passing a point (or microscopic area) on the predetermined effective light source region $(x_i,y_i)$ and arriving at a point (microscopic area) on the image plane. In addition, (Ix+Iy)Ave is an average intensity of an entire beam passing the predetermined effective light source region.

Here, $RSP_h(x_i,y_i)$ and $RSP_v(x_i,y_i)$ both are 50% in ideas unpolarized illumination, $RSP_h(x_i,y_i)$ is 100% in ideal horizontal polarization, and $RSP_v(x_i,y_i)$ is 100% in ideal vertical polarization.

Then we can define an average specific polarization degree DSP(AVE) as Eq (13) below, for a bundle of rays passing the predetermined effective light source region $(x_i,y_i)$ and arriving at a point (microscopic area) on the image plane.

$$\begin{aligned} DSP(Ave) &= (Ix - Iy)Ave / (Ix + Iy)Ave \\ &= \{\Sigma[Ix(x_i, y_i) - Iy(x_i, y_i)] / \Sigma[Ix(x_i, y_i) + I_y(x_i, y_i)]\} \\ &= S_{1'}(Ave) \\ &= \{\Sigma S_1 / \Sigma S_0\} \end{aligned} \quad (13)$$

Here, (Ix−Iy)Ave represents an average of differences between intensities of the X-directional polarization component in a bundle of rays passing the predetermined effective light source region $(x_i,y_i)$ and arriving at a point (microscopic area) on the image plane and intensities of the Y-directional polarization component in the bundle of rays passing the predetermined effective light source region $(x_i,y_i)$ and arriving at a point (microscopic area) on the image plane, $Ix(x_i,y_i)$ the intensity of the X-directional polarization component in a ray passing a point (or microscopic area) on the predetermined effective light source region $(x_i,y_i)$ and arriving at a point (microscopic area) on the image plane, $Iy(x_i,y_i)$ the intensity of the Y-directional polarization component in a ray passing a point (or microscopic area) on the predetermined effective light source region $(x_i,y_i)$ and arriving at a point (microscopic area) on the image plane, and $S_1'$(Ave) an average of the $S_1'$ component in the predetermined effective light source region $(x_i,y_i)$.

In Eq (13), DSP(Ave) becomes 0 in ideal unpolarized DSP(Ave) becomes 1 in ideal horizontal polarization, and DSP(Ave) becomes −1 in ideal vertical polarization.

In the illumination optical apparatus of the present embodiment and, therefore, in the exposure apparatus, it can be assumed that the interior of the predetermined effective light source region is linear polarized light if the average specific polarization rates $RSP_h$(Ave), $RSP_v$(Ave) in the predetermined effective light source region satisfy the following relations:

$RSP_h$(Ave)>70%, and $RSP_v$(Ave)>70%.

Where the average specific polarization rates $RSP_h$(Ave), $RSP_v$(Ave) fail to satisfy the above conditions, the desired linear polarization state with the plane of polarization in the predetermined direction is not realized in the circumferentially polarized annular illumination, the circumferentially polarized quadrupole illumination, the circumferentially polarized dipole illumination, and so on, and it is thus infeasible to achieve an improvement in the imaging performance for a pattern with a thin line width having a specific pitch direction.

Figure 20:
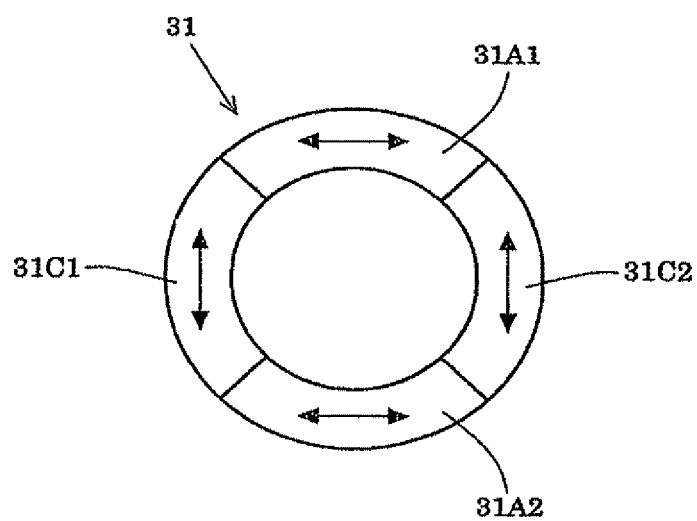
FIG. 20 is an illustration showing a secondary light source 31 of an annular shape obtained when a quartered polarization-modulating element 10f is used to implement quartered, circumferentially polarized annular illumination.
Figure 21:
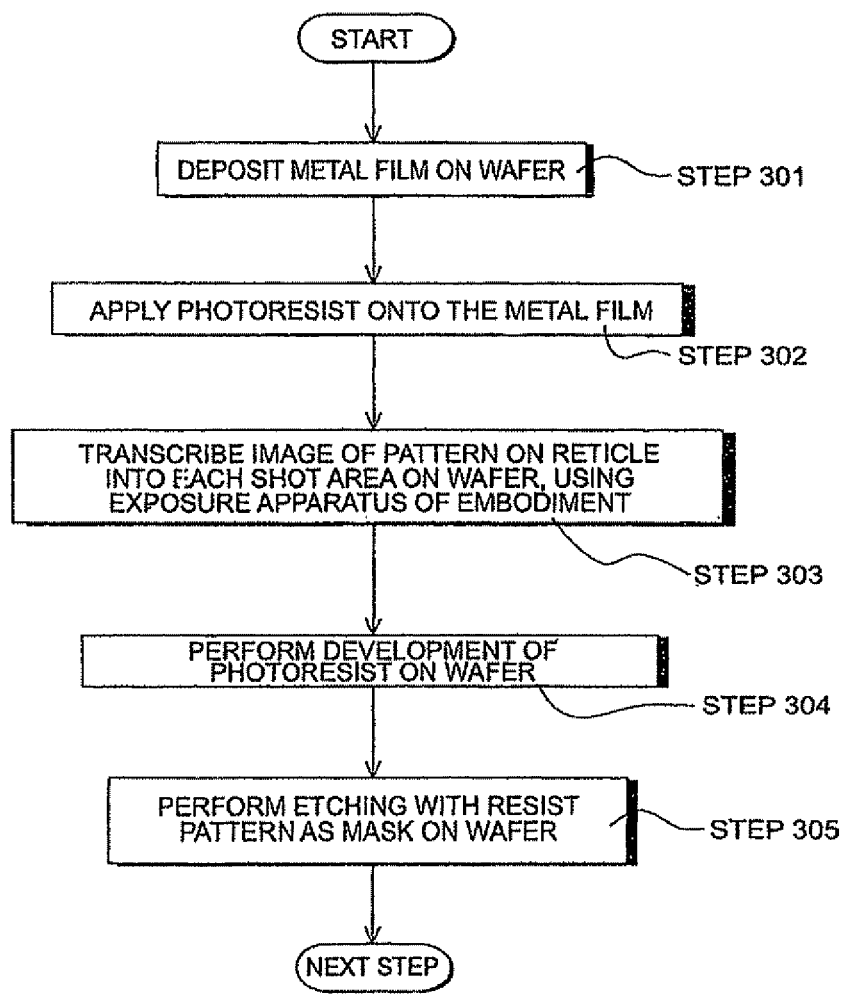
FIG. 21 is a flowchart of a procedure of producing semiconductor devices as microdevices.
Figure 22:
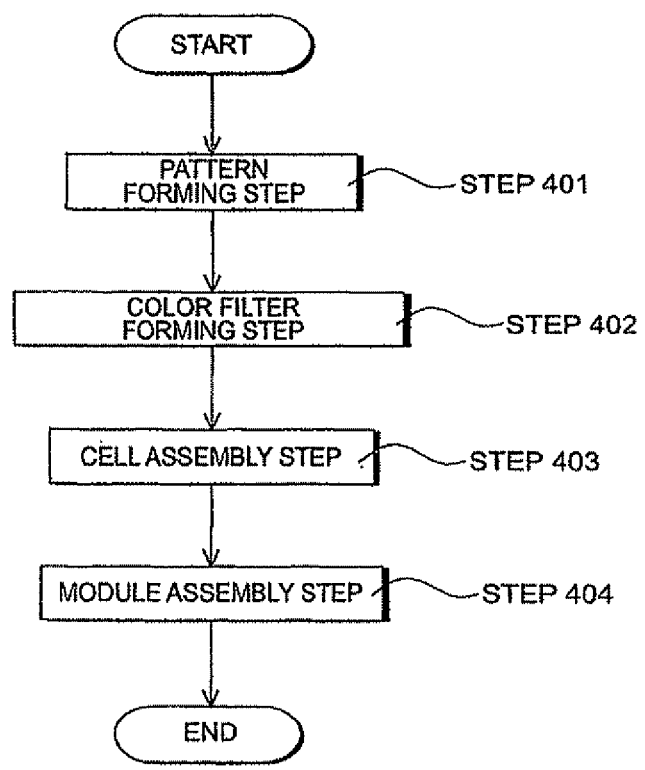
FIG. 22 is a flowchart of a procedure of producing a liquid crystal display element as a microdevice.

For example, in a case where the quartered, circumferentially polarized annular illumination is implemented by use of the quartered polarization-modulating element 10f shown in FIG. 13, the secondary light source 31 of the annular shape is divided into four segments, as shown in FIG. 20, and the average specific polarization rates $RSP_h$(Ave), $RSP_v$(Ave) are evaluated for each of the segmental regions 31A1, 31A2, 31C1, 31C2.

The exposure apparatus according to the foregoing embodiment is able to produce microdevices (semiconductor elements, image pickup elements, liquid crystal display elements, thin-film magnetic heads, etc.) by illuminating a mask (reticle) by the illumination optical apparatus (illumination step) and projecting a pattern for transcription formed on the mask, onto a photosensitive substrate by use of the projection optical system (exposure step). The following will describe an example of a procedure of producing semiconductor devices as microdevices by forming a predetermined circuit pattern on a wafer or the like as a photosensitive substrate by means of the exposure apparatus of the foregoing embodiment, with reference to the flowchart of FIG. 9.

The first step 301 in FIG. 9 is to deposit a metal film on each of wafers in one lot. The next step 302 is to apply a photoresist onto the metal film on each wafer in the lot. Thereafter, step 303 is to sequentially transcribe an image of a pattern on a mask into each shot area on each wafer in the lot, through the projection optical system by use of the exposure apparatus of the foregoing embodiment. Subsequently, step 304 is to perform development of the photoresist on each wafer in the lot, and step 305 thereafter is to perform etching with the resist pattern as a mask on each wafer in the lot, thereby forming a circuit pattern corresponding to the pattern on the mask, in each shot area on each wafer. Thereafter, devices such as semiconductor elements are produced through execution of formation of circuit patterns in upper layers and others. The semiconductor device production method as described above permits us to produce the semiconductor devices with extremely fine circuit patterns at high throughput.

The exposure apparatus of the foregoing embodiment can also be applied to production of a liquid crystal display element as a microdevice in such a manner that predetermined patterns (a circuit pattern, an electrode pattern, etc.) are formed on a plate (glass substrate). An example of a procedure of this production will be described below with reference to the flowchart of FIG. 10. In FIG. 10, pattern forming step 401 is to execute a so-called photolithography step of transcribing a pattern on a mask onto a photosensitive substrate (a glass substrate coated with a resist or the like) by use of the exposure apparatus of the foregoing embodiment. In this photolithography step, the predetermined patterns including a number of electrodes and others are formed on the photosensitive substrate. Thereafter, the exposed substrate is subjected to steps such as a development step, an etching step, a resist removing step, etc., to form the predetermined patterns on the substrate, followed by next color filter forming step 402.

The next color filter forming step 402 is to form a color filter in which a number of sets of three dots corresponding to R (Red), G (Green), and B (Blue) are arrayed in a matrix, or in which a plurality of sets of filters of three stripes of R, G, and B are arrayed in the direction of horizontal scan lines. After the color filter forming step 402, cell assembly step 403 is carried out. The cell assembly step 403 is to assemble a liquid crystal panel (liquid crystal cell), using the substrate with the predetermined patterns obtained in the pattern forming step 401, the color filter obtained in the color filter forming step 402, and so on.

In the cell assembly step 403, for example, a liquid crystal is poured into the space between the substrate with the predetermined patterns obtained in the pattern forming step 401 and the color filter obtained in the color filter forming step 402 to produce the liquid crystal panel (liquid crystal cell). Thereafter, module assembly step 404 is carried out to attach such components as an electric circuit, a backlight, and so on for implementing the display operation of the assembled liquid crystal panel (liquid crystal cell), to complete the liquid crystal display element. The production method of the liquid crystal display element described above permits us to produce the liquid crystal display elements with extremely fine circuit patterns at high throughput.

The foregoing embodiment is arranged to use the KrF excimer laser light (wavelength: 248 nm) or the ArF excimer laser light (wavelength: 193 nm) as the exposure light, but, without having to be limited to this, the present invention can also be applied to other appropriate laser light sources, e.g., an $F_2$ laser light source for supplying laser light of the wavelength of 157 nm. Furthermore, the foregoing embodiment described the present invention, using the exposure apparatus with the illumination optical apparatus as an example, but it is apparent that the present invention can be applied to ordinary illumination optical apparatus for illuminating the surface to be illuminated, except for the mask and wafer.

In the foregoing embodiment, it is also possible to apply the so-called liquid immersion method, which is a technique of filling a medium (typically, a liquid) with a refractive index larger than 1.1 in the optical path between the projection optical system and the photosensitive substrate. In this case, the technique of filling the liquid in the optical path between the projection optical system and the photosensitive substrate can be selected from the technique of locally filling the liquid as disclosed in PCT International Publication No. WO99/49504, the technique of moving a stage holding a substrate as an exposure target in a liquid bath as disclosed in Japanese Patent Application Laid-Open No. 6-124873, the technique of forming a liquid bath in a predetermined depth on a stage and holding the substrate therein as disclosed in Japanese Patent Application Laid-Open No. 10-303114, and so on.

The liquid is preferably one that is transparent to the exposure light, that has the refractive index as high as possible, and that is stable against the projection optical system and the photoresist applied to the surface of the substrate; for example, where the exposure light is the KrF excimer laser light or the ArF excimer laser light, pure water or deionized water can be used as the liquid. Where the $F_2$ laser light is used as the exposure light, the liquid can be a fluorinated liquid capable of transmitting the $F_2$ laser light, e.g., fluorinated oil or perfluoropolyether (PFPE).

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An illumination optical apparatus which illuminates an object having a pattern with illumination light, the illumination optical apparatus comprising:

an optical integrator arranged in an optical path of the illumination light;

a beam transforming member arranged in the optical path on an incidence side of the optical integrator, which transforms a beam of the illumination light such that the illumination light is distributed on a pupil plane of the illumination optical apparatus in a state in which a light intensity in a region being away from an optical axis of the illumination optical apparatus is larger than a light intensity on the optical axis on the pupil plane;

a polarization modulating member made of an optical material with optical activity and provided with different thicknesses of the optical material in a direction of the optical axis at different positions on an entrance surface of the polarization modulating member, the polarization modulating member being arranged in the optical path between the beam transforming member and the optical integrator, and the polarization modulating member rotating a polarization direction of the illumination light so that the illumination light, being incident on the entrance surface in a linearly polarized state in which a principal component is linearly polarized light polarized substantially in a single direction, is changed to a linearly polarized state having polarization directions being substantially coincident with an azimuthal direction about the optical axis at the pupil plane; and a lens element arranged in the optical path between the beam transforming member and the optical integrator, wherein the polarization modulating member is arranged so that a direction of an optic axis of the optical material is substantially coincident with a direction of the optical axis.

2. The illumination optical apparatus according to claim 1, wherein the illumination light is irradiated onto the object in a polarization state in which a principal component is S-polarized light.

3. The illumination optical apparatus according to claim 1, wherein a first thickness of the polarization modulating member in an optical path of a first part of the illumination light is different from a second thickness of the polarization modulating member in an optical path of a second part of the illumination light, and the first part of the illumination light passes through a first portion of the region on the pupil plane, and the second part of the illumination light passes through a second portion of the region different from the first portion.

4. The illumination optical apparatus according to claim 3, further comprising a polarization converter arranged in the optical path on an incidence side of the polarization modulating member, wherein the polarization converter converts a polarization state of the illumination light from a first polarization state including a substantially single polarization into a second polarization state different from the first polarization state.

5. The illumination optical apparatus according to claim 4, wherein a principal component of the second polarization state is linearly polarized light polarized substantially in the single direction.

6. The illumination optical apparatus according to claim 4, wherein a principal component of the first polarization state is linearly polarized light, circularly polarized light or elliptically polarized light.

7. The illumination optical apparatus according to claim 4, wherein the polarization converter comprises at least one of a half wavelength plate and a quarter wavelength plate.

8. The illumination optical apparatus according to claim 4, wherein the first and second portions are included in an annular region about the optical axis.

9. The illumination optical apparatus according to claim 8, wherein the first and second portions are substantially discrete from each other.

10. The illumination optical apparatus according to claim 4, wherein the first and second portions are substantially discrete from each other and are aligned along a circumference about the optical axis.

11. The illumination optical apparatus according to claim 3, wherein the first and second portions are included in an annular region about the optical axis.

12. The illumination optical apparatus according to claim 11, wherein the first and second portions are substantially discrete from each other.

13. The illumination optical apparatus according to claim 3, wherein the first and second portions are substantially discrete from each other and are aligned along a circumference about the optical axis.

14. The illumination optical apparatus according to claim 1, wherein the optical integrator comprises a fly's eye lens, and a surface of an exit side of the fly's eye lens is arranged at a position substantially equivalent to the pupil plane.

15. The illumination optical apparatus according to claim 1, further comprising a polarization converter arranged in the optical path on an incidence side of the polarization modulating member, wherein
the polarization converter converts a polarization state of the illumination light from a first polarization state including a substantially single polarization into a second polarization state different from the first polarization state.

16. The illumination optical apparatus according to claim 15, wherein a principal component of the second polarization state is linearly polarized light polarized substantially in the single direction.

17. The illumination optical apparatus according to claim 15, wherein a principal component of the first polarization state is linearly polarized light, circularly polarized light or elliptically polarized light.

18. The illumination optical apparatus according to claim 15, wherein the polarization converter comprises at least one of a half wavelength plate and a quarter wavelength plate.

19. An exposure apparatus which exposes a substrate to light via an object having a pattern, the exposure apparatus comprising:
a stage which holds the substrate,
the illumination optical apparatus as defined in claim 1 which illuminates the pattern with the light; and
a projection optical system which projects an image of the pattern illuminated with the light onto the substrate held by the stage.

20. The exposure apparatus according to claim 19, wherein the substrate is exposed to the light through a liquid.

21. The exposure apparatus according to claim 19, wherein the light is irradiated onto the object in a polarization state in which a principal component is S-polarized light.

22. The exposure apparatus according to claim 19, wherein a first thickness of the polarization modulating member in an optical path of a first part of the light is different from a second thickness of the polarization modulating member in an optical path of a second part of the light, and
the first part of the light passes through a first portion of the region on the pupil plane, and the second part of the light passes through a second portion of the region different from the first portion.

23. The exposure apparatus according to claim 22, further comprising a polarization converter arranged in the optical path on an incidence side of the polarization modulating member, wherein
the polarization converter converts a polarization state of the light from a first polarization state including a substantially single polarization into a second polarization state different from the first polarization state.

24. The exposure apparatus according to claim 23, wherein a principal component of the second polarization state is linearly polarized light polarized substantially in the single direction.

25. The exposure apparatus according to claim 23, wherein a principal component of the first polarization state is linearly polarized light, circularly polarized light or elliptically polarized light.

26. The exposure apparatus according to claim 23, wherein the polarization converter comprises at least one of a half wavelength plate and a quarter wavelength plate.

27. The exposure apparatus according to claim 22, wherein the first and second portions are included in an annular region about the optical axis.

28. The exposure apparatus according to claim 27, wherein the first and second portions are substantially discrete from each other.

29. The exposure apparatus according to claim 22, wherein the first and second portions are substantially discrete from each other and are aligned along a circumference about the optical axis.

30. The exposure apparatus according to claim 19, wherein the optical integrator comprises a fly's eye lens, and a surface of an exit side of the fly's eye lens is arranged at a position substantially equivalent to the pupil plane.

31. A device manufacturing method, comprising:
transferring a pattern to a substrate by using the exposure apparatus as defined in claim 19; and
developing the substrate to which the pattern is transferred.

32. An exposure method which exposes a substrate to light via an object having a pattern, the exposure method comprising:
holding the substrate by a stage;
illuminating the pattern with the light by using the illumination optical apparatus as defined in claim 1; and
projecting an image of the pattern illuminated with the light onto the substrate held by the stage.

33. The exposure method according to claim 32, wherein the substrate is exposed to the light through liquid.

34. A device manufacturing method, comprising:
transferring a pattern to a substrate by using the exposure method as defined in claim 32; and
developing the substrate to which the pattern is transferred.

35. An illumination optical apparatus which illuminates an object having a pattern with illumination light, the illumination optical apparatus comprising:
an optical integrator arranged in an optical path of the illumination light;
a beam transforming member arranged in the optical path on an incidence side of the optical integrator, which transforms a beam of the illumination light such that the illumination light is distributed on a pupil plane of the illumination optical apparatus in a state in which a light intensity in a region being away from an optical axis of the illumination optical apparatus is larger than a light intensity on the optical axis on the pupil plane; and a polarization modulating member made of an optical material with optical activity and provided with different thicknesses of the optical material in a direction of the optical axis at different positions on an entrance surface of the polarization modulating member, the polarization modulating member being arranged in the optical path between the beam transforming member and the optical integrator, and the polarization modulating member rotating a polarization direction of the illumination light so that the illumination light, being incident on the entrance surface in a linearly polarized state in which a principal component is linearly polarized light polarized substantially in a single direction, is changed to a linearly polarized state having polarization directions being substantially coincident with an azimuthal direction about the optical axis at the pupil plane; and a lens element arranged in the optical path between the beam transforming member and the optical integrator, wherein the polarization modulating member is arranged so that a direction of an optic axis of the optical material is substantially coincident with a direction of the optical axis, and the polarization modulating member is arranged around the optical axis so as to surround the optical axis, and has no less than 4 sectors and no more than 8 sectors.

* * * * *